US009469562B2

(12) United States Patent
Masuda et al.

(10) Patent No.: US 9,469,562 B2
(45) Date of Patent: Oct. 18, 2016

(54) GLASS SUBSTRATE WITH SEALING MATERIAL LAYER, ORGANIC EL DEVICE USING SAME, AND MANUFACTURING METHOD FOR ELECTRONIC DEVICE

(75) Inventors: Noriaki Masuda, Shiga (JP); Toru Shiragami, Shiga (JP); Hiroshi Arakawa, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 83 days.

(21) Appl. No.: 14/235,169

(22) PCT Filed: Jul. 27, 2012

(86) PCT No.: PCT/JP2012/069182
§ 371 (c)(1),
(2), (4) Date: Jan. 27, 2014

(87) PCT Pub. No.: WO2013/015414
PCT Pub. Date: Jan. 31, 2013

(65) Prior Publication Data
US 2014/0196502 A1 Jul. 17, 2014

(30) Foreign Application Priority Data

Jul. 27, 2011 (JP) ................. 2011-164675
Jul. 29, 2011 (JP) ................. 2011-166218
Jul. 29, 2011 (JP) ................. 2011-166499
Jul. 29, 2011 (JP) ................. 2011-166542
Aug. 21, 2011 (JP) ................. 2011-180030

(51) Int. Cl.
*C03C 8/24* (2006.01)
*C03C 17/04* (2006.01)
(Continued)

(52) U.S. Cl.
CPC ............. *C03B 23/245* (2013.01); *B32B 17/06* (2013.01); *C03C 3/14* (2013.01); *C03C 3/19* (2013.01); *C03C 8/04* (2013.01); *C03C 8/08* (2013.01); *C03C 8/24* (2013.01); *C03C 17/008* (2013.01); *C03C 17/04* (2013.01); *C03C 27/10* (2013.01); *H05B 33/04* (2013.01); *H01L 51/5246* (2013.01); *Y10T 428/24413* (2015.01); *Y10T 428/24421* (2015.01)

(58) Field of Classification Search
CPC ......... C03C 17/04; C03C 8/08; C03C 27/10; H01L 51/5246; H05B 33/04
See application file for complete search history.

(56) References Cited

U.S. PATENT DOCUMENTS 6,416,375 B1  7/2002  Cho et al.
6,439,943 B1  8/2002  Aoki et al.
(Continued)

FOREIGN PATENT DOCUMENTS

JP  2000-203887  7/2000
JP  2006-315902  11/2006
(Continued)

OTHER PUBLICATIONS

International Search Report issued Nov. 6, 2012 in International (PCT) Application No. PCT/JP2012/069182.
(Continued)

*Primary Examiner* — Erin Snelting
(74) *Attorney, Agent, or Firm* — Wenderoth, Lind & Ponack, L.L.P.

(57) ABSTRACT

Provided is a glass substrate with a sealing material layer, including a sealing material layer formed by sintering a sealing material, in which: the sealing material includes at least inorganic powder; the inorganic powder includes glass powder and a refractory filler; the content of refractory filler in the inorganic powder is 10 to 35 vol %; and the sealing material layer has a surface roughness Ra of less than 0.5 μm.

9 Claims, 2 Drawing Sheets

(51) Int. Cl.

| | |
|---|---|
| *H05B 33/04* | (2006.01) |
| *C03B 23/24* | (2006.01) |
| *C03C 3/14* | (2006.01) |
| *C03C 3/19* | (2006.01) |
| *C03C 8/04* | (2006.01) |
| *C03C 8/08* | (2006.01) |
| *C03C 27/10* | (2006.01) |
| *B32B 17/06* | (2006.01) |
| *C03C 17/00* | (2006.01) |
| *H01L 51/52* | (2006.01) |

(56) References Cited

U.S. PATENT DOCUMENTS 6,495,262 B2 * 12/2002 Igeta .................. H01J 11/48
349/153
2009/0233513 A1 * 9/2009 Lee .................. B23K 26/06
445/25
2011/0209813 A1 9/2011 Shibuya et al.
2012/0147538 A1 6/2012 Kawanami et al.
2012/0325789 A1 12/2012 Masuda et al.
2013/0111953 A1 * 5/2013 Maloney .................. H01L 21/50
65/43

FOREIGN PATENT DOCUMENTS

| JP | 2008-166197 | 7/2008 |
| JP | 2010-6638 | 1/2010 |
| WO | 2010/055888 | 5/2010 |
| WO | 2011/001987 | 1/2011 |
| WO | 2011/122218 | 10/2011 |

OTHER PUBLICATIONS

International Preliminary Report on Patentability and Written Opinion of the International Searching Authority issued Feb. 6, 2014 in International (PCT) Application No. PCT/JP2012/069182.

* cited by examiner

GLASS SUBSTRATE WITH SEALING MATERIAL LAYER, ORGANIC EL DEVICE USING SAME, AND MANUFACTURING METHOD FOR ELECTRONIC DEVICE

TECHNICAL FIELD

The present invention relates to a glass substrate with a sealing material layer and an OLED device using the same, and more specifically, to a glass substrate with a sealing material layer suitable for sealing treatment with a laser (hereinafter referred to as laser sealing) and an OLED device using the same. The present invention also relates to a method of producing an electronic device, and more particularly, to a method of producing an OLED device by laser sealing.

BACKGROUND ART

In recent years, an OLED display has been attracting attention as a flat display panel. The OLED display can be driven by a DC voltage, and hence its drive circuit can be simplified. In addition, the OLED display has advantages such as having no viewing angle dependence unlike a liquid crystal display, being bright due to its self-luminescence, and having a rapid response speed. At present, the OLED display is mainly used in a small portable appliance such as a mobile phone, and is expected to be applied to an ultra thin screen television in future. It should be noted that the OLED display mainly uses a system in which an active element such as a thin-film transistor (TFT) is arranged at each pixel for driving as is the case with the liquid crystal display.

The OLED display comprises, for example, two glass substrates, a negative electrode made of a metal or the like, an organic light-emitting layer, a positive electrode made of ITO or the like, and a bonding material. Hitherto, an organic resin-based bonding material such as an epoxy resin having low-temperature curing property or a UV curable resin has been used as the bonding material. However, the organic resin-based bonding material cannot block penetration of gas completely. Thus, when the organic resin-based bonding material is used, air tightness inside the OLED display cannot be maintained. Owing to this, an organic light-emitting layer, which has low water resistance, is liable to degrade, resulting in such a failure that a display characteristic of the OLED display degrades time-dependently. Further, the organic resin-based bonding material has an advantage of being able to bond glass substrates to each other at low temperature, but has low water resistance. Hence, when the OLED display is used over a long period, reliability of the display is liable to deteriorate.

On the other hand, a sealing material containing glass powder has excellent water resistance and is suitable for providing the air tightness inside the OLED display, as compared to the organic resin-based bonding material.

However, the glass powder generally has a softening point of 300° C. or more, and hence it has been difficult to apply the glass powder to the OLED display. Specifically, when glass substrates are sealed with each other with the above-mentioned sealing material, it has been necessary to put the whole OLED display in an electric furnace and fire it at a temperature equal to or higher than the softening temperature of the glass powder, thereby softening and flowing the glass powder. However, an active element used in an OLED display only has heat resistance to a temperature of about 120 to 130° C., and hence, when glass substrates are sealed with each other by this method, the active element is damaged by heat, resulting in degradation of a display characteristic of the OLED display. In addition, an organic light-emitting material is also poor in heat resistance, and hence, when glass substrates are sealed with each other by this method, the organic light-emitting material is damaged by heat, resulting in degradation of a display characteristic of the OLED display.

CITATION LIST

Patent Literature

Patent Literature 1: U.S. Pat. No. 6,416,375 B1
Patent Literature 2: JP 2006-315902 A

SUMMARY OF INVENTION

Technical Problem

In view of the circumstances mentioned above, laser sealing has been studied in recent years as a method of sealing an OLED display. The laser sealing can locally heat only the sites that should be sealed, and hence glass substrates can be sealed with each other while thermal degradation of an active element and the like is prevented.

In Patent Literatures 1 and 2, there is a disclosure of laser sealing of glass substrates of a field emission display. However, in Patent Literatures 1 and 2, there is no disclosure of any specific material formulation and state of a sealing material layer (fired film) powder. Hence, it is unclear what kinds of material formulation and state of a sealing material layer are suitable for laser sealing. It should be noted that, when the powder of a laser is increased, laser sealing can be performed even if the material formulation and the state of a sealing material layer are not optimized, but in this case, an active element and the like are heated, possibly resulting in degradation of a display characteristic of the OLED display.

Thus, a first technical object of the present invention is to invent a glass substrate with a sealing material layer that can be used for laser sealing with a low-power laser, to thereby enhance the long-term reliability of an OLED display or the like.

Further, the laser sealing is performed through, for example, the following steps. First, a sealing material and a vehicle are mixed to manufacture a sealing material paste. In this case, the vehicle generally comprises an organic binder and a solvent. Next, the sealing material paste is applied along the outer peripheral edges of a glass substrate so as to have a frame shape by using a screen printing machine, a dispenser, or the like, thereby forming a coating layer on the glass substrate. Subsequently, the coating layer is fired to form a sealing material layer on the glass substrate and fix the sealing material layer with the glass substrate at the same time. Further, the resultant glass substrate with the sealing material layer and a glass substrate on which an OLED element or the like is formed are laminated, and then irradiated with laser light along the sealing material layer to perform laser sealing of the glass substrates.

Meanwhile, the firing of the coating layer burns and removes the organic binder in the vehicle.

On the other hand, the sealing material itself comprises gas components such as $CO_2$ and $H_2O$ in trace amounts, but it is difficult to remove these gas components completely only by firing the coating layer, with the result that the gas components are released out as a $CO_2$ gas and an $H_2O$ gas when the laser sealing is performed. When those released gases come into contact with an OLED element, degradation of the OLED element is promoted, resulting in the deterioration of the long-term reliability of an OLED device. In order to suppress this problem, there may be adopted a method involving placing a material for adsorbing gas components in the OLED device, but the method involves a drawback in that the production cost thereof soars.

Thus, a second technical object of the present invention is to invent a method for laser sealing, in which gas components are hardly released from a sealing material layer, to thereby enhance the long-term reliability of an OLED device or the like, even if a material for adsorbing the gas components is not placed in the OLED device or the like.

Solution to Problem

<First Invention>

The inventors of the present invention have made intensive studies. As a result, the inventors have found that the above-mentioned first technical object can be achieved by using a sealing material comprising at least inorganic powder, controlling the content of a refractory filler in the inorganic powder within a predetermined range, and enhancing the surface smoothness of a sealing material layer. Thus, the finding is proposed as a first invention. That is, a glass substrate with a sealing material layer of the present invention is a glass substrate with a sealing material layer comprising a sealing material layer formed by sintering a sealing material, wherein: the sealing material comprises at least inorganic powder; the inorganic powder comprises glass powder and a refractory filler; the content of the refractory filler in the inorganic powder is 10 to 35 vol %; and the sealing material layer has a surface roughness Ra of less than 0.5 µm. Herein, the term "inorganic powder" refers to inorganic material powder excluding a pigment and generally refers to a mixture of glass powder and a refractory filler. The term "surface roughness Ra" refers to a value measured by a method in accordance with JIS B0601:2001 (the same applies in the following). It should be noted that any one of various glass powders can be used as the glass powder, but as described below, SnO-containing glass powder or $Bi_2O_3$-containing glass powder is preferred.

The sealing material according to the first invention comprises inorganic powder which comprises glass powder and a refractory filler, and the content of the refractory filler in the inorganic powder is 10 to 35 vol %. When the content of the refractory filler is controlled to 10 vol % or more, the thermal expansion coefficient of the sealing material layer can be lowered and the mechanical strength of the sealing material layer can be enhanced. Further, when the content of the refractory filler is controlled to 35 vol % or less, the softening fluidity of the sealing material is hardly inhibited and the surface smoothness of the sealing material layer can be easily enhanced.

The sealing material layer according to the first invention has a surface roughness Ra of less than 0.5 µm. With this, the adhesiveness between glass substrates improves and the laser sealing property thereof remarkably increases.

Second, the glass substrate with a sealing material layer according to the first invention is a glass substrate with a sealing material layer comprising a sealing material layer formed by sintering a sealing material, wherein: the sealing material comprises inorganic powder and a pigment; the inorganic powder comprises glass powder and a refractory filler; the content of the refractory filler in the inorganic powder is 10 to 35 vol %; and the sealing material layer has a surface roughness RMS of less than 1.0 µm. Herein, the term "surface roughness RMS" refers to a value measured by a method in accordance with JIS B0601:2001 (the same applies in the following).

Third, in the glass substrate with a sealing material layer according to the first invention, the sealing material layer preferably has an average thickness of less than 10 µm.

Fourth, in the glass substrate with a sealing material layer according to the first invention, the sealing material layer preferably has an unpolished surface.

Fifth, in the glass substrate with a sealing material layer according to the first invention, the glass powder preferably comprises SnO-containing glass powder. With this, the softening point of the glass powder lowers, and hence the softening point of the sealing material also lowers. As a result, laser sealing is completed in a short period of time and the sealing strength at the time of the laser sealing can be enhanced. Herein, the term "SnO-containing glass powder" refers to glass powder comprising, as a glass composition, 20 mol % or more of SnO (the same applies in the following).

Sixth, in the glass substrate with a sealing material layer according to the first invention, the glass powder preferably comprises, as a glass composition expressed in mol % in terms of the following oxides, 35 to 70% of SnO and 10 to 30% of $P_2O_5$. With this, the water resistance of glass can be easily enhanced while the low-melting point characteristic of the glass is maintained. Herein, the phrase "in terms of the following oxides" means that, when tin oxide is taken as an example, even tetravalent tin oxide ($SnO_2$) is expressed as "SnO" by converting it into divalent tin oxide (SnO), and that, when iron oxide is taken as an example, even divalent iron oxide (FeO) is expressed as "$Fe_2O_3$" by converting it into trivalent iron oxide ($Fe_2O_3$) (the same applies in the following).

Seventh, in the glass substrate with a sealing material layer according to the first invention, the glass powder preferably comprises $Bi_2O_3$-containing glass powder. With this, the softening point of the glass powder lowers and the softening point of the sealing material also lowers. Further, the $Bi_2O_3$-containing glass powder is excellent in water resistance and sealing strength, and hence laser sealing can be completed in a short period of time and the sealing strength can be surely maintained over a long period. Herein, the term "$Bi_2O_3$-containing glass powder" refers to glass powder comprising, as a glass composition, 20 mol % or more of $Bi_2O_3$ (the same applies in the following).

Eighth, in the glass substrate with a sealing material layer according to the first invention, the glass powder preferably comprises, as a glass composition expressed in mol % in terms of the following oxides, 20 to 60% of $Bi_2O_3$, 10 to 35% of $B_2O_3$, 5 to 40% of ZnO, and 5 to 30% of CuO+$Fe_2O_3$. With this, the water resistance of glass can be easily enhanced while the low-melting point characteristic of the glass is maintained. Herein, the term "CuO+$Fe_2O_3$" refers to the total content of CuO and $Fe_2O_3$.

Ninth, in the glass substrate with a sealing material layer according to the first invention, the refractory filler preferably has an average particle diameter $D_{50}$ of 5 µm or less. With this, the surface smoothness of the sealing material layer improves, and hence laser light can be easily converted to thermal energy, glass substrates can be easily sealed with a laser at a low power at a high speed, and the thickness of the sealing material layer can be easily made smaller. Herein, the term "average particle diameter $D_{50}$" refers to a value measured by laser diffractometry, and refers to a particle diameter at which the cumulative amount of particles starting from a particle having the smallest diameter reaches 50% in a cumulative particle size distribution curve on a volume basis prepared based on the measurement by the laser diffractometry. Likewise, the term "maximum particle diameter $D_{99}$" to be described later refers to a value measured by laser diffractometry, and refers to a particle diameter at which the cumulative amount of particles starting from a particle having the smallest diameter reaches 99% in a cumulative particle size distribution curve on a volume basis prepared based on the measurement by the laser diffractometry. Likewise, the term "90% particle diameter $D_{90}$" to be described later refers to a value measured by laser diffractometry, and refers to a particle diameter at which the cumulative amount of particles starting from a particle having the smallest diameter reaches 90% in a cumulative particle size distribution curve on a volume basis prepared based on the measurement by the laser diffractometry. It should be noted that the matters with reference to the "average particle diameter $D_{50}$," the "maximum particle diameter $D_{99}$," and the "90% particle diameter $D_{90}$" also apply in the following.

Tenth, in the glass substrate with a sealing material layer according to the first invention, the refractory filler preferably has an average particle diameter $D_{99}$ of less than 10 μm. With this, the surface smoothness of the sealing material layer improves, and hence laser light can be easily converted to thermal energy, glass substrates can be easily sealed with a laser at a low power at a high speed, and the thickness of the sealing material layer can be easily made smaller.

Eleventh, in the glass substrate with a sealing material layer according to the first invention, the refractory filler preferably comprises one kind or two or more kinds selected from cordierite, zircon, tin oxide, niobium oxide, a zirconium phosphate-based ceramic, and $NbZr(PO_4)_3$.

Twelfth, in the glass substrate with a sealing material layer according to the first invention, the sealing material preferably further comprises a pigment, and the pigment preferably comprises carbon. With this, the pigment converts laser light to thermal energy, and hence the laser sealing property can be enhanced. Further, carbon is excellent in coloring property and is good in laser-light absorbing property. Besides, carbon has an effect of preventing such a situation that the nature of SnO-containing glass powder is altered at the time of laser sealing, that is, an effect of preventing such a situation that SnO in the glass composition is oxidized into $SnO_2$ at the time of laser sealing. It should be noted that various materials can be used as the carbon, and amorphous carbon or graphite is particularly suitable.

Thirteenth, in the glass substrate with a sealing material layer according to the first invention, the content of the pigment in the sealing material is preferably 0.2 to 0.7 mass %. When the content of the pigment is controlled to 0.2 mass % or more, laser light can be efficiently converted to thermal energy, and hence only the sites that should be sealed can be easily heated locally. As a result, glass substrates can be easily sealed with a laser with each other while preventing the thermal degradation of an active element or the like. On the other hand, when the content of the pigment is controlled to 1 mass % or less, excessive heating at the time of laser irradiation can be suppressed, and such a situation that glass devitrifies at the time of laser sealing can be easily prevented.

Fourteenth, the glass substrate with a sealing material layer according to the first invention is preferably used for sealing an OLED device. Herein, the term "OLED device" encompasses an OLED display, an OLED lighting device, and the like (the same applies in the following).

Fifteenth, the glass substrate with a sealing material layer according to the first invention is preferably used for laser sealing. It should be noted that, as described above, laser sealing can locally heat only the sites that should be sealed, and hence glass substrates can be sealed with each other while the thermal degradation of an active element or the like is prevented.

Various lasers can be used for the laser sealing, and a semiconductor laser, a YAG laser, a $CO_2$ laser, an excimer laser, an infrared laser, and the like are preferred because they are easy to handle (the same applies in the following).

Sixteenth, the glass substrate with a sealing material layer according to the first invention is preferably used for laser sealing in an inert atmosphere. Herein, the term "inert atmosphere" encompasses a neutral gas atmosphere such as an $N_2$ gas atmosphere or an Ar gas atmosphere, and a reduced pressure atmosphere such as a vacuum atmosphere (the same applies in the following).

Seventeenth, an OLED device according to the first invention is produced by using the above-mentioned glass substrate with a sealing material layer.

<Second Invention>

The inventors of the present invention have made intensive studies. As a result, the inventors have found that the above-mentioned second technical object can be achieved by controlling a laser sealing temperature to a temperature equal to or lower than a firing temperature of a coating layer. Thus, the finding is proposed as a second invention. That is, a method of producing an electronic device according to the second invention is a method of producing an electronic device by laser sealing, the method comprising the steps of: (1) preparing a glass substrate; (2) mixing a sealing material comprising glass powder and a vehicle comprising an organic binder to manufacture a sealing material paste; (3) applying the sealing material paste onto the glass substrate to form a coating layer; (4) firing the coating layer to yield a glass substrate with a sealing material layer; (5) laminating the glass substrate with a sealing material layer and a glass substrate without a sealing material layer, via the sealing material layer; and (6) irradiating the laminate with laser light so that a laser sealing temperature is equal to or lower than a firing temperature to hermetically seal the glass substrate with a sealing material layer and the glass substrate without a sealing material layer. Herein, when "the coating layer is fired," the step of burning and removing the organic binder in the coating layer (debinder step) and the step of sintering the coating layer (sintering step) may be carried out separately or may be carried out at the same time. The "glass substrate without a sealing material layer" generally serves as a glass substrate on which elements for an electronic device are formed. The term "laser sealing temperature" refers to a value obtained by measuring the temperature of a sealing material layer with a radiation thermometer when laser sealing is performed. The term "firing temperature" refers to the highest temperature applied in the above-mentioned step (4) of firing the coating layer, and when the step of burning and removing the organic binder in the coating layer and the step of sintering the coating layer are carried out separately, the term "firing temperature" refers to the highest temperature applied in any one of the steps.

The amount of released gas is inversely proportional to the viscosity of a sealing material. When the firing temperature of a coating layer is increased, the viscosity of a sealing material reduces, resulting in an increased amount of released gas, but it is unlikely that the released gas degrades an OLED element. Further, when a laser sealing temperature is decreased, the viscosity of a sealing material increases, resulting in a decreased amount of released gas. Thus, when the laser sealing temperature is controlled to a temperature equal to or lower than the firing temperature, the amount of released gas can be remarkably suppressed at the time of laser sealing. As a method of controlling a laser sealing temperature to a temperature equal to or lower than a firing temperature, there are given a method involving increasing a firing temperature and a method involving decreasing a laser sealing temperature. In the case of the former method, it is effective to select a glass system having high thermal stability. In the case of the latter method, it is effective to optimize the irradiation condition of laser light and it is also effective to optimize the content of a component for absorbing laser light in a sealing material.

Second, in the method of producing an electronic device according to the second invention, the laser sealing temperature is preferably 500° C. or less. With this, the amount of released gas at the time of laser sealing reduces.

Third, in the method of producing an electronic device according to the second invention, the sealing material preferably comprises 97.5 to 100 mass % of inorganic powder comprising glass powder and 0 to 2.5 mass % of a pigment. With this, laser sealing can ensure air tightness of the inside of an OLED display, and hence it is possible to prevent such a situation that $H_2O$, $O_2$, and the like, which degrade an organic light-emitting layer, penetrate into the inside of the OLED display. As a result, the long-term reliability of the OLED display can be enhanced.

When the content of the inorganic powder is less than 97.5 mass %, when laser sealing is performed, the softening fluidity of a sealing material reduces and it is difficult to enhance the sealing strength. It should be noted that, when the content of the pigment is controlled to 0.05 mass % or more, laser light can be efficiently converted to thermal energy, and hence only the sites that should be sealed can be easily heated locally. As a result, glass substrates can be easily sealed with a laser with each other while preventing the thermal degradation of an active element or the like. On the other hand, when the content of the pigment is controlled to 2.5 mass % or less, it is possible to prevent such a situation that the temperature of a sealing material layer improperly rises, resulting in an increased amount of released gas at the time of laser sealing. Besides, such a situation that glass devitrifies can be easily prevented.

Fourth, in the method of producing an electronic device according to the second invention, the glass powder preferably comprises, as a glass composition in terms of the following oxides, 35 to 70% of SnO and 10 to 30% of $P_2O_5$. With this, the softening point of the glass powder lowers, and hence the softening point of a sealing material also lowers. As a result, laser sealing is completed in a short period of time and the sealing strength can be enhanced at the time of the laser sealing.

Fifth, in the method of producing an electronic device according to the second invention, the glass powder preferably comprises, as a glass composition in terms of the following oxides, 20 to 60% of $Bi_2O_3$, 10 to 35% of $B_2O_3$, 5 to 40% of ZnO, and 5 to 30% of $CuO+Fe_2O_3$. With this, the softening point of the glass powder lowers, and hence the softening point of a sealing material also lowers. Further, when laser sealing is performed, the energy of irradiated laser light is directly absorbed and can be efficiently converted to heat, and the reaction between the sealing material and a glass substrate can be promoted. As a result, the laser sealing is completed in a short period of time and the sealing strength can be enhanced at the time of the laser sealing.

Sixth, in the method of producing an electronic device according to the second invention, the pigment preferably comprises one kind or two or more kinds selected from carbon (C), $Co_3O_4$, CuO, $Cr_2O_3$, $Fe_2O_3$, $MnO_2$, SnO, and $Ti_nO_{2n-1}$ (where n represents an integer), and a spinel-type composite oxide.

Seventh, in the method of producing an electronic device according to the second invention, the inorganic powder preferably further comprises 0.1 to 60 vol % of a refractory filler.

Eighth, in the method of producing an electronic device according to the second invention, the electronic device preferably comprises an OLED device.

Ninth, in the method of producing an electronic device according to the second invention, the organic binder preferably comprises an aliphatic polyolefin-based carbonate.

Tenth, in the method of producing an electronic device according to the second invention, the coating layer is preferably fired under an inert atmosphere.

Eleventh, an electronic device according to the second invention is manufactured by the above-mentioned method of producing an electronic device.

<First Related Invention>

The inventors of the present invention have made intensive studies. As a result, the inventors have found that the above-mentioned first technical object can be achieved by manufacturing a laminated film from a plurality of sealing material pastes, followed by firing, to thereby form a sealing material layer, and reducing the particle size of glass powder in the outermost layer of the laminated film to a smaller one. Thus, the finding is proposed as a first related invention. That is, a method of producing a glass substrate with a sealing material layer according to the first related invention comprises the steps of: preparing a glass substrate; applying a first sealing material paste onto the glass substrate, followed by forming a first sealing material film; applying a second sealing material paste onto the first sealing material film, followed by forming a second sealing material film; and firing the resultant laminated film to form a sealing material layer on the glass substrate, the first sealing material paste comprising first glass powder, the second sealing material paste comprising second glass powder, the average particle diameter $D_{50}$ of the second glass powder being smaller than the average particle diameter $D_{50}$ of the first glass powder. Herein, the "second sealing material film" is generally formed of a single layer and serves as the outermost layer of the sealing material film, but may include a plurality of layers if the material formulations thereof are identical. Further, the term "first sealing material film" refers to a sealing material film other than the second sealing material film and generally refers to a layer other than the outermost layer of the sealing material film, but the "first sealing material film" is not limited to a single layer and may include a plurality of layers. In that case, the material formulations thereof may be different. The "first sealing material film" and the "second sealing material film" include not only a dry film obtained by volatilizing a solvent in a vehicle but also a wet film in which part of a solvent in a vehicle remains. It should be noted that the matters with reference to the "first sealing material film" and the "second sealing material film" also apply in the following. Any one of various glass powders can be used as the glass powder, but as described below, SnO-containing glass powder or $Bi_2O_3$-containing glass powder is preferred.

The inventors of the present invention have paid attention to the fact that, when the adhesiveness between a sealing material layer and an object to be sealed (such as a glass substrate on which an element is formed) is enhanced, a low-power laser enables laser sealing, and have found that it is important to enhance the surface smoothness of the sealing material layer in order to achieve the fact. Further, the inventors of the present invention have found that, when the particle size of the glass powder in the second sealing material film is made smaller than the particle size of the glass powder in the first sealing material film and the laminated film of both films is fired to form a sealing material layer, the surface smoothness of the sealing material layer remarkably improves.

Thus, when the glass substrate with a sealing material layer according to the first related invention is used, a low-power laser enables laser sealing. Further, the laser sealing can properly ensure air tightness of the inside of an OLED device, and hence it is possible to prevent such a situation that $H_2O$, $O_2$, and the like, which degrade an organic light-emitting layer, penetrate into the inside of the OLED device. As a result, the long-term reliability of the OLED device can be enhanced. It should be noted that, in the present invention, the surface smoothness of the sealing material layer is ensured by virtue of the second sealing material film. As a result, glass powder having an excessively small particle size is not required to form the first sealing material film, and hence the sealing material layer can be formed at low cost.

Second, the method of producing a glass substrate with a sealing material layer according to the first related invention comprises the steps of: preparing a glass substrate; applying a first sealing material paste onto the glass substrate, followed by forming a first sealing material film; applying a second sealing material paste onto the first sealing material film, followed by forming a second sealing material film; and firing the resultant laminated film to form a sealing material layer on the glass substrate, the first sealing material paste comprising first glass powder, the second sealing material paste comprising second glass powder, the maximum particle diameter $D_{99}$ of the second glass powder being smaller than the maximum particle diameter $D_{99}$ of the first glass powder.

Third, in the method of producing a glass substrate with a sealing material layer according to the first related invention, the average particle diameter $D_{50}$ of the second glass powder is preferably 0.1 to 2.0 μm and the average particle diameter $D_{50}$ of the first glass powder is preferably 1.0 to 3.5 μm.

Fourth, in the method of producing a glass substrate with a sealing material layer according to the first related invention, the maximum particle diameter $D_{99}$ of the second glass powder is preferably 0.5 to 6.1 μm and the maximum particle diameter $D_{99}$ of the first glass powder is preferably 3.0 to 15.0 μm.

Fifth, in the method of producing a glass substrate with a sealing material layer according to the first related invention, the glass composition of the first glass powder is preferably almost the same as the glass composition of the second glass powder. Herein, the phrase "the glass composition is almost the same" refers to the case that the difference in the content of each component in the glass composition is within ±3 mol %.

Sixth, in the method of producing a glass substrate with a sealing material layer according to the first related invention, each of the first glass powder and the second glass powder is preferably SnO-containing glass powder. With this, the softening point of the glass powder lowers, and hence the softening point of the sealing material also lowers. As a result, laser sealing is completed in a short period of time and the sealing strength can be enhanced at the time of the laser sealing.

Seventh, in the method of producing a glass substrate with a sealing material layer according to the first related invention, the SnO-containing glass powder preferably comprises, as a glass composition expressed in mol % in terms of the following oxides, 35 to 70% of SnO and 10 to 30% of $P_2O_5$. With this, the water resistance of glass can be easily enhanced while the low-melting point characteristic of the glass is maintained.

Eighth, in the method of producing a glass substrate with a sealing material layer according to the first related invention, each of the first glass powder and the second glass powder is preferably $Bi_2O_3$-containing glass powder. With this, the softening point of the glass powder lowers, and hence the softening point of the sealing material also lowers. As a result, laser sealing is completed in a short period of time and the sealing strength can be enhanced at the time of the laser sealing.

Ninth, in the method of producing a glass substrate with a sealing material layer according to the first related invention, the $Bi_2O_3$-containing glass powder preferably comprises, as a glass composition expressed in mol % in terms of the following oxides, 20 to 60% of $Bi_2O_3$, 10 to 35% of $B_2O_3$, 5 to 40% of ZnO, and 5 to 30% of $CuO+Fe_2O_3$. With this, the softening point of the glass powder lowers, and hence the softening point of the sealing material also lowers. Further, when laser sealing is performed, the energy of irradiated laser light is directly absorbed and can be efficiently converted to heat, and the reaction between the sealing material and a glass substrate can be promoted. As a result, the laser sealing is completed in a short period of time and the sealing strength can be enhanced at the time of the laser sealing.

Tenth, in the method of producing a glass substrate with a sealing material layer according to the first related invention, each of the first sealing material paste and the second sealing material paste preferably further comprises a refractory filler. With this, the mechanical strength of the sealing material layer is likely to improve and the thermal expansion coefficient of the sealing material layer is likely to lower.

Eleventh, in the method of producing a glass substrate with a sealing material layer according to the first related invention, each of the first sealing material paste and the second sealing material paste preferably further comprises a pigment. With this, the sealing material layer is likely to absorb laser light.

Twelfth, in the method of producing a glass substrate with a sealing material layer according to the first related invention, the pigment preferably comprises carbon.

Thirteenth, in the method of producing a glass substrate with a sealing material layer according to the first related invention, the sealing material layer preferably has a surface roughness Ra of 0.6 μm or less.

Fourteenth, in the method of producing a glass substrate with a sealing material layer according to the first related invention, the sealing material layer preferably has a surface roughness RMS of 1.0 μm or less.

Fifteenth, a glass substrate with a sealing material layer according to the first related invention is manufactured by the method of producing a glass substrate with a sealing material layer.

Sixteenth, a method of producing an electronic device according to the first related invention is a method of producing an electronic device by sealing a glass substrate with a sealing material layer with a glass substrate without a sealing material layer, the method comprising: manufacturing the glass substrate with a sealing material layer by the above-mentioned method; and irradiating the sealing material layer with laser light to seal the glass substrate with a sealing material layer with the glass substrate without a sealing material layer. It should be noted that, as mentioned above, only the sites that should be sealed can be heated locally by laser sealing, and hence the glass substrates can be easily sealed with each other while preventing the thermal degradation of an active element or the like.

Seventeenth, in the method of producing an electronic device according to the first related invention, the electronic device comprises an OLED device.

Eighteenth, a sealing material according to the first related invention is a sealing material comprising at least glass powder, in which the average particle diameter $D_{50}$ of the glass powder is 0.1 to 2.0 µm and the sealing material is used for forming a sealing material layer.

Nineteenth, a sealing material according to the first related invention is a sealing material comprising at least glass powder, in which the average particle diameter $D_{99}$ of the glass powder is 0.5 to 6.1 µm and the sealing material is used for forming a sealing material layer.

Twentieth, in the sealing material according to the first related invention, the sealing material layer preferably has a surface roughness Ra of 0.6 µm or less.

Twenty-first, in the sealing material according to the first related invention, the sealing material layer preferably has a surface roughness RMS of 1.0 µm or less.

<Second Related Invention>

The inventors of the present invention have made intensive studies. As a result, the inventors have found that the above-mentioned first technical object can be achieved by manufacturing a laminated film from a plurality of sealing material pastes, followed by firing, to thereby form a sealing material layer, and reducing the softening point of glass powder in the outermost layer to a lower one. Thus, the finding is proposed as a second related invention. That is, a method of producing a glass substrate with a sealing material layer according to the second related invention comprises the steps of: preparing a glass substrate; applying a first sealing material paste onto the glass substrate, followed by forming a first sealing material film; applying a second sealing material paste onto the first sealing material film, followed by forming a second sealing material film; and firing the resultant laminated film to form a sealing material layer on the glass substrate, the first sealing material paste comprising first glass powder, the second sealing material paste comprising second glass powder, the softening point of the second glass powder being lower than the softening point of the first glass powder. Herein, the term "softening point" refers to a value measured with a macro-type differential thermal analysis (DTA) apparatus, and in the DTA, the measurement starts from room temperature and the temperature increase rate is set to 10° C./min. For example, when SnO-containing glass powder is used, the measurement is recommended to be performed under a nitrogen atmosphere, and when $Bi_2O_3$-containing glass powder is used, the measurement is recommended to be performed under an air atmosphere. Further, the softening point measured with the macro-type DTA apparatus refers to a temperature (Ts) at a fourth inflection point illustrated in FIG. 1. It should be noted that the matters with reference to the softening point also apply in the following. Any one of various glass powders can be used as the glass powder, but SnO-containing glass powder or $Bi_2O_3$-containing glass powder is preferred.

The inventors of the present invention have paid attention to the fact that, when the adhesiveness between a sealing material layer and an object to be sealed (such as a glass substrate on which an element is formed) is enhanced, a low-power laser enables laser sealing, and have found that it is important to enhance the surface smoothness of the sealing material layer in order to achieve the fact. Further, the inventors of the present invention have found that, when the softening point of the glass powder in the second sealing material film is made lower than the softening point of the glass powder in the first sealing material film and the laminated film of both films is fired to form a sealing material layer, the surface smoothness of the sealing material layer remarkably improves.

Thus, when the glass substrate with a sealing material layer according to the second related invention is used, a low-power laser enables laser sealing. Further, the laser sealing can properly ensure air tightness of the inside of an OLED device, and hence it is possible to prevent such a situation that $H_2O$, $O_2$, and the like, which degrade an organic light-emitting layer, penetrate into the inside of the OLED device. As a result, the long-term reliability of the OLED device can be enhanced. It should be noted that, in the second related invention, the surface smoothness of the sealing material layer can be ensured by virtue of the second sealing material film. As a result, glass powder having an excessively low melting point is not required to form the first sealing material film, and the thermal stability of the sealing material layer can be enhanced in terms of the whole sealing material layer.

Second, in the method of producing a glass substrate with a sealing material layer according to the second related invention, the value of (the density of the second glass powder–the density of the first glass powder) is preferably 0.01 to 0.50 g/cm³.

Third, in the method of producing a glass substrate with a sealing material layer according to the second related invention, the value of (the thermal expansion coefficient of the second glass powder–the thermal expansion coefficient of the first glass powder) is preferably $0.5 \times 10^{-7}$ to $10 \times 10^{-7}$/° C. Herein, the term "thermal expansion coefficient" refers to an average value of values measured with a push-rod-type thermal expansion coefficient measurement (TMA) apparatus. In the case of, for example, SnO-containing glass powder (including an SnO—$P_2O_5$-based glass powder), the term "thermal expansion coefficient" refers to an average value of values measured in the temperature range of 30 to 250° C. In the case of, for example, $Bi_2O_3$-containing glass powder ($Bi_2O_3$—$B_2O_3$-based glass powder), the term "thermal expansion coefficient" refers to an average value of values measured in the temperature range of 30 to 300° C. It is possible to use, as a measurement sample, for example, a sample prepared by processing a sintered body so as to have a predetermined shape. It should be noted that the matters with reference to the thermal expansion coefficient also apply in the following.

Fourth, in the method of producing a glass substrate with a sealing material layer according to the second related invention, each of the first glass powder and the second glass powder is preferably SnO-containing glass powder. With this, the softening point of the glass powder lowers, and hence the softening point of the sealing material also lowers. As a result, laser sealing is completed in a short period of time and the sealing strength can be enhanced at the time of the laser sealing.

Fifth, in the method of producing a glass substrate with a sealing material layer according to the second related invention, the SnO-containing glass powder preferably comprises, as a glass composition expressed in mol % in terms of the following oxides, 35 to 70% of SnO and 10 to 30% of $P_2O_5$. With this, the water resistance of glass can be easily enhanced while the low-melting point characteristic of the glass is maintained.

Sixth, in the method of producing a glass substrate with a sealing material layer according to the second related invention, each of the first glass powder and the second glass powder is preferably $Bi_2O_3$-containing glass powder. With this, the softening point of the glass powder lowers, and hence the softening point of the sealing material also lowers. As a result, laser sealing is completed in a short period of time and the sealing strength can be enhanced at the time of the laser sealing.

Seventh, in the method of producing a glass substrate with a sealing material layer according to the second related invention, the $Bi_2O_3$-containing glass powder preferably comprises, as a glass composition expressed in mol % in terms of the following oxides, 20 to 60% of $Bi_2O_3$, 10 to 35% of $B_2O_3$, 5 to 40% of ZnO, and 5 to 30% of CuO+$Fe_2O_3$. With this, the softening point of the glass powder lowers, and hence the softening point of the sealing material also lowers. Further, when laser sealing is performed, the energy of irradiated laser light is directly absorbed and can be efficiently converted to heat, and the reaction between the sealing material and a glass substrate can be promoted. As a result, the laser sealing is completed in a short period of time and the sealing strength can be enhanced at the time of the laser sealing.

Eighth, in the method of producing a glass substrate with a sealing material layer according to the second related invention, each of the first sealing material paste and the second sealing material paste preferably further comprises a refractory filler. With this, the mechanical strength of the sealing material layer is likely to improve and the thermal expansion coefficient of the sealing material layer is likely to lower.

Ninth, in the method of producing a glass substrate with a sealing material layer according to the second related invention, each of the first sealing material paste and the second sealing material paste preferably further comprises a pigment. With this, the sealing material layer is likely to absorb laser light.

Tenth, in the method of producing a glass substrate with a sealing material layer according to the second related invention, the pigment preferably comprises carbon. Carbon is excellent in coloring property and is good in laser-light absorbing property. Besides, carbon has an effect of preventing such a situation that the nature of SnO-containing glass powder is altered at the time of laser sealing, that is, an effect of preventing such a situation that SnO in the glass composition is oxidized into $SnO_2$ at the time of laser sealing. It should be noted that various materials can be used as the carbon, and amorphous carbon or graphite is particularly suitable.

Eleventh, in the method of producing a glass substrate with a sealing material layer according to the second related invention, the sealing material layer preferably has a surface roughness Ra of 0.6 µm or less.

Twelfth, in the method of producing a glass substrate with a sealing material layer according to the second related invention, the sealing material layer preferably has a surface roughness RMS of 1.0 µm or less.

Thirteenth, a method of producing an electronic device according to the second related invention is a method of producing an electronic device by sealing a glass substrate with a sealing material layer with a glass substrate without a sealing material layer, the method comprising: manufacturing the glass substrate with a sealing material layer by the above-mentioned method; and irradiating the sealing material layer with laser light to seal the glass substrate with a sealing material layer with the glass substrate without a sealing material layer. It should be noted that, as mentioned above, only the sites that should be sealed can be heated locally by laser sealing, and hence the glass substrates can be easily sealed with each other while preventing the thermal degradation of an active element or the like.

Fourteenth, in the method of producing an electronic device according to the second related invention, the electronic device preferably comprises an OLED device.

Fifteenth, a glass substrate with a sealing material layer according to the second related invention is manufactured by the method of producing a glass substrate with a sealing material layer.

Sixteenth, the glass substrate with a sealing material layer according to the second related invention is a glass substrate with a sealing material layer produced by applying a sealing material paste onto a glass substrate, followed by firing, in which a region to be brought into contact with an object to be sealed in the sealing material layer is more likely to soften than a region to be brought into contact with the glass substrate in the sealing material layer.

Seventeenth, a sealing material according to the second related invention is a sealing material comprising at least glass powder, in which the softening point of the glass powder is 400° C. or less and the sealing material is used for forming a sealing material layer.

<Third Related Invention>

The inventors of the present invention have made intensive studies. As a result, the inventors have found that the above-mentioned first technical object can be achieved by manufacturing a laminated film from a plurality of sealing material pastes, followed by firing, to thereby form a sealing material layer, and reducing the content of a refractory filler in the outermost layer of the laminated film. Thus, the finding is proposed as a third related invention. That is, a method of producing a glass substrate with a sealing material layer according to the third related invention is a method comprising the steps of: preparing a glass substrate; applying a first sealing material paste onto the glass substrate, followed by forming a first sealing material film; applying a second sealing material paste onto the first sealing material film, followed by forming a second sealing material film; and firing the resultant laminated film to form a sealing material layer on the glass substrate, the first sealing material paste comprising a first sealing material, the second sealing material paste comprising a second sealing material, the content of a refractory filler in the second sealing material being smaller than the content of a refractory filler in the first sealing material. Herein, the term "first sealing material" refers to a first sealing material paste not containing a vehicle component, and specifically refers to a material just ready to be mixed with a vehicle to manufacture a first sealing material paste. The term "second sealing material" refers to a second sealing material paste not containing a vehicle component, and specifically refers to a material just ready to be mixed with a vehicle to manufacture a second sealing material paste. It should be noted that the matters with reference to the "first sealing material" and the "second sealing material" also apply in the following.

The inventors of the present invention have paid attention to the fact that, when the adhesiveness between a sealing material layer and an object to be sealed (such as a glass substrate on which an element is formed) is enhanced, a low-power laser enables laser sealing, and have found that it is important to enhance the surface smoothness of the sealing material layer in order to achieve the fact. Further, the inventors of the present invention have found that, when the content of the refractory filler in the second sealing material is made smaller than the content of the refractory filler in the first sealing material and the laminated film is fired to form a sealing material layer, the surface smoothness of the sealing material layer remarkably improves. In addition, the inventors of the present invention have found that, when the content of the refractory filler in the second sealing material is smaller than the content of the refractory filler in the first sealing material and the laminated film is fired to form a sealing material layer, an improper stress is difficult to remain in the sealing material layer.

Thus, when the glass substrate with a sealing material layer according to the third related invention is used, a low-power laser enables laser sealing. Further, the laser sealing can properly ensure air tightness of the inside of an OLED device, and hence it is possible to prevent such a situation that $H_2O$, $O_2$, and the like, which degrade an organic light-emitting layer, penetrate into the inside of the OLED device. As a result, the long-term reliability of the OLED device can be enhanced.

Further, when a refractory filler is added in the first sealing material and the second sealing material, the mechanical strength of the sealing material layer is likely to improve and the thermal expansion coefficient of the sealing material layer is likely to lower.

Second, in the method of producing a glass substrate with a sealing material layer according to the third related invention, the content (which is calculated by excluding the content of a pigment) of the refractory filler in the second sealing material is preferably 5 to 40 mass %, and the content (which is calculated by excluding the content of a pigment) of the refractory filler in the first sealing material is preferably 20 to 60 mass %.

Third, in the method of producing a glass substrate with a sealing material layer according to the third related invention, the value of (the thermal expansion coefficient of the second sealing material–the thermal expansion coefficient of the first sealing material) is preferably $1\times10^{-7}$ to $45\times10^{-7}/°$ C.

Fourth, in the method of producing a glass substrate with a sealing material layer according to the third related invention, each of the first sealing material and the second sealing material preferably further comprises SnO-containing glass powder. With this, the softening point of the glass powder lowers, and hence the softening point of the sealing material also lowers. As a result, laser sealing is completed in a short period of time and the sealing strength can be enhanced at the time of the laser sealing.

Fifth, in the method of producing a glass substrate with a sealing material layer according to the third related invention, the SnO-containing glass powder preferably comprises, as a glass composition expressed in mol % in terms of the following oxides, 35 to 70% of SnO and 10 to 30% of $P_2O_5$. With this, the water resistance of glass can be easily enhanced while the low-melting point characteristic of the glass is maintained.

Sixth, in the method of producing a glass substrate with a sealing material layer according to the third related invention, each of the first glass powder and the second glass powder preferably further comprises $Bi_2O_3$-containing glass powder. With this, the softening point of the glass powder lowers, and hence the softening point of the sealing material also lowers. As a result, laser sealing is completed in a short period of time and the sealing strength can be enhanced at the time of the laser sealing.

Seventh, in the method of producing a glass substrate with a sealing material layer according to the third related invention, the $Bi_2O_3$-containing glass powder preferably comprises, as a glass composition expressed in mol % in terms of the following oxides, 20 to 60% of $Bi_2O_3$, 10 to 35% of $B_2O_3$, 5 to 40% of ZnO, and 5 to 30% of $CuO+Fe_2O_3$. With this, the softening point of the glass powder lowers, and hence the softening point of the sealing material also lowers. Further, when laser sealing is performed, the energy of irradiated laser light is directly absorbed and can be efficiently converted to heat, and the reaction between the sealing material and a glass substrate can be promoted. As a result, the laser sealing is completed in a short period of time and the sealing strength can be enhanced at the time of the laser sealing.

Eighth, in the method of producing a glass substrate with a sealing material layer according to the third related invention, each of the first sealing material and the second sealing material preferably further comprises a pigment. With this, the sealing material layer is likely to absorb laser light.

Ninth, in the method of producing a glass substrate with a sealing material layer according to the third related invention, the pigment preferably comprises carbon.

Tenth, in the method of producing a glass substrate with a sealing material layer according to the third related invention, the sealing material layer preferably has a surface roughness Ra of 0.6 μm or less.

Eleventh, in the method of producing a glass substrate with a sealing material layer according to the third related invention, the sealing material layer preferably has a surface roughness RMS of 1.0 μm or less.

Twelfth, a method of producing an electronic device according to the third related invention is a method of producing an electronic device by sealing a glass substrate with a sealing material layer with a glass substrate without a sealing material layer, comprising: manufacturing the glass substrate with a sealing material layer by the above-mentioned method; and irradiating the sealing material layer with laser light to seal the glass substrate with a sealing material layer with the glass substrate without a sealing material layer. It should be noted that, as mentioned above, only the sites that should be sealed can be heated locally by laser sealing, and hence the glass substrates can be easily sealed with each other while preventing the thermal degradation of an active element or the like.

Thirteenth, in the method of producing an electronic device according to the third related invention, the electronic device preferably comprises an OLED device.

Fourteenth, a glass substrate with a sealing material layer according to the third related invention is manufactured by the method of producing a glass substrate with a sealing material layer.

Fifteenth, the glass substrate with a sealing material layer according to the third related invention is a glass substrate with a sealing material layer produced by applying a sealing material paste onto a glass substrate, followed by firing, in which the sealing material layer comprises glass powder and a refractory filler and the content of the refractory filler in the surface region of the sealing material layer is smaller than that in the internal region of the sealing material layer.

Sixteenth, in the glass substrate with a sealing material layer according to the third related invention, the content of the refractory filler preferably gradually decreases from the surface region of the sealing material layer toward the internal region thereof.

DESCRIPTION OF EMBODIMENTS

Embodiment of First Invention

Figure 1:
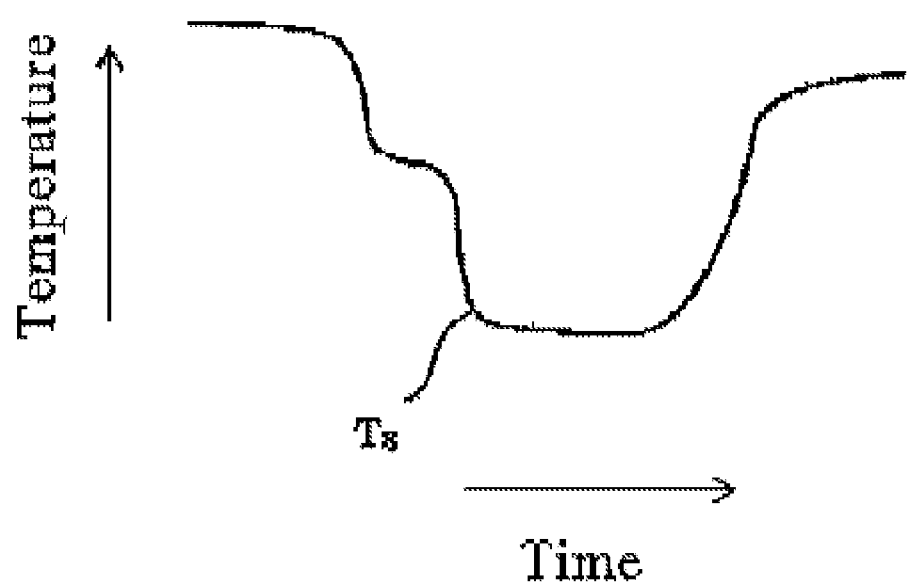
FIG. 1 is a schematic view illustrating the softening point Ts of a sealing material measured with a macro-type DTA apparatus.

A glass substrate with a sealing material layer according to an embodiment of the first invention has a sealing material layer formed by firing a sealing material. The sealing material comprises inorganic powder comprising glass powder and a refractory filler. As the sealing material comprises a refractory filler, the thermal expansion coefficient of the sealing material layer can be reduced and the mechanical strength of the sealing material layer can be enhanced. The suitable formulations of the glass powder and refractory filler are as mentioned below.

The glass powder is preferably SnO-containing glass powder. The SnO-containing glass powder preferably comprises, as a glass composition expressed in mol % in terms of the following oxides, 35 to 70% of SnO and 10 to 30% of $P_2O_5$. The reasons why the range of the glass composition has been limited as described above are shown below. It should be noted that, in the following description of the range of the glass composition, the expression "%" refers to "mol %" unless otherwise specified.

SnO is a component that reduces the melting point of glass. The content of SnO is preferably 35 to 70%, 40 to 70%, particularly preferably 50 to 68%. It should be noted that, when the content of SnO is 50% or more, the glass easily softens and flows at the time of laser sealing. It should be noted that, when the content of SnO is less than 35%, the viscosity of the glass becomes too high and it becomes difficult to perform laser sealing with a desired laser power. On the other hand, when the content of SnO is more than 70%, the vitrification of the glass becomes difficult.

$P_2O_5$ is a glass-forming oxide and is a component that enhances the thermal stability of glass. The content of $P_2O_5$ is preferably 10 to 30%, 15 to 27%, particularly preferably 15 to 25%. When the content of $P_2O_5$ is less than 10%, the thermal stability is liable to deteriorate. On the other hand, when the content of $P_2O_5$ is more than 30%, the climate resistance deteriorates, and hence it becomes difficult to ensure the long-term reliability of an OLED device or the like.

The following components can be added in addition to the above-mentioned components.

ZnO is an intermediate oxide and is a component that stabilizes glass. The content of ZnO is preferably 0 to 30%, 1 to 20%, particularly preferably 1 to 15%. When the content of ZnO is more than 30%, the thermal stability is liable to deteriorate.

$B_2O_3$ is a glass-forming oxide and is a component that stabilizes glass. Further, $B_2O_3$ is a component that enhances the climate resistance. The content of $B_2O_3$ is preferably 0 to 20%, 1 to 20%, particularly preferably 2 to 15%. When the content of $B_2O_3$ is more than 20%, the viscosity of the glass becomes too high and it becomes difficult to perform laser sealing with a desired laser element.

$Al_2O_3$ is an intermediate oxide and is a component that stabilizes glass. Besides, $Al_2O_3$ is a component that lowers the thermal expansion coefficient. The content of $Al_2O_3$ is preferably 0 to 10%, 0.1 to 10%, particularly preferably 0.5 to 5%. When the content of $Al_2O_3$ is more than 10%, the softening point of the glass powder improperly rises and it becomes difficult to perform laser sealing with a desired laser element.

$SiO_2$ is a glass-forming oxide and is a component that stabilizes glass. The content of $SiO_2$ is preferably 0 to 15%, particularly preferably 0 to 5%. When the content of $SiO_2$ is more than 15%, the softening point of the glass powder improperly rises and it becomes difficult to perform laser sealing with a desired laser element.

$In_2O_3$ is a component that enhances the thermal stability and the content of $In_2O_3$ is preferably 0 to 5%. When the content of $In_2O_3$ is more than 5%, batch cost soars.

$Ta_2O_5$ is a component that enhances the thermal stability and the content of $Ta_2O_5$ is preferably 0 to 5%. When the content of $Ta_2O_5$ is more than 5%, the softening point of the glass powder improperly rises and it becomes difficult to perform laser sealing with a desired laser element.

$La_2O_3$ is a component that enhances the thermal stability and is a component that enhances the climate resistance. The content of $La_2O_3$ is preferably 0 to 15%, 0 to 10%, particularly preferably 0 to 5%. When the content of $La_2O_3$ is more than 15%, batch cost soars.

$MoO_3$ is a component that enhances the thermal stability and the content of $MoO_3$ is preferably 0 to 5%. When the content of $MoO_3$ is more than 5%, the softening point of the glass powder improperly rises and it becomes difficult to perform laser sealing with a desired laser element.

$WO_3$ is a component that enhances the thermal stability and the content of $WO_3$ is preferably 0 to 5%. When the content of $WO_3$ is more than 5%, the softening point of glass powder improperly rises and it becomes difficult to perform laser sealing with a desired laser element.

$Li_2O$ is a component that lowers the melting point of glass and the content of $Li_2O$ is preferably 0 to 5%. When the content of $Li_2O$ is more than 5%, the thermal stability is liable to deteriorate.

$Na_2O$ is a component that lowers the melting point of glass and the content of $Na_2O$ is preferably 0 to 10%, particularly preferably 0 to 5%. When the content of $Na_2O$ is more than 10%, the thermal stability is liable to deteriorate.

$K_2O$ is a component that lowers the melting point of glass and the content of $K_2O$ is preferably 0 to 5%. When the content of $K_2O$ is more than 5%, the thermal stability is liable to deteriorate.

MgO is a component that enhances the thermal stability and the content of MgO is preferably 0 to 15%. When the content of MgO is more than 15%, the softening point of glass powder improperly rises and it becomes difficult to perform laser sealing with a desired laser element.

BaO is a component that enhances the thermal stability and the content of BaO is preferably 0 to 10%. When the content of BaO is more than 10%, the balance of the components in the composition of the glass is impaired, and the glass is liable to denitrify to the worse.

$F_2$ is a component that lowers the melting point of glass and the content of $F_2$ is preferably 0 to 5%. When the content of $F_2$ is more than 5%, the thermal stability is liable to deteriorate.

In consideration of the thermal stability and the low-melting point characteristic, the total content of $In_2O_3$, $Ta_2O_5$, $La_2O_3$, $MoO_3$, $WO_3$, $Li_2O$, $Na_2O$, $K_2O$, MgO, BaO, and $F_2$ is preferably 10% or less, particularly preferably 5% or less.

In addition to the above-mentioned components, other components (such as CaO and SrO) can be added, for example, up to 10%.

The SnO-containing glass powder is preferably substantially free of transition metal oxides. With this, the thermal stability can be easily enhanced. Herein, the phrase "substantially free of transition metal oxides" refers to a case where the content of transition metal oxides in the glass composition is less than 3,000 ppm (by mass), preferably less than 1,000 ppm (by mass) or less (the same applies in the following).

The SnO-containing glass powder is preferably substantially free of PbO from an environmental viewpoint. Herein, the phrase "substantially free of PbO" refers to a case where the content of PbO in the glass composition is less than 1,000 ppm (by mass) (the same applies in the following).

$Bi_2O_3$-containing glass powder is also preferably used as the glass powder. The $Bi_2O_3$-containing glass powder preferably comprises, as a glass composition expressed in mol % in terms of the following oxides, 20 to 60% of $Bi_2O_3$, 10 to 35% of $B_2O_3$, 5 to 40% of ZnO, and 5 to 30% of $CuO+Fe_2O_3$. The reasons why the range of the glass composition has been limited as described above are shown below. It should be noted that, in the following description of the range of the glass composition, the expression "%" refers to mol % unless otherwise specified.

$Bi_2O_3$ is a main component for lowering the softening point, and the content thereof is 20 to 60%, preferably 25 to 55%, more preferably 30 to 55%. When the content of $Bi_2O_3$ is less than 20%, the softening point becomes too high, and hence the glass is difficult to soften even if irradiated with laser light. On the other hand, when the content of $Bi_2O_3$ is more than 60%, the glass becomes thermally unstable, and hence the glass is liable to devitrify at the time of melting or laser sealing.

$B_2O_3$ is a component that forms a glass network of bismuth-based glass, and the content thereof is 10 to 35%, preferably 15 to 30%, more preferably 15 to 28%. When the content of $B_2O_3$ is less than 10%, the glass becomes thermally unstable, and hence the glass is liable to devitrify at the time of melting or laser sealing. On the other hand, when the content of $B_2O_3$ is more than 35%, the softening point becomes too high, and hence the glass is difficult to soften even if irradiated with laser light.

ZnO is a component that suppresses the denitrification at the time of melting or laser sealing and lowers the thermal expansion coefficient, and the content of ZnO is 5 to 40%, preferably 5 to 35%, more preferably 5 to 33%. When the content of ZnO is less than 5%, the above-mentioned effects are hardly obtained. On the other hand, when the content of ZnO is more than 40%, the balance of the components in the composition of the glass is impaired, and the glass is liable to devitrify to the worse.

$CuO+Fe_2O_3$ is a component that has light absorption properties and is a component that, when glass is irradiated with laser light having a predetermined center emission wavelength, absorbs the laser light and is likely to soften the glass. Further, $CuO+Fe_2O_3$ is a component that suppresses the devitrification at the time of melting or laser sealing. The content of $CuO+Fe_2O_3$ is 5 to 30%, preferably 7 to 25%, more preferably 10 to 20%. When the content of $CuO+Fe_2O_3$ is less than 5%, the light absorption properties deteriorate and the glass is difficult to soften even if irradiated with laser light. On the other hand, when the content of $CuO+Fe_2O_3$ is more than 30%, the balance of the components in the composition of the glass is impaired, and the glass is liable to devitrify to the worse.

CuO is a component that has light absorption properties, is a component that, when glass is irradiated with laser light having a predetermined center emission wavelength, absorbs the laser light and is likely to soften the glass, and is a component that suppresses the devitrification at the time of melting or laser sealing. The content of CuO is preferably 0 to 25%, 5 to 25%, 10 to 25%, particularly preferably 10 to 20%. When the content of CuO is more than 25%, the balance of the components in the composition of the glass is impaired, and the glass is liable to devitrify to the worse. It should be noted that, when the content of CuO is restricted to 5% or more, the light absorption properties improves and the glass is likely to soften at the time of laser sealing.

$Fe_2O_3$ is a component that has light absorption properties, is a component that, when glass is irradiated with laser light having a predetermined center emission wavelength, absorbs the laser light and is likely to soften the glass, and is a component that suppresses the denitrification at the time of melting or laser sealing. The content of $Fe_2O_3$ is preferably 0 to 10%, 0.1 to 10%, 0.2 to 10%, particularly preferably 0.5 to 10%. When the content of $Fe_2O_3$ is more than 10%, the balance of the components in the composition of the glass is impaired, and the glass is liable to denitrify to the worse. It should be noted that, when the content of $Fe_2O_3$ is restricted to 0.1% or more, the light absorption properties improves and the glass is likely to soften at the time of laser sealing.

An Fe ion in iron oxide is present in the state of $Fe^{2+}$ or $Fe^{3+}$. In the present invention, the Fe ion in iron oxide is not limited to any one of $Fe^{2+}$ and $Fe^{3+}$ and may be $Fe^{2+}$ or $Fe^{3+}$. Thus, in the present invention, even in the case of $Fe^{2+}$, the content of the iron oxide is expressed on the basis of a value obtained by conversion to $Fe_2O_3$. Particularly when infrared laser light is used as irradiation light, the ratio of $Fe^{2+}$ is preferably larger because $Fe^{2+}$ has an absorption peak in the infrared region. For example, the ratio of $Fe^{2+}/Fe^{3+}$ in iron oxide is preferably restricted to 0.03 or more (desirably 0.08 or more).

The following components may be added in addition to the above-mentioned components.

SiO$_2$ is a component that enhances the water resistance. The content of SiO$_2$ is preferably 0 to 10%, particularly preferably 0 to 3%. When the content of SiO$_2$ is more than 10%, the softening point becomes too high, and hence the glass is difficult to soften even if irradiated with laser light.

Al$_2$O$_3$ is a component that enhances the water resistance. The content of Al$_2$O$_3$ is preferably 0 to 5%, particularly preferably 0 to 2%. When the content of Al$_2$O$_3$ is more than 5%, the softening point becomes too high, and hence the glass is difficult to soften even if irradiated with laser light.

MgO+CaO+SrO+BaO (the total content of MgO, CaO, SrO, and BaO) is a component that suppresses the devitrification at the time of melting or laser sealing, and the content of MgO+CaO+SrO+BaO is preferably 0 to 20%, particularly preferably 0 to 15%. When the content of MgO+CaO+SrO+BaO is more than 20%, the softening point becomes too high, and hence the glass is difficult to soften even if irradiated with laser light.

MgO, CaO, and SrO are components that suppress the devitrification at the time of melting or laser sealing. The content of each of the components is preferably 0 to 5%, particularly preferably 0 to 2%. When the content of each of the components is more than 5%, the softening point becomes too high, and hence the glass is difficult to soften even if irradiated with laser light.

BaO is a component that suppresses the devitrification at the time of melting or laser sealing. The content of BaO is preferably 0 to 15%, particularly preferably 0 to 10%. When the content of BaO is more than 15%, the softening point becomes too high, and hence the glass is difficult to soften even if irradiated with laser light.

CeO$_2$ and Sb$_2$O$_3$ are components that suppress the devitrification at the time of melting or laser sealing. The content of each of the components is preferably 0 to 5%, 0 to 2%, particularly preferably 0 to 1%. When the content of each of the components is more than 5%, the balance of the components in the composition of the glass is impaired, and the glass is liable to devitrify to the worse. It should be noted that, from the viewpoint of enhancing the thermal stability, Sb$_2$O$_3$ is preferably added in a trace amount, and specifically, Sb$_2$O$_3$ is preferably added at 0.05% or more.

WO$_3$ is a component that suppresses the devitrification at the time of melting or laser sealing. The content of WO$_3$ is preferably 0 to 10%, particularly preferably 0 to 2%. When the content of WO$_3$ is more than 10%, the balance of the components in the composition of the glass is impaired, and the glass is liable to devitrify to the worse.

In$_2$O$_3$+Ga$_2$O$_3$ (the total content of In$_2$O$_3$ and Ga$_2$O$_3$) is a component that suppresses the devitrification at the time of melting or laser sealing. The content of In$_2$O$_3$+Ga$_2$O$_3$ is preferably 0 to 5%, particularly preferably 0 to 3%. When the content of In$_2$O$_3$+Ga$_2$O$_3$ is more than 5%, the batch cost soars. It should be noted that the content of In$_2$O$_3$ is more preferably 0 to 1% and the content of Ga$_2$O$_3$ is more preferably 0 to 0.5%.

Oxides of Li, Na, K, and Cs are components that lower the softening point, but have an action of accelerating the devitrification at the time of melting. Hence, the total content of the oxides is preferably restricted to less than 1%.

P$_2$O$_5$ is a component that suppresses the devitrification at the time of melting. However, when the content of P$_2$O$_5$ is more than 1%, the glass is liable to undergo phase separation at the time of melting.

La$_2$O$_3$, Y$_2$O$_3$, and Gd$_2$O$_3$ are components that suppress the phase separation at the time of melting. However, when the total content thereof is more than 3%, the softening point becomes too high, and hence the glass is difficult to soften even if irradiated with laser light.

NiO, V$_2$O$_5$, CoO, MoO$_3$, TiO$_2$, and MnO$_2$ are components that have light absorption properties and components that, when glass is irradiated with laser light having a predetermined center emission wavelength, absorb the laser light and are likely to soften the glass. The content of each of the components is preferably 0 to 7%, particularly preferably 0 to 3%. When the content of each of the components is more than 7%, the glass is liable to denitrify at the time of laser sealing.

PbO is a component that lowers the softening point but is a component that may adversely affect the environment. Thus, the content of PbO is preferably less than 0.1%.

Other components than those described above may be added up to, for example, 5% as long as the glass characteristics are not impaired.

The average particle diameter $D_{50}$ of the glass powder is preferably less than 15 μm, 0.5 to 10 μm, particularly preferably 1 to 5 μm. When the average particle diameter $D_{50}$ of the glass powder is restricted to less than 15 μm, the gap between both glass substrates can be easily made smaller. In this case, the time necessary for laser sealing is shortened, and even if the thermal expansion coefficient of a sealing material layer is different from each of the thermal expansion coefficients of the glass substrates, cracks and the like hardly occur in the sealed sites and the glass substrates.

The maximum particle diameter $D_{99}$ of the glass powder is preferably 15 μm or less, 10 μm or less, particularly preferably 7 μm or less. When the maximum particle diameter $D_{99}$ of the glass powder is restricted to 15 μm or less, the gap between both glass substrates can be easily made smaller. In this case, the time necessary for laser sealing is shortened, and even if the thermal expansion coefficient of a sealing material layer is different from each of the thermal expansion coefficients of the glass substrates, cracks and the like hardly occur in the sealed sites and the glass substrates.

A mixing ratio expressed in vol % between the glass powder and the refractory filler in the inorganic powder is preferably 65 to 90%:10% to 35%, particularly preferably 67 to 80%:20 to 33%. When the content of the refractory filler is more than 35 vol %, the softening fluidity of the sealing material is inhibited and the surface smoothness of the sealing material layer is liable to deteriorate, with the result that the efficiency of laser sealing is liable to deteriorate. It should be noted that, when the content of the refractory filler is less than 10 vol %, the above-mentioned effects by virtue of the refractory filler are hardly obtained.

The average particle diameter $D_{50}$ of the refractory filler is preferably 2 μm or less, 1.7 μm or less, particularly preferably 0.1 to 1.5 μm. When the average particle diameter $D_{50}$ of the refractory filler is too large, the thickness of the sealing material layer is liable to become larger locally, with the result that the gap between both glass substrates becomes uneven and the reliability of laser sealing is liable to deteriorate.

The maximum particle diameter $D_{99}$ of the refractory filler is preferably 5 μm or less, 4 μm or less, particularly preferably 0.2 to 3 μm. When the maximum particle diameter $D_{99}$ of the refractory filler is too large, the thickness of the sealing material layer is liable to become larger locally, with the result that the gap between both glass substrates becomes uneven and the reliability of laser sealing is liable to deteriorate.

As the refractory filler, there may be used zircon, zirconia, tin oxide, quartz, β-spodumene, cordierite, mullite, quartz glass, β-eucryptite, β-quartz, zirconium phosphate, zirconium phosphate tungstate, zirconium tungstate, a compound having a basic structure of [AB$_2$ (MO$_4$)$_3$] such as NbZr(PO$_4$)$_3$, where A represents Li, Na, K, Mg, Ca, Sr, Ba, Zn, Cu, Ni, Mn, or the like, B represents Zr, Ti, Sn, Nb, Al, Sc, Y, or the like, and M represents P, Si, W, Mo, or the like, and a solid solution thereof.

Among the refractory fillers described above, zirconium phosphate, cordierite, and zirconium phosphate tungstate are preferred. Those refractory fillers have the properties of a low thermal expansion coefficient and a high mechanical strength and are well compatible with SnO-containing glass powder or Bi$_2$O$_3$-containing glass powder.

In the above-mentioned sealing material, the content of the inorganic powder is preferably 97.5 to 100 mass %, 99.3 to 99.8 mass %, particularly preferably 99.4 to 99.7 mass %. When the content of the inorganic powder is too small, when laser sealing is performed, the softening fluidity of the sealing material layer lowers and the sealing strength is hardly enhanced. It should be noted that, when SnO-containing glass powder is used as the glass powder, it is preferred to add a pigment in addition to inorganic powder. In this case, when the content of the inorganic powder is too large, the content of the pigment is relatively smaller, and hence laser light is hardly converted to thermal energy.

When the pigment is added to the sealing material, the content of the pigment is preferably 0.2 to 2.5 mass %, 0.2 to 0.7 mass %, particularly preferably 0.3 to 0.6 mass %. When the content of the pigment is too small, laser light is hardly converted to thermal energy. On the other hand, when the content of the pigment is too large, the sealing material layer is excessively heated at the time of laser sealing, causing the acceleration of the thermal degradation of an element, the glass sealing is liable to denitrify, and the sealing strength is liable to deteriorate.

The average particle diameter D$_{50}$ of each of the primary particles of the pigment is preferably 1 to 100 nm, 3 to 70 nm, 5 to 60 nm, particularly preferably 10 to 50 nm. When the primary particles of the pigment are too small, the primary particles of the pigment are liable to aggregate with each other, and hence the primary particles of the pigment are hardly dispersed uniformly in a sealing material, with the result that the glass powder may not soften and flow locally at the time of laser sealing. Further, even when the primary particles of the pigment are too large, the primary particles of the pigment are hardly dispersed uniformly in a sealing material, with the result that the glass powder may not soften and flow locally at the time of laser sealing.

The pigment is preferably an inorganic pigment, more preferably one kind or two or more kinds selected from carbon, Co$_3$O$_4$, CuO, Cr$_2$O$_3$, Fe$_2$O$_3$, MnO$_2$, SnO, and Ti$_n$O$_{2n-1}$ (n represents an integer), particularly preferably carbon. Those pigments have excellent coloring property and absorb laser light well. It should be noted that, when Bi$_2$O$_3$-containing glass powder is used as the glass powder, the pigment is preferably an oxide-based pigment comprising one kind or two or more kinds selected from Cu, Cr, Fe, and Mn from the viewpoint of compatibility.

The carbon is preferably amorphous carbon or graphite. The carbon has such property that primary particles are easily processed so as to have an average particle diameter D$_{50}$ of 1 to 100 nm.

The pigment is preferably substantially free of Cr-based oxides from an environmental viewpoint. Herein, the phrase "substantially free of Cr-based oxides" refers to a case where the content of Cr-based oxides in the pigment is less than 1,000 ppm (by mass) (the same applies in the following).

The softening point of the sealing material is preferably 500° C. or less, 470° C. or less, 450° C. or less, 420° C. or less, particularly preferably 400° C. or less. When the softening point is more than 500° C., the laser sealing property is liable to deteriorate. The lower limit of the softening point is not particularly limited, but in consideration of the thermal stability of the glass powder, the softening point is preferably controlled to 300° C. or more.

The sealing material described above and a vehicle are preferably kneaded and processed into a sealing material paste. With this, application workability and the like can be enhanced. It should be noted that the vehicle generally comprises a resin binder and a solvent.

The resin binder is preferably an aliphatic polyolefin-based carbonate, particularly preferably polyethylene carbonate or polypropylene carbonate. Those resin binders are characterized by being less likely to alter the nature of glass powder, in particular, SnO-containing glass powder at the time of debinder treatment or laser sealing.

The solvent is preferably one kind or two or more kinds selected from N,N'-dimethylformamide, ethylene glycol, dimethylsulfoxide, dimethyl carbonate, propylene carbonate, butyrolactone, caprolactone, N-methyl-2-pyrrolidone, phenyl diglycol (PhDG), dibutyl phthalate (DBP), benzyl glycol (BzG), benzyl diglycol (BzDG), and phenyl glycol (PhG). Those solvents are characterized by being less likely to alter the nature of glass powder, in particular, SnO-containing glass powder at the time of debinder treatment or laser sealing. Of those solvents, one kind or two or more kinds selected from propylene carbonate, phenyl diglycol (PhDG), dibutyl phthalate (DBP), benzyl glycol (BzG), benzyl diglycol (BzDG), and phenyl glycol (PhG) are particularly preferred. Each of those solvents has a boiling point of 240° C. or more. Thus, when any of those solvents is used, the volatilization of the solvent can be easily suppressed in application work such as screen printing. As a result, a sealing material paste can be stably used for a long period of time. Further, phenyl diglycol (PhDG), dibutyl phthalate (DBP), benzyl glycol (BzG), benzyl diglycol (BzDG), and phenyl glycol (PhG) have high affinity to a pigment. Thus, even if any of those solvents is added in a small amount, it is possible to suppress such a situation that the pigment is separated in the sealing material paste.

In the case of using SnO-containing glass powder as the glass powder, the sealing material paste is subjected to preferably debinder treatment under an inert atmosphere, particularly preferably debinder treatment under an N$_2$ atmosphere. With this, such a situation that the nature of glass powder, in particular, SnO-containing glass powder is altered at the time of debinder treatment can be easily prevented.

The sealing material paste is subjected to preferably laser sealing under an inert atmosphere, particularly preferably laser sealing under an N$_2$ atmosphere. With this, such a situation that the nature of glass powder, in particular, SnO-containing glass powder is altered at the time of laser sealing can be easily prevented.

The surface roughness Ra of the sealing material layer is preferably less than 0.5 μm, 0.3 μm or less, 0.2 μm or less, particularly preferably 0.01 to 0.15 μm or less. With this, the adhesiveness between glass substrates improves and the laser sealing property remarkably improves.

The surface roughness RMS of the sealing material layer is preferably less than 0.1 μm, 0.7 μm or less, 0.5 μm or less, particularly preferably 0.05 to 0.3 μm or less. With this, the adhesiveness between glass substrates improves and the laser sealing property remarkably improves.

The average thickness of the sealing material layer is preferably less than 10 µm, less than 7 µm, 0.1 to 5.5 µm, particularly preferably 1 to less than 5 µm. With this, even if the thermal expansion coefficient of the sealing material layer is different from each of the thermal expansion coefficients of glass substrates, cracks and the like hardly occur in the glass substrates and the sealed sites. As a result, the content of the refractory filler can be reduced, and hence the softening fluidity of the sealing material improves, enabling the surface smoothness of the sealing material layer.

The thickness variation of the sealing material layer is preferably 2 µm or less, particularly preferably 1 µm or less. With this, the adhesiveness between glass substrates improves.

The surface smoothness of the sealing material layer may be enhanced by polishing the surface of the sealing material layer, but the surface of the sealing material layer is preferably unpolished. With this, no polishing step is required, and hence the production cost is likely to be reduced.

At present, an active matrix drive system, in which an active element such as a TFT is arranged at each pixel for driving, is adopted as a drive system in an OLED display. In this case, alkali-free glass (such as OA-10G manufactured by Nippon Electric Glass Co., Ltd.) is used for glass substrates for the OLED display. The thermal expansion coefficient of alkali-free glass is generally $40 \times 10^{-7}/°$ C. or less. In general, it is necessary to match the thermal expansion coefficient of a sealing material to the thermal expansion coefficient of a glass substrate. However, when the thickness of a sealing material layer is less than 10 µm, in particular, less than 5 µm, the amount of heat strain caused by the difference between both thermal expansion coefficients is smaller, and hence hermetical sealing can be well performed even if the thermal expansion coefficient of the sealing material is high to some extent. Further, when the thermal expansion coefficient of the sealing material is increased, the content of the refractory filler can be reduced, and hence the softening fluidity of the sealing material improves, enabling the surface smoothness of the sealing material layer. Thus, the thermal expansion coefficient of the sealing material is preferably $60 \times 10^{-7}/°$ C. or more and $85 \times 10^{-7}/°$ C. or less.

The glass substrate with a sealing material layer is preferably used for producing an OLED device.

Embodiment of Second Invention

A method of producing an electronic device according to an embodiment of the second invention comprises the steps of: (1) preparing a glass substrate; (2) mixing a sealing material comprising glass powder and a vehicle comprising an organic binder to manufacture a sealing material paste; (3) applying the sealing material paste onto the glass substrate to form a coating layer; (4) firing the coating layer to yield a glass substrate with a sealing material layer; (5) laminating, via the sealing material layer, the glass substrate with a sealing material layer and a glass substrate without a sealing material layer; and (6) irradiating the laminate with laser light so that a laser sealing temperature is equal to or lower than a firing temperature to hermetically seal the glass substrate with a sealing material layer and the glass substrate without a sealing material layer.

In the step (2), a mixing method using a kneading apparatus such as a roll mill, a beads mill, or a ball mill is preferably used as a method of mixing the sealing material and the vehicle from the viewpoint of homogeneity. Herein, the roll mill refers to a disintegration apparatus for aggregated particles typified by a triple roll mill and its application apparatus, and the beads mill refers to a medium agitation mill using driven beads as media. The ball mill includes not only a narrowly-defined ball mill, which functions to disintegrate aggregated particles by rolling ceramic balls or the like in a container, but also a vibrating ball mill and a medium planetary mill.

In the step (3), printing with a screen printing machine or application with a dispenser is preferably used as a method of applying the sealing material paste. With this, the coating layer can be formed efficiently.

In the step (4), the firing atmosphere is preferably an inert atmosphere, particularly preferably an $N_2$ atmosphere. With this, the nature of the glass powder, in particular, SnO—$P_2O_5$-based glass powder is hardly altered.

The firing temperature is preferably 460° C. or more, 470° C. or more, particularly preferably 480° C. or more. With this, gas contained in the sealing material itself is released before laser sealing, and hence the amount of released gas is smaller at the time of the laser sealing.

When the step of burning and removing the organic binder is separately carried out, it is preferred to fire the coating layer at a temperature that is higher than the glass transition point of the glass powder and is lower than the glass transition point of the sealing material. With this, the decomposition and volatilization of the organic binder can be promoted. The time for which the coating layer is retained at the temperature that is higher than the glass transition point of the glass powder and is lower than the glass transition point of the sealing material is preferably 1 minute or more, particularly preferably 5 minutes or more and preferably 2 hours or less, particularly preferably 1 hour or less. When the retention time is too short, the decomposition and volatilization of the organic binder may not be sufficient. On the other hand, when the retention time is too long, the production efficiency of the glass substrate with a sealing material layer deteriorates.

In this case, the step of burning and removing the organic binder and the step of firing the coating layer are preferably carried out continuously, and both the steps are more preferably carried out at the same time. With this, the production efficiency of the glass substrate with a sealing material layer improves.

In the step (6), the laser sealing temperature is set to a temperature that is equal to or lower than the firing temperature (preferably a temperature lower than the firing temperature by 10° C. or more, particularly preferably a temperature lower than the firing temperature by 20° C. or more). When laser light irradiation is performed under the temperature condition mentioned above, only the sites that should be sealed can be locally heated, and hence the thermal degradation of an element of an electronic device can be prevented and the long-term reliability of the electronic device can be enhanced.

Specifically, the laser sealing temperature is preferably 500° C. or less, 490° C. or less, 480° C. or less, 470° C. or less, particularly preferably 460° C. or less. With this, the amount of released gas decreases at the time of laser sealing.

Various lasers can be used for the laser sealing. Of those, a semiconductor laser, a YAG laser, a $CO_2$ laser, an excimer laser, an infrared laser, and the like are particularly preferred because they are easy to handle.

An atmosphere under which the laser sealing is performed is preferably an inert atmosphere, particularly preferably an $N_2$ atmosphere. With this, the nature of the glass powder, in particular, SnO—$P_2O_5$-based glass powder is hardly altered at the time of the laser sealing.

Next, suitable material formulations in the method of producing an electronic device according to this embodiment are described below.

The sealing material preferably comprises 97.5 to 100 mass % of inorganic powder comprising glass powder and 0 to 2.5 mass % of a pigment, and more preferably comprises 99 to 99.95 mass % of inorganic powder comprising glass powder and 0.05 to 1 mass % of a pigment. The content of the inorganic powder is particularly preferably 99.5 to 99.9 mass %. When the content of the inorganic powder is less than 97.5 mass %, the softening fluidity of the sealing material reduces at the time of laser sealing and the sealing strength is hardly enhanced. The content of the pigment is preferably 0.05 to 1 mass %, particularly preferably 0.1 to 0.5 mass %. When the content of the pigment is too small, laser light is hardly converted to thermal energy. On the other hand, when the content of the pigment is too large, the sealing material is excessively heated at the time of laser sealing, causing the acceleration of the thermal degradation of an OLED element or the like, and the sealing material excessively absorbs laser light, causing the temperature of the sealing material layer to rise improperly at the time of laser sealing, with the result that the amount of released gas may increase. Besides, the glass is liable to denitrify and the sealing strength is liable to deteriorate.

Any one of various glass systems can be used as the glass powder. Of those, $Bi_2O_3$—$B_2O_3$-based glass, $SnO$—$P_2O_5$-based glass, and $V_2O_5$-based glass are suitable from the viewpoints of thermal stability and water resistance. In particular, $SnO$—$P_2O_5$-based glass is suitable from the viewpoint of a low-melting point characteristic. $Bi_2O_3$—$B_2O_3$-based glass is suitable from the viewpoint of sealing strength. Herein, the term " . . . based glass" refers to glass comprising each component expressed explicitly in its name as an essential component, in which the total content thereof is 20 mol % or more.

The $SnO$—$P_2O_5$-based glass powder preferably comprises, as a glass composition expressed in mol % in terms of the following oxides, 35 to 70% of SnO and 10 to 30% of $P_2O_5$. The reasons why the range of the glass composition has been limited as described above are shown below. It should be noted that, in the description of the range of the glass composition, the expression "%" refers to "mol %" unless otherwise specified.

SnO is a component that lowers the melting point of glass. The content of SnO is preferably 35 to 70%, 40 to 70%, particularly preferably 50 to 68%. It should be noted that, when the content of SnO is 50% or more, the glass easily softens and flows at the time of laser sealing. When the content of SnO is less than 35%, the viscosity of the glass becomes too high and it becomes difficult to perform laser sealing with a desired laser element. On the other hand, when the content of SnO is more than 70%, the vitrification of the glass becomes difficult.

$P_2O_5$ is a glass-forming oxide and is a component that enhances the thermal stability. The content of $P_2O_5$ is preferably 10 to 30%, 15 to 27%, particularly preferably 15 to 25%. When the content of $P_2O_5$ is less than 10%, the thermal stability is liable to deteriorate. On the other hand, when the content of $P_2O_5$ is more than 30%, the climate resistance deteriorates, and hence it becomes difficult to ensure the long-term reliability of an OLED device or the like.

The following components can be added in addition to the above-mentioned components.

ZnO is an intermediate oxide and is a component that stabilizes glass. The content of ZnO is preferably 0 to 30%, 1 to 20%, particularly preferably 1 to 15%. When the content of ZnO is more than 30%, the thermal stability is liable to deteriorate.

$B_2O_3$ is a glass-forming oxide, is a component that stabilizes glass, and is a component that enhances the climate resistance. The content of $B_2O_3$ is preferably 0 to 25%, 1 to 20%, particularly preferably 2 to 15%. When the content of $B_2O_3$ is more than 20%, the viscosity of the glass becomes too high and it becomes difficult to perform laser sealing with a desired laser element.

$Al_2O_3$ is an intermediate oxide, is a component that stabilizes glass, and is a component that lowers the thermal expansion coefficient. The content of $Al_2O_3$ is preferably 0 to 10%, 0.1 to 10%, particularly preferably 0.5 to 5%. When the content of $Al_2O_3$ is more than 10%, the softening point of the glass powder improperly rises and it becomes difficult to perform laser sealing with a desired laser element.

$SiO_2$ is a glass-forming oxide and is a component that stabilizes glass. The content of $SiO_2$ is preferably 0 to 15%, particularly preferably 0 to 5%. When the content of $SiO_2$ is more than 15%, the softening point of the glass powder improperly rises and it becomes difficult to perform laser sealing with a desired laser element.

$In_2O_3$ is a component that enhances the thermal stability. The content of $In_2O_3$ is preferably 0 to 5%. When the content of $In_2O_3$ is more than 5%, batch cost soars.

$Ta_2O_5$ is a component that enhances the thermal stability. The content of $Ta_2O_5$ is preferably 0 to 5%. When the content of $Ta_2O_5$ is more than 5%, the softening point of the glass powder improperly rises and it becomes difficult to perform laser sealing with a desired laser element.

$La_2O_3$ is a component that enhances the thermal stability and is a component that enhances the climate resistance. The content of $La_2O_3$ is preferably 0 to 15%, 0 to 10%, particularly preferably 0 to 5%. When the content of $La_2O_3$ is more than 15%, batch cost soars.

$MoO_3$ is a component that enhances the thermal stability. The content of $MoO_3$ is preferably 0 to 5%. When the content of $MoO_3$ is more than 5%, the softening point of the glass powder improperly rises and it becomes difficult to perform laser sealing with a desired laser element.

$WO_3$ is a component that enhances the thermal stability. The content of $WO_3$ is preferably 0 to 5%. When the content of $WO_3$ is more than 5%, the softening point of the glass powder improperly rises and it becomes difficult to perform laser sealing with a desired laser element.

$Li_2O$ is a component that lowers the melting point of glass. The content of $Li_2O$ is preferably 0 to 5%. When the content of $Li_2O$ is more than 5%, the thermal stability is liable to deteriorate. $Na_2O$ is a component that lowers the melting point of glass. The content of $Na_2O$ is preferably 0 to 10%, particularly preferably 0 to 5%. When the content of $Na_2O$ is more than 10%, the thermal stability is liable to deteriorate. $K_2O$ is a component that lowers the melting point of glass. The content of $K_2O$ is preferably 0 to 5%. When the content of $K_2O$ is more than 5%, the thermal stability is liable to deteriorate.

MgO is a component that enhances the thermal stability. The content of MgO is preferably 0 to 15%. When the content of MgO is more than 15%, the softening point of the glass powder improperly rises and it becomes difficult to perform laser sealing with a desired laser element.

BaO is a component that enhances the thermal stability. The content of BaO is preferably 0 to 10%. When the content of BaO is more than 10%, the balance of the components in the composition of the glass is impaired, and the glass is liable to denitrify to the worse.

$F_2$ is a component that lowers the melting point of glass. The content of $F_2$ is preferably 0 to 5%. When the content of $F_2$ is more than 5%, the thermal stability is liable to deteriorate.

In consideration of the thermal stability and the low-melting point characteristic, the total content of $In_2O_3$, $Ta_2O_5$, $La_2O_3$, $MoO_3$, $WO_3$, $Li_2O$, $Na_2O$, $K_2O$, $MgO$, $BaO$, and $F_2$ is preferably 10% or less.

In addition to the above-mentioned components, other components (such as CaO and SrO) can be added, for example, up to 10%.

The $SnO$—$P_2O_5$-based glass powder is preferably substantially free of transition metal oxides. With this, it is possible to prevent such a situation that glass excessively absorbs laser light, causing the temperature of the sealing material layer to rise improperly at the time of laser sealing, with the result that the amount of released gas increases, and the thermal stability of the glass is difficult to deteriorate.

A $Bi_2O_3$—$B_2O_3$-based glass powder is also preferably used as the glass powder. The $Bi_2O_3$—$B_2O_3$-based glass powder preferably comprises, as a glass composition expressed in mol % in terms of the following oxides, 20 to 60% of $Bi_2O_3$, 10 to 35% of $B_2O_3$, 5 to 40% of ZnO, and 5 to 30% of $CuO+Fe_2O_3$. The reasons why the range of the glass composition has been limited as described above are shown below. It should be noted that, in the following description of the range of each glass composition, the expression "%" refers to mol % unless otherwise specified.

$Bi_2O_3$ is a main component for lowering the softening point, and the content thereof is 20 to 60%, preferably 25 to 55%, more preferably 30 to 55%. When the content of $Bi_2O_3$ is less than 20%, the softening point becomes too high, and hence the glass is difficult to soften even if irradiated with laser light. On the other hand, when the content of $Bi_2O_3$ is more than 60%, the glass becomes thermally unstable, and hence the glass is liable to devitrify at the time of melting or laser sealing.

$B_2O_3$ is a component that forms a glass network of bismuth-based glass, and the content thereof is 10 to 35%, preferably 15 to 30%, more preferably 15 to 28%. When the content of $B_2O_3$ is less than 10%, the glass becomes thermally unstable, and hence the glass is liable to devitrify at the time of melting or laser sealing. On the other hand, when the content of $B_2O_3$ is more than 35%, the softening point becomes too high, and hence the glass is difficult to soften even if irradiated with laser light.

ZnO is a component that suppresses the denitrification at the time of melting or laser sealing and lowers the thermal expansion coefficient, and the content of ZnO is 5 to 40%, preferably 5 to 35%, more preferably 5 to 33%. When the content of ZnO is less than 5%, the above-mentioned effects are hardly obtained. On the other hand, when the content of ZnO is more than 40%, the balance of the components in the composition of the glass is impaired, and the glass is liable to devitrify to the worse.

$CuO+Fe_2O_3$ is a component that has light absorption properties and is a component that, when glass is irradiated with laser light having a predetermined center emission wavelength, absorbs the laser light and is likely to soften the glass. Further, $CuO+Fe_2O_3$ is a component that suppresses the devitrification at the time of melting or laser sealing. The content of $CuO+Fe_2O_3$ is 5 to 30%, preferably 7 to 25%, more preferably 10 to 20%. When the content of $CuO+Fe_2O_3$ is less than 5%, the light absorption properties deteriorate and the glass is difficult to soften even if irradiated with laser light. On the other hand, when the content of $CuO+Fe_2O_3$ is more than 30%, the balance of the components in the composition of the glass is impaired, and the glass is liable to devitrify to the worse.

CuO is a component that has light absorption properties, is a component that, when glass is irradiated with laser light having a predetermined center emission wavelength, absorbs the laser light and is likely to soften the glass, and is a component that suppresses the devitrification at the time of melting or laser sealing. The content of CuO is preferably 0 to 25%, 5 to 25%, 10 to 25%, particularly preferably 10 to 20%. When the content of CuO is more than 25%, the balance of the components in the composition of the glass is impaired, and the glass is liable to devitrify to the worse. It should be noted that, when the content of CuO is restricted to 5% or more, the light absorption properties improves and the glass is likely to soften at the time of laser sealing.

$Fe_2O_3$ is a component that has light absorption properties, is a component that, when glass is irradiated with laser light having a predetermined center emission wavelength, absorbs the laser light and is likely to soften the glass, and is a component that suppresses the denitrification at the time of melting or laser sealing. The content of $Fe_2O_3$ is preferably 0 to 10%, 0.1 to 10%, 0.2 to 10%, particularly preferably 0.5 to 10%. When the content of $Fe_2O_3$ is more than 10%, the balance of the components in the composition of the glass is impaired, and the glass is liable to denitrify to the worse. It should be noted that, when the content of $Fe_2O_3$ is restricted to 0.1% or more, the light absorption properties improves and the glass is likely to soften at the time of laser sealing.

An Fe ion in iron oxide is present in the state of $Fe^{2+}$ or $Fe^{3+}$. The Fe ion in iron oxide is not limited to any one of $Fe^{2+}$ and $Fe^{3+}$ and may be $Fe^{2+}$ or $Fe^{3+}$. Thus, even in the case of $Fe^{2+}$, the content of the iron oxide is expressed on the basis of a value obtained by conversion to $Fe_2O_3$. Particularly when infrared laser light is used as irradiation light, the ratio of $Fe^{2+}$ is preferably larger because $Fe^{2+}$ has an absorption peak in the infrared region. For example, the ratio of $Fe^{2+}/Fe^{3+}$ in iron oxide is preferably restricted to 0.03 or more (desirably 0.08 or more).

The following components may be added in addition to the above-mentioned components.

$SiO_2$ is a component that enhances the water resistance. The content of $SiO_2$ is preferably 0 to 10%, particularly preferably 0 to 3%. When the content of $SiO_2$ is more than 10%, the softening point becomes too high, and hence the glass is difficult to soften even if irradiated with laser light.

$Al_2O_3$ is a component that enhances the water resistance. The content of $Al_2O_3$ is preferably 0 to 5%, particularly preferably 0 to 2%. When the content of $Al_2O_3$ is more than 5%, the softening point becomes too high, and hence the glass is difficult to soften even if irradiated with laser light.

$MgO+CaO+SrO+BaO$ (the total content of MgO, CaO, SrO, and BaO) is a component that suppresses the devitrification at the time of melting or laser sealing, and the content of $MgO+CaO+SrO+BaO$ is preferably 0 to 20%, particularly preferably 0 to 15%. When the content of $MgO+CaO+SrO+BaO$ is more than 20%, the softening point becomes too high, and hence the glass is difficult to soften even if irradiated with laser light.

MgO, CaO, and SrO are components that suppress the devitrification at the time of melting or laser sealing. The content of each of the components is preferably 0 to 5%, particularly preferably 0 to 2%. When the content of each of the components is more than 5%, the softening point becomes too high, and hence the glass is difficult to soften even if irradiated with laser light.

BaO is a component that suppresses the devitrification at the time of melting or laser sealing. The content of BaO is preferably 0 to 15%, particularly preferably 0 to 10%. When the content of BaO is more than 15%, the softening point becomes too high, and hence the glass is difficult to soften even if irradiated with laser light.

$CeO_2$ and $Sb_2O_3$ are components that suppress the devitrification at the time of melting or laser sealing. The content of each of the components is preferably 0 to 5%, 0 to 2%, particularly preferably 0 to 1%. When the content of each of the components is more than 5%, the balance of the components in the composition of the glass is impaired, and the glass is liable to devitrify to the worse. It should be noted that, from the viewpoint of enhancing the thermal stability, $Sb_2O_3$ is preferably added in a trace amount, and specifically, $Sb_2O_3$ is preferably added at 0.05% or more.

$WO_3$ is a component that suppresses the devitrification at the time of melting or laser sealing. The content of $WO_3$ is preferably 0 to 10%, particularly preferably 0 to 2%. When the content of $WO_3$ is more than 10%, the balance of the components in the composition of the glass is impaired, and the glass is liable to devitrify to the worse.

$In_2O_3+Ga_2O_3$ (the total content of $In_2O_3$ and $Ga_2O_3$) is a component that suppresses the devitrification at the time of melting or laser sealing. The content of $In_2O_3+Ga_2O_3$ is preferably 0 to 5%, particularly preferably 0 to 3%. When the content of $In_2O_3+Ga_2O_3$ is more than 5%, the batch cost soars. It should be noted that the content of $In_2O_3$ is more preferably 0 to 1% and the content of $Ga_2O_3$ is more preferably 0 to 0.5%.

Oxides of Li, Na, K, and Cs are components that lower the softening point, but have an action of accelerating the devitrification at the time of melting. Hence, the total content of the oxides is preferably restricted to less than 1%.

$P_2O_5$ is a component that suppresses the devitrification at the time of melting. However, when the content of $P_2O_5$ is more than 1%, the glass is liable to undergo phase separation at the time of melting.

$La_2O_3$, $Y_2O_3$, and $Gd_2O_3$ are components that suppress the phase separation at the time of melting. However, when the total content thereof is more than 3%, the softening point becomes too high, and hence the glass is difficult to soften even if irradiated with laser light.

NiO, $V_2O_5$, CoO, $MoO_3$, $TiO_2$, and $MnO_2$ are components that have light absorption properties and components that, when glass is irradiated with laser light having a predetermined center emission wavelength, absorb the laser light and are likely to soften the glass. The content of each of the components is preferably 0 to 7%, particularly preferably 0 to 3%. When the content of each of the components is more than 7%, the glass is liable to denitrify at the time of laser sealing.

PbO is a component that lowers the softening point but is a component that may adversely affect the environment. Thus, the content of PbO is preferably less than 0.1%.

Other components than those described above may be added up to, for example, 5% as long as the glass characteristics are not impaired.

The glass powder is preferably substantially free of PbO from an environmental viewpoint.

The average particle diameter $D_{50}$ of the glass powder is preferably less than 15 μm, 0.5 to 10 μm, particularly preferably 1 to 5 μm. When the average particle diameter $D_{50}$ of the glass powder is restricted to less than 15 μm, the gap between both glass substrates can be easily made smaller. In this case, the time necessary for laser sealing is shortened, and even if the thermal expansion coefficient of a sealing material is different from each of the thermal expansion coefficients of the glass substrates, cracks and the like hardly occur at the interface between each of the glass substrates and a sealing material layer.

The maximum particle diameter $D_{99}$ of the glass powder is preferably 30 μm or less, 20 μm or less, particularly preferably 10 μm or less. When the maximum particle diameter $D_{99}$ of the glass powder is restricted to 30 μm or less, the gap between both glass substrates can be easily made smaller. In this case, the time necessary for laser sealing is shortened, and even if the thermal expansion coefficient of a sealing material is different from each of the thermal expansion coefficients of the glass substrates, cracks and the like hardly occur at the interface between each of the glass substrates and a sealing material layer.

The inorganic powder preferably further comprises a refractory filler. With this, the thermal expansion coefficient of the sealing material can be lowered and the mechanical strength of the sealing material can be enhanced. A mixing ratio expressed in vol % of the glass powder and the refractory filler in the inorganic powder is preferably 40 to 100%:0% to 60%, 40 to 99.9%:0.1 to 60%, 45 to 90%:10 to 55%, 50 to 80%:20 to 50%, 50 to 70%:30 to 50%, particularly preferably 50 to 65%:35 to 50%. When the content of the refractory filler is more than 60 vol %, the ratio of the glass powder relatively reduces, with the result that the efficiency of laser sealing is liable to deteriorate. It should be noted that, when the content of the refractory filler is less than 0.1 vol %, the above-mentioned effects by virtue of the refractory filler are hardly obtained.

As the refractory filler, there may be used zircon, zirconia, tin oxide, quartz, β-spodumene, cordierite, mullite, quartz glass, β-eucryptite, β-quartz, zirconium phosphate, zirconium phosphate tungstate, zirconium tungstate, a compound having a basic structure of $[AB_2(MO_4)_3]$ such as $NbZr(PO_4)_3$, where A represents Li, Na, K, Mg, Ca, Sr, Ba, Zn, Cu, Ni, Mn, or the like, B represents Zr, Ti, Sn, Nb, Al, Sc, Y, or the like, and M represents P, Si, W, Mo, or the like, and a solid solution thereof.

The maximum particle diameter $D_{99}$ of the refractory filler is preferably 20 μm or less, 15 μm or less, particularly preferably 10 μm or less. When the maximum particle diameter $D_{99}$ of the refractory filler is more than 20 μm, some parts of sealed sites are liable to have a thickness of 30 μm or more, and hence the gap between glass substrates becomes non-uniform in an OLED display, with the result that it becomes difficult to reduce the thickness of the OLED display. Further, when the maximum particle diameter $D_{99}$ of the refractory filler is controlled to 20 μm or less, the gap between both glass substrates can be easily narrowed. In this case, the time necessary for laser sealing is shortened, and even if the thermal expansion coefficient of a sealing material is different from each of the thermal expansion coefficients of the glass substrates, cracks and the like hardly occur at the interface between each of the glass substrates and a sealing material layer.

The pigment to be added to the sealing material is preferably an inorganic pigment, more preferably one kind or two or more kinds selected from carbon, $Co_3O_4$, CuO, $Cr_2O_3$, $Fe_2O_3$, $MnO_2$, SnO, $Ti_nO_{2n-1}$ (where n represents an integer), and a spinel-type composite oxide, particularly preferably carbon. Those pigments are excellent in coloring property and are good in laser-light absorbing property. Further, when a $Bi_2O_3$—$B_2O_3$-based glass powder is used as the glass powder, the pigment is preferably an oxide-based pigment comprising one kind or two or more kinds selected from Cu, Cr, Fe, and Mn from the viewpoint of compatibility.

Any one of various materials can be used as the carbon, and amorphous carbon or graphite is particularly preferred. The carbon has such property that primary particles are easily processed so as to have an average particle diameter $D_{50}$ of 1 to 100 nm. It should be noted that, when the glass powder comprises SnO in its glass composition, if carbon is added as the pigment, it is possible to expect an effect of suppressing the oxidation of SnO at the time of firing.

The pigment is preferably substantially free of Cr-based oxides from an environmental viewpoint.

The average particle diameter ($D_{50}$) of each of the primary particles of the pigment is preferably 1 to 100 nm, 3 to 70 nm, 5 to 60 nm, particularly preferably 10 to 50 nm. When the primary particles of the pigment are too small, the primary particles of the pigment are liable to aggregate with each other, and hence the primary particles of the pigment are hardly dispersed uniformly in a sealing material, with the result that the glass powder may not soften and flow locally at the time of laser sealing. Further, even when the primary particles of the pigment are too large, the primary particles of the pigment are hardly dispersed uniformly in a sealing material, with the result that the glass powder may not soften and flow locally at the time of laser sealing.

The softening point of the sealing material is preferably 500° C. or less, 460° C. or less, 450° C. or less, 420° C. or less, particularly preferably 400° C. or less. When the softening point is more than 500° C., the efficiency of laser sealing is liable to lower. The lower limit of the softening point is not particularly limited, but in consideration the thermal stability, the softening point is preferably controlled to 300° C. or more.

At present, an active matrix drive system, in which an active element such as a TFT is arranged at each pixel for driving, is adopted as a drive system in an OLED display. In this case, alkali-free glass (such as OA-10G manufactured by Nippon Electric Glass Co., Ltd.) is used for glass substrates. The thermal expansion coefficient of alkali-free glass is generally $40 \times 10^{-7}$/° C. or less. On the other hand, the thermal expansion coefficient of a sealing material is 76 to $90 \times 10^{-7}$/° C. in many cases. Hence, in order to prevent stress fracture in the sealed sites, it is necessary to match the thermal expansion coefficient of the sealing material strictly to the thermal expansion coefficient of the alkali-free glass. Thus, the thermal expansion coefficient of the sealing material can be significantly reduced by adding a low-expansion refractory filler, in particular, $NbZr(PO_4)_3$, zirconium phosphate, or cordierite to the sealing material. Accordingly, the sealing material has a thermal expansion coefficient of preferably $85 \times 10^{-7}$/° C. or less, $75 \times 10^{-7}$/° C. or less, $65 \times 10^{-7}$/° C. or less, $55 \times 10^{-7}$/° C. or less, particularly preferably $49 \times 10^{-7}$/° C. or less. With this, a residual stress reduces, which facilitates the prevention of the stress fracture in the sealed sites.

In addition to the glass powder, the refractory filler, and the pigment, glass beads or the like may be added as a spacer in the sealing material.

The sealing material paste comprises a sealing material and a vehicle. Further, the vehicle generally comprises a resin binder and a solvent. A surfactant, a thickener, or the like may be added in the vehicle as required.

The organic binder is preferably an aliphatic polyolefin-based carbonate, particularly preferably polyethylene carbonate or polypropylene carbonate. Those resin binders are characterized by being less likely to alter the nature of glass powder, in particular, $SnO-P_2O_5$-based glass powder at the time of burning and removing the organic binder.

The sealing material paste preferably comprises, as the solvent, one kind or two or more kinds selected from N,N'-dimethylformamide, ethylene glycol, dimethylsulfoxide, dimethyl carbonate, propylene carbonate, butyrolactone, caprolactone, N-methyl-2-pyrrolidone, phenyl diglycol (PhDG), dibutyl phthalate (DBP), benzyl glycol (BzG), benzyl diglycol (BzDEG), and phenyl glycol (PhG). Those solvents are characterized by being less likely to alter the nature of glass powder. Of those solvents, one kind or two or more kinds selected from propylene carbonate, phenyl diglycol (PhDG), dibutyl phthalate (DBP), benzyl glycol (BzG), benzyl diglycol (BzDEG), and phenyl glycol (PhG) are particularly preferred. Each of those solvents has a boiling point of 240° C. or more. Thus, when any of those solvents is used, the volatilization of the solvent can be easily suppressed when the sealing material paste is applied with a screen printing machine or the like. As a result, the sealing material paste can be stably used for a long period of time. Further, phenyl diglycol (PhDG), dibutyl phthalate (DBP), benzyl glycol (BzG), benzyl diglycol (BzDG), and phenyl glycol (PhG) have high affinity to a pigment. Thus, even if any of those solvents is added in a small amount, it is possible to suppress such a situation that the pigment is separated in the sealing material paste.

Embodiment of First Related Invention

A method of producing a glass substrate with a sealing material layer according to an embodiment of the first related invention comprises the steps of: (1) preparing a glass substrate; (2) applying a first sealing material paste onto the glass substrate, followed by forming a first sealing material film; (3) applying a second sealing material paste onto the first sealing material film, followed by forming a second sealing material film; and (4) firing the resultant laminated film to form a sealing material layer on the glass substrate.

The first sealing material paste comprises first glass powder and comprises, as required, a vehicle, a refractory filler, and a pigment. Further, the second sealing material paste comprises second glass powder and comprises, as required, a vehicle, a refractory filler, and a pigment. The suitable formulations of those components are as mentioned below. It should be noted that the vehicle generally comprises a resin binder and a solvent.

The average particle diameter $D_{50}$ of the second glass powder is smaller than the average particle diameter $D_{50}$ of the first glass powder. When the average particle diameter $D_{50}$ of the second glass powder is equal to or larger than the average particle diameter $D_{50}$ of the first glass powder, the surface smoothness of the sealing material layer is impaired, with the result that the sealing material layer and an object to be sealed are hardly closely bonded uniformly and the laser sealing property is liable to deteriorate.

The maximum particle diameter $D_{99}$ of the second glass powder is smaller than the maximum particle diameter $D_{99}$ of the first glass powder. When the maximum particle diameter $D_{99}$ of the second glass powder is equal to or larger than the maximum particle diameter $D_{99}$ of the first glass powder, the surface smoothness of the sealing material layer is impaired, with the result that the sealing material layer and an object to be sealed are hardly closely bonded uniformly and the laser sealing property is liable to deteriorate.

The average particle diameter $D_{50}$ of the second glass powder is preferably 0.1 to 2.0 µm, particularly preferably 0.3 to 1.7 µm. When the average particle diameter $D_{50}$ of the second glass powder is too small, glass is liable to denitrify at the time of firing and the sealing material may be inhibited from softening and flowing. Besides, particles of the glass powder are liable to aggregate at the time of pulverization and classification, the resultant aggregates remain in the second sealing material paste after kneading, and the aggregates may cause clogging of screen meshes at the time of screen printing. On the other hand, when the average particle diameter $D_{50}$ of the second glass powder is too large, irregularities of the second sealing material film are too large at the time of screen printing, with the result that the surface smoothness of the sealing material layer is liable to deteriorate, and the sealing material is difficult to soften and flow at the time of firing, and hence the firing temperature needs to be increased. In this case, the thermal damage of an object to be sealed is liable to be significant, which may be one reason for cost increase. It should be noted that the average particle diameter $D_{50}$ of the second glass powder is preferably as large as possible for the purpose of providing a suitable coating thickness per screen printing, but when the thickness of the second sealing material film (wet film) is more than 3.0 µm, the second sealing material film has large waviness as a whole, and hence the adhesiveness between the sealing material layer and an object to be sealed is liable to deteriorate.

The average particle diameter $D_{50}$ of the first glass powder is preferably 1.0 to 3.5 µm, particularly preferably 1.0 to 2.5 µm. When the average particle diameter $D_{50}$ of the first glass powder is too small, it is necessary to further reduce the particle size of the second glass powder to a smaller one, glass is liable to denitrify at the time of firing, and the sealing material may be inhibited from softening and flowing. Besides, particles of the glass powder are liable to aggregate at the time of pulverization and classification, the resultant aggregates remain in the first sealing material paste after kneading, and the aggregates may cause clogging of screen meshes at the time of screen printing. On the other hand, when the average particle diameter $D_{50}$ of the first glass powder is too large, the sealing material is difficult to soften and flow at the time of firing, and hence the firing temperature needs to be increased. In this case, the thermal damage of an object to be sealed is liable to be significant, which may be one reason for cost increase.

The maximum particle diameter $D_{99}$ of the second glass powder is preferably 0.5 to 6.1 µm, particularly preferably 1.0 to 3.5 µm. When the maximum particle diameter $D_{99}$ of the second glass powder is too small, glass is liable to denitrify at the time of firing and the sealing material may be inhibited from softening and flowing. Besides, particles of the glass powder are liable to aggregate at the time of pulverization and classification, the resultant aggregates remain in the second sealing material paste after kneading, and the aggregates may cause clogging of screen meshes at the time of screen printing. When the maximum particle diameter $D_{99}$ of the second glass powder is too large, irregularities of the second sealing material film are too large at the time of screen printing, with the result that the surface smoothness of the sealing material layer is liable to deteriorate, and the sealing material is difficult to soften and flow at the time of firing, and hence the firing temperature needs to be increased. In this case, the thermal damage of an object to be sealed is liable to be significant, which may be one reason for cost increase.

The maximum particle diameter $D_{99}$ of the first glass powder is preferably 3.0 to 15.0 µm, particularly preferably 4.0 to 10.0 µm. When the maximum particle diameter $D_{99}$ of the second glass powder is too small, it is necessary to further reduce the particle size of the second glass powder to a smaller one, glass is liable to denitrify at the time of firing, and the sealing material may be inhibited from softening and flowing. Besides, particles of the glass powder are liable to aggregate at the time of pulverization and classification, the resultant aggregates remain in the second sealing material paste after kneading, and the aggregates may cause clogging of screen meshes at the time of screen printing. On the other hand, when the maximum particle diameter $D_{99}$ of the first glass powder is too large, the sealing material is difficult to soften and flow at the time of firing, and hence the firing temperature needs to be increased. In this case, the thermal damage of an object to be sealed is liable to be significant, which may be one reason for cost increase.

The glass powder (first glass powder or second glass powder) is preferably SnO-containing glass powder and preferably comprises, as a glass composition expressed in mol % in terms of the following oxides, 35 to 70% of SnO and 10 to 30% of $P_2O_5$. The reasons why the range of the glass composition has been limited as described above are shown below. It should be noted that, in the description of the range of the glass composition, the expression "%" refers to mol % unless otherwise specified.

SnO is a component that reduces the melting point of glass. The content of SnO is preferably 35 to 70%, 40 to 70%, particularly preferably 50 to 68%. It should be noted that, when the content of SnO is 50% or more, the glass easily softens and flows at the time of laser sealing. It should be noted that, when the content of SnO is less than 35%, the viscosity of the glass becomes too high and it becomes difficult to perform laser sealing with a desired laser power. On the other hand, when the content of SnO is more than 70%, the vitrification of the glass becomes difficult.

$P_2O_5$ is a glass-forming oxide and is a component that enhances the thermal stability of glass. The content of $P_2O_5$ is preferably 10 to 30%, 15 to 27%, particularly preferably 15 to 25%. When the content of $P_2O_5$ is less than 10%, the thermal stability is liable to deteriorate. On the other hand, when the content of $P_2O_5$ is more than 30%, the climate resistance deteriorates, and hence it becomes difficult to ensure the long-term reliability of an OLED device or the like.

The following components can be added in addition to the above-mentioned components.

ZnO is an intermediate oxide and is a component that stabilizes glass. The content of ZnO is preferably 0 to 30%, 1 to 20%, particularly preferably 1 to 15%. When the content of ZnO is more than 30%, the thermal stability is liable to deteriorate.

$B_2O_3$ is a glass-forming oxide and is a component that stabilizes glass. Further, $B_2O_3$ is a component that enhances the climate resistance. The content of $B_2O_3$ is preferably 0 to 20%, 1 to 20%, particularly preferably 2 to 15%. When the content of $B_2O_3$ is more than 20%, the viscosity of the glass becomes too high and it becomes difficult to perform laser sealing with a desired laser element.

$Al_2O_3$ is an intermediate oxide and is a component that stabilizes glass. Besides, $Al_2O_3$ is a component that lowers the thermal expansion coefficient. The content of $Al_2O_3$ is preferably 0 to 10%, 0.1 to 10%, particularly preferably 0.5 to 5%. When the content of $Al_2O_3$ is more than 10%, the softening point of the glass powder improperly rises and it becomes difficult to perform laser sealing with a desired laser element.

$SiO_2$ is a glass-forming oxide and is a component that stabilizes glass. The content of $SiO_2$ is preferably 0 to 15%, particularly preferably 0 to 5%. When the content of $SiO_2$ is more than 15%, the softening point of the glass powder improperly rises and it becomes difficult to perform laser sealing with a desired laser element.

$In_2O_3$ is a component that enhances the thermal stability and the content of $In_2O_3$ is preferably 0 to 5%. When the content of $In_2O_3$ is more than 5%, batch cost soars.

$Ta_2O_5$ is a component that enhances the thermal stability and the content of $Ta_2O_5$ is preferably 0 to 5%. When the content of $Ta_2O_5$ is more than 5%, the softening point of the glass powder improperly rises and it becomes difficult to perform laser sealing with a desired laser element.

$La_2O_3$ is a component that enhances the thermal stability and is a component that enhances the climate resistance. The content of $La_2O_3$ is preferably 0 to 15%, 0 to 10%, particularly preferably 0 to 5%. When the content of $La_2O_3$ is more than 15%, batch cost soars.

$MoO_3$ is a component that enhances the thermal stability and the content of $MoO_3$ is preferably 0 to 5%. When the content of $MoO_3$ is more than 5%, the softening point of the glass powder improperly rises and it becomes difficult to perform laser sealing with a desired laser element.

$WO_3$ is a component that enhances the thermal stability and the content of $WO_3$ is preferably 0 to 5%. When the content of $WO_3$ is more than 5%, the softening point of glass powder improperly rises and it becomes difficult to perform laser sealing with a desired laser element.

$Li_2O$ is a component that lowers the melting point of glass and the content of $Li_2O$ is preferably 0 to 5%. When the content of $Li_2O$ is more than 5%, the thermal stability is liable to deteriorate.

$Na_2O$ is a component that lowers the melting point of glass and the content of $Na_2O$ is preferably 0 to 10%, particularly preferably 0 to 5%. When the content of $Na_2O$ is more than 10%, the thermal stability is liable to deteriorate.

$K_2O$ is a component that lowers the melting point of glass and the content of $K_2O$ is preferably 0 to 5%. When the content of $K_2O$ is more than 5%, the thermal stability is liable to deteriorate.

MgO is a component that enhances the thermal stability and the content of MgO is preferably 0 to 15%. When the content of MgO is more than 15%, the softening point of the glass powder improperly rises and it becomes difficult to perform laser sealing with a desired laser element.

BaO is a component that enhances the thermal stability and the content of BaO is preferably 0 to 10%. When the content of BaO is more than 10%, the balance of the components in the composition of the glass is impaired, and the glass is liable to denitrify to the worse.

$F_2$ is a component that lowers the melting point of glass and the content of $F_2$ is preferably 0 to 5%. When the content of $F_2$ is more than 5%, the thermal stability is liable to deteriorate.

In consideration of the thermal stability and the low-melting point characteristic, the total content of $In_2O_3$, $Ta_2O_5$, $La_2O_3$, $MoO_3$, $WO_3$, $Li_2O$, $Na_2O$, $K_2O$, MgO, BaO, and $F_2$ is preferably 10% or less, particularly preferably 5% or less.

In addition to the above-mentioned components, other components (such as CaO and SrO) can be added, for example, up to 10%.

The SnO-containing glass powder is preferably substantially free of transition metal oxides in its glass composition. With this, the thermal stability can be easily enhanced.

$Bi_2O_3$-containing glass powder is also preferably used as the glass powder (first glass powder or second glass powder). The $Bi_2O_3$-containing glass powder preferably comprises, as a glass composition expressed in mol % in terms of the following oxides, 20 to 60% of $Bi_2O_3$, 10 to 35% of $B_2O_3$, 5 to 40% of ZnO, and 5 to 30% of $CuO+Fe_2O_3$. The reasons why the range of the glass composition has been limited as described above are shown below. It should be noted that, in the following description of the range of the glass composition, the expression "%" refers to mol % unless otherwise specified.

$Bi_2O_3$ is a main component for lowering the softening point, and the content thereof is 20 to 60%, preferably 25 to 55%, more preferably 30 to 55%. When the content of $Bi_2O_3$ is less than 20%, the softening point becomes too high, and hence the glass is difficult to soften even if irradiated with laser light. On the other hand, when the content of $Bi_2O_3$ is more than 60%, the glass becomes thermally unstable, and hence the glass is liable to denitrify at the time of melting or laser sealing.

$B_2O_3$ is a component that forms a glass network of bismuth-based glass, and the content thereof is 10 to 35%, preferably 15 to 30%, more preferably 15 to 28%. When the content of $B_2O_3$ is less than 10%, the glass becomes thermally unstable, and hence the glass is liable to devitrify at the time of melting or laser sealing. On the other hand, when the content of $B_2O_3$ is more than 35%, the softening point becomes too high, and hence the glass is difficult to soften even if irradiated with laser light.

ZnO is a component that suppresses the devitrification at the time of melting or laser sealing and lowers the thermal expansion coefficient, and the content of ZnO is 5 to 40%, preferably 5 to 35%, more preferably 5 to 33%. When the content of ZnO is less than 5%, the above-mentioned effects are hardly obtained. On the other hand, when the content of ZnO is more than 40%, the balance of the components in the composition of the glass is impaired, and the glass is liable to devitrify to the worse.

$CuO+Fe_2O_3$ is a component that has light absorption properties and is a component that, when glass is irradiated with laser light having a predetermined center emission wavelength, absorbs the laser light and is likely to soften the glass. Further, $CuO+Fe_2O_3$ is a component that suppresses the devitrification at the time of melting or laser sealing. The content of $CuO+Fe_2O_3$ is 5 to 30%, preferably 7 to 25%, more preferably 10 to 20%. When the content of $CuO+Fe_2O_3$ is less than 5%, the light absorption properties deteriorate and the glass is difficult to soften even if irradiated with laser light. On the other hand, when the content of $CuO+Fe_2O_3$ is more than 30%, the balance of the components in the composition of the glass is impaired, and the glass is liable to devitrify to the worse.

CuO is a component that has light absorption properties, is a component that, when glass is irradiated with laser light having a predetermined center emission wavelength, absorbs the laser light and is likely to soften the glass, and is a component that suppresses the devitrification at the time of melting or laser sealing. The content of CuO is preferably 0 to 25%, 5 to 25%, 10 to 25%, particularly preferably 10 to 20%. When the content of CuO is more than 25%, the balance of the components in the composition of the glass is impaired, and the glass is liable to devitrify to the worse. It should be noted that, when the content of CuO is restricted to 5% or more, the light absorption properties improves and the glass is likely to soften at the time of laser sealing.

$Fe_2O_3$ is a component that has light absorption properties, is a component that, when glass is irradiated with laser light having a predetermined center emission wavelength, absorbs the laser light and is likely to soften the glass, and is a component that suppresses the devitrification at the time of melting or laser sealing. The content of $Fe_2O_3$ is preferably 0 to 10%, 0.1 to 10%, 0.2 to 10%, particularly preferably 0.5 to 10%. When the content of $Fe_2O_3$ is more than 10%, the balance of the components in the composition of the glass is impaired, and the glass is liable to devitrify to the worse. It should be noted that, when the content of $Fe_2O_3$ is restricted to 0.1% or more, the light absorption properties improves and the glass is likely to soften at the time of laser sealing.

An Fe ion in the glass is present in the state of $Fe^{2+}$ or $Fe^{3+}$. The Fe ion in the glass is not limited to any one of $Fe^{2+}$ and $Fe^{3+}$ and may be $Fe^{2+}$ or $Fe^{3+}$. Thus, even in the case of $Fe^{2+}$, the content of the iron oxide is expressed on the basis of a value obtained by conversion to $Fe_2O_3$. Particularly when infrared laser light is used as irradiation light, the ratio of $Fe^{2+}$ is preferably larger because $Fe^{2+}$ has an absorption peak in the infrared region. For example, the ratio of $Fe^{2+}/Fe^{3+}$ in the glass is preferably restricted to 0.03 or more (desirably 0.08 or more).

The following components may be added in addition to the above-mentioned components.

$SiO_2$ is a component that enhances the water resistance. The content of $SiO_2$ is preferably 0 to 10%, particularly preferably 0 to 3%. When the content of $SiO_2$ is more than 10%, the softening point becomes too high, and hence the glass is difficult to soften even if irradiated with laser light.

$Al_2O_3$ is a component that enhances the water resistance. The content of $Al_2O_3$ is preferably 0 to 5%, particularly preferably 0 to 2%. When the content of $Al_2O_3$ is more than 5%, the softening point becomes too high, and hence the glass is difficult to soften even if irradiated with laser light.

MgO+CaO+SrO+BaO (the total content of MgO, CaO, SrO, and BaO) is a component that suppresses the devitrification at the time of melting or laser sealing, and the content of MgO+CaO+SrO+BaO is preferably 0 to 20%, particularly preferably 0 to 15%. When the content of MgO+CaO+SrO+BaO is more than 20%, the softening point becomes too high, and hence the glass is difficult to soften even if irradiated with laser light.

MgO, CaO, and SrO are components that suppress the devitrification at the time of melting or laser sealing. The content of each of the components is preferably 0 to 5%, particularly preferably 0 to 2%. When the content of each of the components is more than 5%, the softening point becomes too high, and hence the glass is difficult to soften even if irradiated with laser light.

BaO is a component that suppresses the devitrification at the time of melting or laser sealing. The content of BaO is preferably 0 to 15%, particularly preferably 0 to 10%. When the content of BaO is more than 15%, the softening point becomes too high, and hence the glass is difficult to soften even if irradiated with laser light.

$CeO_2$ and $Sb_2O_3$ are components that suppress the devitrification at the time of melting or laser sealing. The content of each of the components is preferably 0 to 5%, 0 to 2%, particularly preferably 0 to 1%. When the content of each of the components is more than 5%, the balance of the components in the composition of the glass is impaired, and the glass is liable to denitrify to the worse. It should be noted that, from the viewpoint of enhancing the thermal stability, $Sb_2O_3$ is preferably added in a trace amount, and specifically, $Sb_2O_3$ is preferably added at 0.05% or more.

$WO_3$ is a component that suppresses the devitrification at the time of melting or laser sealing. The content of $WO_3$ is preferably 0 to 10%, particularly preferably 0 to 2%. When the content of $WO_3$ is more than 10%, the balance of the components in the composition of the glass is impaired, and the glass is liable to denitrify to the worse.

$In_2O_3+Ga_2O_3$ (the total content of $In_2O_3$ and $Ga_2O_3$) is a component that suppresses the devitrification at the time of melting or laser sealing. The content of $In_2O_3+Ga_2O_3$ is preferably 0 to 5%, particularly preferably 0 to 3%. When the content of $In_2O_3+Ga_2O_3$ is more than 5%, the batch cost soars. It should be noted that the content of $In_2O_3$ is more preferably 0 to 1% and the content of $Ga_2O_3$ is more preferably 0 to 0.5%.

Oxides of Li, Na, K, and Cs are components that lower the softening point, but have an action of accelerating the devitrification at the time of melting. Hence, the total content of the oxides is preferably restricted to less than 1%.

$P_2O_5$ is a component that suppresses the devitrification at the time of melting. However, when the content of $P_2O_5$ is more than 1%, the glass is liable to undergo phase separation at the time of melting.

$La_2O_3$, $Y_2O_3$, and $Gd_2O_3$ are components that suppress the phase separation at the time of melting. However, when the total content thereof is more than 3%, the softening point becomes too high, and hence the glass is difficult to soften even if irradiated with laser light.

NiO, $V_2O_5$, CoO, $MoO_3$, $TiO_2$, and $MnO_2$ are components that have light absorption properties and components that, when glass is irradiated with laser light having a predetermined center emission wavelength, absorb the laser light and are likely to soften the glass. The content of each of the components is preferably 0 to 7%, particularly preferably 0 to 3%. When the content of each of the components is more than 7%, the glass is liable to denitrify at the time of laser sealing.

PbO is a component that lowers the softening point but is a component that may adversely affect the environment. Thus, the content of PbO is preferably less than 0.1%.

Other components than those described above may be added up to, for example, 5% as long as the glass characteristics are not impaired.

The glass powder (first glass powder or second glass powder) is preferably substantially free of PbO in its glass composition from an environmental viewpoint.

The glass composition of the first glass powder is preferably almost the same as the glass composition of the second glass powder. With this, the affinity between the first sealing material film and the second sealing material film is enhanced, and hence the mechanical strength of the sealing material layer is improved. Further, the first sealing material paste preferably has almost the same material formulation except the particle size of the glass powder as the second sealing material paste. With this, the affinity between the first sealing material film and the second sealing material film is further enhanced. It should be noted that, when the paste viscosity of the first sealing material paste needs to be matched to that of the second sealing material paste, a mixing ratio between the sealing material and the vehicle is preferably adjusted.

The sealing material paste (first sealing material paste or second sealing material paste) preferably further comprises a refractory filler. With this, the mechanical strength of the sealing material layer easily improves and the thermal expansion coefficient of the sealing material layer easily lowers.

The average particle diameter $D_{50}$ of the refractory filler is preferably 0.5 to 2.0 µm, particularly preferably 0.5 to 1.8 µm. When the average particle diameter $D_{50}$ of the refractory filler is too small, the refractory filler easily melts into glass at the time of firing, with the result that the sealing material may be inhibited from softening and flowing. Besides, particles of the refractory filler are liable to aggregate at the time of pulverization and classification, the resultant aggregates remain in the sealing material paste after kneading, and the aggregates may cause clogging of screen meshes at the time of screen printing. On the other hand, when the average particle diameter $D_{50}$ of the refractory filler is too large, irregularities of the laminated film (in particular, the second sealing material film) are too large at the time of screen printing, with the result that the surface smoothness of the sealing material layer is liable to deteriorate.

As the refractory filler, there may be used zircon, zirconia, tin oxide, quartz, β-spodumene, cordierite, mullite, quartz glass, β-eucryptite, β-quartz, zirconium phosphate, zirconium phosphate tungstate, zirconium tungstate, a compound having a basic structure of $[AB_2(MO_4)_3]$ such as $NbZr(PO_4)_3$, where A represents Li, Na, K, Mg, Ca, Sr, Ba, Zn, Cu, Ni, Mn, or the like, B represents Zr, Ti, Sn, Nb, Al, Sc, Y, or the like, and M represents P, Si, W, Mo, or the like, and a solid solution thereof.

The sealing material paste (first sealing material paste or second sealing material paste) preferably further comprises a pigment. With this, the sealing material layer is likely to absorb laser light.

The pigment is preferably an inorganic pigment, more preferably one kind or two or more kinds selected from carbon, $Co_3O_4$, CuO, $Cr_2O_3$, $Fe_2O_3$, $MnO_2$, SnO, $Ti_nO_{2n-1}$ (where n represents an integer), and a spinel-based composite oxide, particularly preferably carbon. Those pigments are excellent in coloring property and are good in laser-light absorbing property. The carbon is amorphous carbon or graphite. The carbon has such property that their primary particles are likely to be processed so as to have an average particle diameter $D_{50}$ of 1 to 100 nm. It should be noted that, when $Bi_2O_3$-containing glass powder is used, the pigment is preferably an oxide-based pigment comprising one kind or two or more kinds selected from Cu, Cr, Fe, and Mn from the viewpoint of compatibility.

The average particle diameter $D_{50}$ of the primary particles of the pigment is preferably 1 to 100 nm, 3 to 70 nm, 5 to 60 nm, particularly preferably 10 to 50 nm. When average particle diameter $D_{50}$ of each of the primary particles of the pigment is too small, the primary particles of the pigment are liable to aggregate with each other, and hence the primary particles of the pigment are hardly dispersed uniformly, with the result that the sealing material layer may not soften and flow locally at the time of laser sealing. Further, even when average particle diameter $D_{50}$ of each of the primary particles of the pigment is too large, the primary particles of the pigment are hardly dispersed uniformly, with the result that the sealing material may not soften and flow locally at the time of laser sealing.

The content of the pigment in the sealing material is preferably 0.05 to 1 mass %, particularly preferably 0.1 to 0.5 mass-%. When the content of the pigment is too small, laser light is hardly converted to thermal energy. On the other hand, when the content of the pigment is too large, the sealing material layer is difficult to soften and flow at the time of laser sealing and it is difficult to enhance the sealing strength.

The pigment is preferably substantially free of Cr-based oxides from an environmental viewpoint.

The softening point of the sealing material is preferably 460° C. or less, 450° C. or less, 420° C. or less, particularly preferably 400° C. or less. When the softening point is too high, the laser sealing property is liable to deteriorate. The lower limit of the softening point is not particularly limited, but in consideration of the thermal stability of glass powder, in particular, the softening point is preferably 300° C. or more.

The sealing material and a vehicle are preferably kneaded and processed into a sealing material paste. With this, application workability and the like can be enhanced.

The resin binder is preferably an aliphatic polyolefin-based carbonate, particularly preferably polyethylene carbonate or polypropylene carbonate. Those resin binders are characterized by being less likely to alter the nature of glass powder, in particular, SnO-containing glass powder at the time of debinder treatment or laser sealing.

The solvent is preferably one kind or two or more kinds selected from N,N'-dimethylformamide, ethylene glycol, dimethylsulfoxide, dimethyl carbonate, propylene carbonate, butyrolactone, caprolactone, N-methyl-2-pyrrolidone, phenyl diglycol (PhDG), dibutyl phthalate (DBP), benzyl glycol (BzG), benzyl diglycol (BzDG), and phenyl glycol (PhG). Those solvents are characterized by being less likely to alter the nature of glass powder, in particular, SnO-containing glass powder at the time of debinder treatment or laser sealing. Of those solvents, one kind or two or more kinds selected from propylene carbonate, phenyl diglycol (PhDG), dibutyl phthalate (DBP), benzyl glycol (BzG), benzyl diglycol (BzDG), and phenyl glycol (PhG) are particularly preferred. Each of those solvents has a boiling point of 240° C. or more. Thus, when any of those solvents is used, the volatilization of the solvent can be easily suppressed in application work such as screen printing. As a result, the sealing material paste can be stably used for a long period of time. Further, phenyl diglycol (PhDG), dibutyl phthalate (DBP), benzyl glycol (BzG), benzyl diglycol (BzDG), and phenyl glycol (PhG) have high affinity to a pigment. Thus, even if any of those solvents is added in a small amount, it is possible to suppress such a situation that the pigment is separated in the sealing material paste.

As mentioned above, propylene carbonate, phenyl diglycol (PhDG), dibutyl phthalate (DBP), benzyl glycol (BzG), benzyl diglycol (BzDG), and phenyl glycol (PhG) have an effect of suppressing the volatilization of a solvent, thereby enhancing the long-term stability of the sealing material paste.

The sealing material film (first sealing material film or second material film) is subjected to preferably debinder treatment in an inert atmosphere, particularly preferably debinder treatment in an $N_2$ atmosphere. With this, such a situation that the nature of glass powder, in particular, SnO-containing glass powder is altered at the time of debinder treatment can be easily prevented.

The sealing material layer is preferably formed along the outer peripheral edges of an object to be sealed, and when a glass substrate is used as the object to be sealed, the sealing material layer is preferably formed along the outer peripheral edges of the glass substrate so as to have a frame shape. With this, a region in which elements can be housed becomes larger.

The surface roughness Ra of the sealing material layer is preferably 0.6 μm or less, 0.5 μm or less, particularly preferably 0.4 μm or less. With this, the adhesiveness between the sealing material layer and an object to be sealed improves, and hence the laser sealing property improves and a strong sealing strength is likely to be ensured after laser sealing.

The surface roughness RMS of the sealing material layer is preferably 1.0 μm or less, 0.8 μm or less, particularly preferably 0.7 μm or less. With this, the adhesiveness between the sealing material layer and an object to be sealed improves, and hence the laser sealing property improves and a strong sealing strength is likely to be ensured after laser sealing.

Next a method of producing an electronic device with the glass substrate with a sealing material layer as mentioned above is described.

Figure 2A:
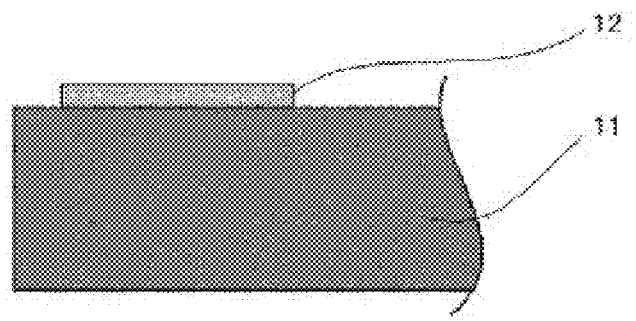
FIG. 2A is a schematic cross-sectional view for illustrating one example of a method of producing a glass substrate with a sealing material layer, the view illustrating a state obtained by applying a first sealing material paste onto a glass substrate and then forming a first sealing material film.
Figure 2B:
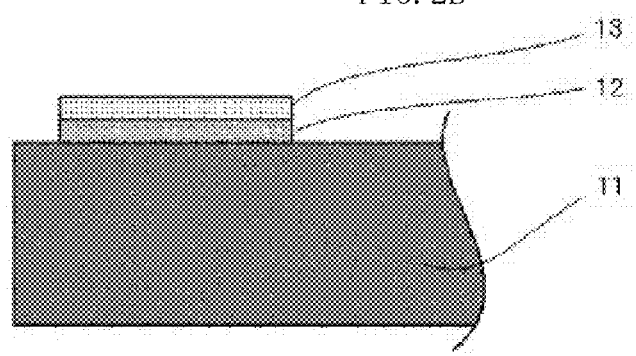
FIG. 2B is a schematic cross-sectional view for illustrating one example of the method of producing a glass substrate with a sealing material layer, the view illustrating a state obtained by applying a second sealing material paste onto the first sealing material film and then forming a second sealing material film.
Figure 2C:
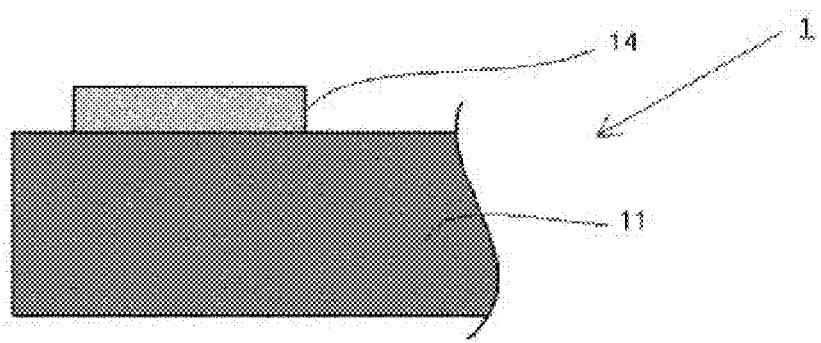
FIG. 2C is a schematic cross-sectional view for illustrating one example of the method of producing a glass substrate with a sealing material layer, the view illustrating a state obtained by firing the resultant laminated film to form a sealing material layer on the glass substrate.
Figure 2D:
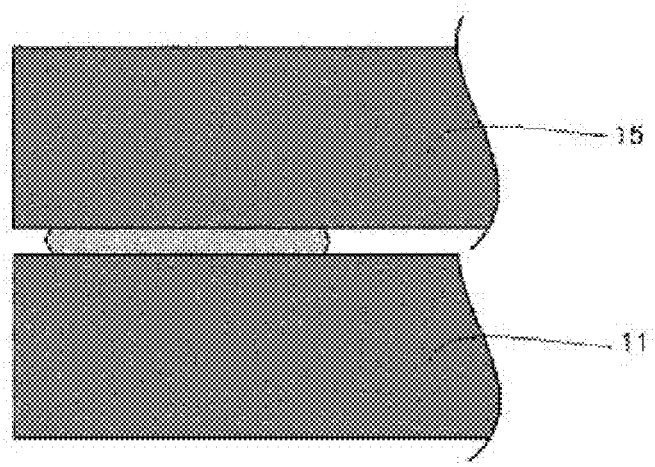
FIG. 2D is a schematic cross-sectional view for illustrating one example of the method of producing a glass substrate with a sealing material layer, the view illustrating a state obtained by arranging a glass substrate without a sealing material layer on the resultant glass substrate with a sealing material layer so as to be brought into contact with each other and then manufacturing an electronic device by laser sealing.

First, as illustrated in FIG. 2A, a first sealing material paste is applied onto a glass substrate 11 on which no element is formed to form a first sealing material film 12. In this case, the first sealing material paste is applied along the outer peripheral edges of the glass substrate 11 so as to have a frame shape. Next, as illustrated in FIG. 2B, a second sealing material paste is applied onto the first sealing material film 12 to form a second sealing material film 13. In this case, the second sealing material paste is applied along the first sealing material film 12 so as to have a frame shape. Further, the application width of the first sealing material paste is almost the same as that of the second sealing material paste, and the average particle diameter $D_{50}$ of the second glass powder in the second sealing material film 13 is smaller than the average particle diameter $D_{50}$ of the first glass powder in the first sealing material film 12. Next, as illustrated in FIG. 2C, the resultant laminated film is fired to form a sealing material layer 14 on the glass substrate 11. The sealing material layer 14 is firmly bonded to the glass substrate 11. Further, the surface of the sealing material layer 14 is smooth. Finally, as illustrated in FIG. 2D, a glass substrate 15 on which elements are formed but a sealing material layer is not formed is arranged on a glass substrate 1 with a sealing material layer so as to brought into contact with each other, followed by laser sealing, thereby manufacturing an electronic device. In this case, the electronic device is irradiated with laser light from the side of the glass substrate 11 along the sealing material layer 14, thereby hermetically sealing the glass substrate 1 and the glass substrate 15. With this, the thermal degradation of the elements in the electronic device is prevented and the long-term stability of the electronic device improves.

The laser sealing is preferably performed under an inert atmosphere and is particularly preferably performed under an $N_2$ atmosphere. With this, such a situation that the nature of glass powder, in particular, SnO-containing glass powder is altered at the time of laser sealing can be easily prevented.

Embodiment of Second Related Invention

A method of producing a glass substrate with a sealing material layer according to an embodiment of the second related invention comprises the steps of: (1) preparing a glass substrate; (2) applying a first sealing material paste onto the glass substrate, followed by forming a first sealing material film; (3) applying a second sealing material paste onto the first sealing material film, followed by forming a second sealing material film; and (4) firing the resultant laminated film to forma sealing material layer on the glass substrate.

The first sealing material paste comprises first glass powder and comprises, as required, a vehicle, a refractory filler, and a pigment. Further, the second sealing material paste comprises second glass powder and comprises, as required, a vehicle, a refractory filler, and a pigment. The suitable formulations of those components are as mentioned below. It should be noted that the vehicle generally comprises a resin binder and a solvent.

The softening point of the second glass powder is lower than the softening point of the first glass powder. The softening point of the second glass powder is preferably lower by 5 to 50° C. than the softening point of the first glass powder, and the softening point of the second glass powder is more preferably lower by 10 to 30° C. than the softening point of the first glass powder. When the softening point of the second glass powder is equal to or higher than the softening point of the first glass powder, the surface smoothness of the sealing material layer is impaired, with the result that the sealing material layer and an object to be sealed are hardly closely bonded uniformly and the laser sealing property is liable to deteriorate. It should be noted that, when the softening point of the second glass powder is too low as compared to the softening point of the first glass powder, the behavior of the first sealing material paste is different from that of the second sealing material paste and the surface smoothness of the sealing material layer may deteriorate to the worse.

The softening point of the second glass powder is preferably 440° C. or less, 425° C. or less, 410° C. or less, 400° C. or less, 390° C. or less, particularly preferably 350 to 380° C. With this, the surface smoothness of the sealing material layer is likely to improve. It should be noted that, when the softening point of the second glass powder is too low, glass is liable to denitrify at the time of firing, and in this case, the surface smoothness of the sealing material layer may deteriorate to the worse. Besides, the softening point of the first glass powder is preferably 450° C. or less, 435° C. or less, 410° C. or less, 400° C. or less, particularly preferably 360 to 390° C. With this, the laser sealing property is easily enhanced. It should be noted that, when the softening point of the first glass powder is too low, glass is liable to devitrify at the time of firing, and the sealing material layer is difficult to soften and flow at the time of laser sealing.

The value of (the density of second glass powder–the density of first glass powder) is preferably 0.01 to 0.50 g/cm$^3$, particularly preferably 0.05 to 0.40 g/cm$^3$. With this, the affinity between the first sealing material film and the second sealing material film is enhanced, and hence the mechanical strength of the sealing material layer is likely to improve.

The value of (the thermal expansion coefficient of second glass powder–the thermal expansion coefficient of first glass powder) is preferably $0.5 \times 10^{-7}$ to $10 \times 10^{-7}$/° C., particularly preferably $1 \times 10^{-7}$ to $7 \times 10^{-7}$/° C. With this, the softening point of the second glass powder lowers, and such a situation that an improper stress remains in the sealing material layer is likely to be prevented.

In the sealing material paste (first sealing material paste or second sealing material paste), the average particle diameter $D_{50}$ of the glass powder is preferably 0.5 to 3.0 µm, particularly preferably 1.0 to 2.5 µm. When the average particle diameter $D_{50}$ of the glass powder is too small, glass is liable to devitrify at the time of firing and the sealing material may be inhibited from softening and flowing. Besides, particles of the glass powder are liable to aggregate at the time of pulverization and classification, the resultant aggregates remain in the sealing material paste after kneading, and the aggregates may cause clogging of screen meshes at the time of screen printing. On the other hand, when the average particle diameter $D_{50}$ of the glass powder is too large, irregularities of the sealing material film (wet film) are too large at the time of screen printing, with the result that the surface smoothness of the sealing material layer is liable to deteriorate and the sealing material is difficult to soften and flow at the time of firing, and hence the firing temperature needs to be increased. In this case, the thermal damage of an object to be sealed is liable to be significant, which may be one reason for cost increase.

In the sealing material paste (first sealing material paste or second sealing material paste), the 90% particle diameter $D_{90}$ of the glass powder is preferably 7.0 µm or less, particularly preferably 5.0 µm or less. With this, the gap between both glass substrates can be easily made smaller. In this case, the time necessary for laser sealing is shortened, and even if each of the glass substrates and the sealing material are different in their thermal expansion coefficients, cracks and the like hardly occur in the glass substrates and the sealed sites.

In the sealing material paste (first sealing material paste or second sealing material paste), the maximum particle diameter $D_{99}$ of the glass powder is preferably 15 µm or less, particularly preferably 10 µm or less. With this, the gap between both glass substrates can be easily made smaller. In this case, the time necessary for laser sealing is shortened, and even if each of the glass substrates and the sealing material are different in their thermal expansion coefficients, cracks and the like hardly occur in the glass substrates and the sealed sites.

The glass powder (first glass powder or second glass powder) is preferably SnO-containing glass powder and preferably comprises, as a glass composition expressed in mol % in terms of the following oxides, 35 to 70% of SnO and 10 to 30% of $P_2O_5$. The reasons why the range of the glass composition has been limited as described above are shown below. It should be noted that, in the description of the range of the glass composition, the expression "%" refers to mol % unless otherwise specified.

SnO is a component that reduces the melting point of glass. The content of SnO is preferably 35 to 70%, 40 to 70%, particularly preferably 50 to 68%. It should be noted that, when the content of SnO is 50% or more, the glass easily softens and flows at the time of laser sealing. It should be noted that, when the content of SnO is less than 35%, the viscosity of the glass becomes too high and it becomes difficult to perform laser sealing with a desired laser power. On the other hand, when the content of SnO is more than 70%, the vitrification of the glass becomes difficult.

$P_2O_5$ is a glass-forming oxide and is a component that enhances the thermal stability of glass. The content of $P_2O_5$ is preferably 10 to 30%, 15 to 27%, particularly preferably 15 to 25%. When the content of $P_2O_5$ is less than 10%, the thermal stability is liable to deteriorate. On the other hand, when the content of $P_2O_5$ is more than 30%, the climate resistance deteriorates, and hence it becomes difficult to ensure the long-term reliability of an OLED device or the like.

The following components can be added in addition to the above-mentioned components.

ZnO is an intermediate oxide and is a component that stabilizes glass. The content of ZnO is preferably 0 to 30%, 1 to 20%, particularly preferably 1 to 15%. When the content of ZnO is more than 30%, the thermal stability is liable to deteriorate.

$B_2O_3$ is a glass-forming oxide and is a component that stabilizes glass. Further, $B_2O_3$ is a component that enhances the climate resistance. The content of $B_2O_3$ is preferably 0 to 25%, 1 to 20%, particularly preferably 2 to 15%. When the content of $B_2O_3$ is more than 20%, the viscosity of the glass becomes too high and it becomes difficult to perform laser sealing with a desired laser element.

$Al_2O_3$ is an intermediate oxide and is a component that stabilizes glass. Besides, $Al_2O_3$ is a component that lowers the thermal expansion coefficient. The content of $Al_2O_3$ is preferably 0 to 10%, 0.1 to 10%, particularly preferably 0.5 to 5%. When the content of $Al_2O_3$ is more than 10%, the softening point of the glass powder improperly rises and it becomes difficult to perform laser sealing with a desired laser element.

$SiO_2$ is a glass-forming oxide and is a component that stabilizes glass. The content of $SiO_2$ is preferably 0 to 15%, particularly preferably 0 to 5%. When the content of $SiO_2$ is more than 15%, the softening point of the glass powder improperly rises and it becomes difficult to perform laser sealing with a desired laser element.

$In_2O_3$ is a component that enhances the thermal stability and the content of $In_2O_3$ is preferably 0 to 5%. When the content of $In_2O_3$ is more than 5%, batch cost soars.

$Ta_2O_5$ is a component that enhances the thermal stability and the content of $Ta_2O_5$ is preferably 0 to 5%. When the content of $Ta_2O_5$ is more than 5%, the softening point of the glass powder improperly rises and it becomes difficult to perform laser sealing with a desired laser element.

$La_2O_3$ is a component that enhances the thermal stability and is a component that enhances the climate resistance. The content of $La_2O_3$ is preferably 0 to 15%, 0 to 10%, particularly preferably 0 to 5%. When the content of $La_2O_3$ is more than 15%, batch cost soars.

$MoO_3$ is a component that enhances the thermal stability and the content of $MoO_3$ is preferably 0 to 5%. When the content of $MoO_3$ is more than 5%, the softening point of the glass powder improperly rises and it becomes difficult to perform laser sealing with a desired laser element.

$WO_3$ is a component that enhances the thermal stability and the content of $WO_3$ is preferably 0 to 5%. When the content of $WO_3$ is more than 5%, the softening point of glass powder improperly rises and it becomes difficult to perform laser sealing with a desired laser element.

$Li_2O$ is a component that lowers the melting point of glass and the content of $Li_2O$ is preferably 0 to 5%. When the content of $Li_2O$ is more than 5%, the thermal stability is liable to deteriorate.

$Na_2O$ is a component that lowers the melting point of glass and the content of $Na_2O$ is preferably 0 to 10%, particularly preferably 0 to 5%. When the content of $Na_2O$ is more than 10%, the thermal stability is liable to deteriorate.

$K_2O$ is a component that lowers the melting point of glass and the content of $K_2O$ is preferably 0 to 5%. When the content of $K_2O$ is more than 5%, the thermal stability is liable to deteriorate.

MgO is a component that enhances the thermal stability and the content of MgO is preferably 0 to 15%. When the content of MgO is more than 15%, the softening point of glass powder improperly rises and it becomes difficult to perform laser sealing with a desired laser element.

BaO is a component that enhances the thermal stability and the content of BaO is preferably 0 to 10%. When the content of BaO is more than 10%, the balance of the components in the composition of the glass is impaired, and the glass is liable to denitrify to the worse.

$F_2$ is a component that lowers the melting point of glass and the content of $F_2$ is preferably 0 to 5%. When the content of $F_2$ is more than 5%, the thermal stability is liable to deteriorate.

In consideration of the thermal stability and the low-melting point characteristic, the total content of $In_2O_3$, $Ta_2O_5$, $La_2O_3$, $MoO_3$, $WO_3$, $Li_2O$, $Na_2O$, $K_2O$, MgO, BaO, and $F_2$ is preferably 10% or less, particularly preferably 5% or less.

In addition to the above-mentioned components, other components (such as CaO and SrO) can be added, for example, up to 10%.

The SnO-containing glass powder is preferably substantially free of transition metal oxides in its glass composition. With this, the thermal stability can be easily enhanced.

A $Bi_2O_3$—$B_2O_3$-based glass powder is also preferably used as the glass powder (first glass powder or second glass powder). The $Bi_2O_3$—$B_2O_3$-based glass powder preferably comprises, as a glass composition expressed in mol % in terms of the following oxides, 20 to 60% of $Bi_2O_3$, 10 to 35% of $B_2O_3$, 5 to 40% of ZnO, and 5 to 30% of CuO+$Fe_2O_3$. The reasons why the range of the glass composition has been limited as described above are shown below. It should be noted that, in the following description of the range of the glass composition, the expression "%" refers to mol % unless otherwise specified.

$Bi_2O_3$ is a main component for lowering the softening point, and the content thereof is 20 to 60%, preferably 25 to 55%, more preferably 30 to 55%. When the content of $Bi_2O_3$ is less than 20%, the softening point becomes too high, and hence the glass is difficult to soften even if irradiated with laser light. On the other hand, when the content of $Bi_2O_3$ is more than 60%, the glass becomes thermally unstable, and hence the glass is liable to devitrify at the time of melting or laser sealing.

$B_2O_3$ is a component that forms a glass network of bismuth-based glass, and the content thereof is 10 to 35%, preferably 15 to 30%, more preferably 15 to 28%. When the content of $B_2O_3$ is less than 10%, the glass becomes thermally unstable, and hence the glass is liable to devitrify at the time of melting or laser sealing. On the other hand, when the content of $B_2O_3$ is more than 35%, the softening point becomes too high, and hence the glass is difficult to soften even if irradiated with laser light.

ZnO is a component that suppresses the denitrification at the time of melting or laser sealing and lowers the thermal expansion coefficient, and the content of ZnO is 5 to 40%, preferably 5 to 35%, more preferably 5 to 33%. When the content of ZnO is less than 5%, the above-mentioned effects are hardly obtained. On the other hand, when the content of ZnO is more than 40%, the balance of the components in the composition of the glass is impaired, and the glass is liable to devitrify to the worse.

CuO+$Fe_2O_3$ is a component that has light absorption properties and is a component that, when glass is irradiated with laser light having a predetermined center emission wavelength, absorbs the laser light and is likely to soften the glass. Further, CuO+$Fe_2O_3$ is a component that suppresses the devitrification at the time of melting or laser sealing. The content of CuO+$Fe_2O_3$ is 5 to 30%, preferably 7 to 25%, more preferably 10 to 20%. When the content of CuO+$Fe_2O_3$ is less than 5%, the light absorption properties deteriorate and the glass is difficult to soften even if irradiated with laser light. On the other hand, when the content of CuO+$Fe_2O_3$ is more than 30%, the balance of the components in the composition of the glass is impaired, and the glass is liable to devitrify to the worse.

CuO is a component that has light absorption properties, is a component that, when glass is irradiated with laser light having a predetermined center emission wavelength, absorbs the laser light and is likely to soften the glass, and is a component that suppresses the devitrification at the time of melting or laser sealing. The content of CuO is preferably 0 to 25%, 5 to 25%, 10 to 25%, particularly preferably 10 to 20%. When the content of CuO is more than 25%, the balance of the components in the composition of the glass is impaired, and the glass is liable to devitrify to the worse. It should be noted that, when the content of CuO is restricted to 5% or more, the light absorption properties improves and the glass is likely to soften at the time of laser sealing.

$Fe_2O_3$ is a component that has light absorption properties, is a component that, when glass is irradiated with laser light having a predetermined center emission wavelength, absorbs the laser light and is likely to soften the glass, and is a component that suppresses the denitrification at the time of melting or laser sealing. The content of $Fe_2O_3$ is preferably 0 to 10%, 0.1 to 10%, 0.2 to 10%, particularly preferably 0.5 to 10%. When the content of $Fe_2O_3$ is more than 10%, the balance of the components in the composition of the glass is impaired, and the glass is liable to denitrify to the worse. It should be noted that, when the content of $Fe_2O_3$ is restricted to 0.1% or more, the light absorption properties improves and the glass is likely to soften at the time of laser sealing.

An Fe ion in the glass is present in the state of $Fe^{2+}$ or $Fe^{3+}$. The Fe ion in the glass is not limited to any one of $Fe^{2+}$ and $Fe^{3+}$ and may be $Fe^{2+}$ or $Fe^{3+}$. Thus, even in the case of $Fe^{2+}$, the content of the iron oxide is expressed on the basis of a value obtained by conversion to $Fe_2O_3$. Particularly when infrared laser light is used as irradiation light, the ratio of $Fe^{2+}$ is preferably larger because $Fe^{2+}$ has an absorption peak in the infrared region. For example, the ratio of $Fe^{2+}/Fe^{3+}$ in the glass is preferably restricted to 0.03 or more (desirably 0.08 or more).

The following components may be added in addition to the above-mentioned components.

$SiO_2$ is a component that enhances the water resistance. The content of $SiO_2$ is preferably 0 to 10%, particularly preferably 0 to 3%. When the content of $SiO_2$ is more than 10%, the softening point becomes too high, and hence the glass is difficult to soften even if irradiated with laser light.

$Al_2O_3$ is a component that enhances the water resistance. The content of $Al_2O_3$ is preferably 0 to 5%, particularly preferably 0 to 2%. When the content of $Al_2O_3$ is more than 5%, the softening point becomes too high, and hence the glass is difficult to soften even if irradiated with laser light.

MgO+CaO+SrO+BaO (the total content of MgO, CaO, SrO, and BaO) is a component that suppresses the devitrification at the time of melting or laser sealing, and the content of MgO+CaO+SrO+BaO is preferably 0 to 20%, particularly preferably 0 to 15%. When the content of MgO+CaO+SrO+BaO is more than 20%, the softening point becomes too high, and hence the glass is difficult to soften even if irradiated with laser light.

MgO, CaO, and SrO are components that suppress the devitrification at the time of melting or laser sealing. The content of each of the components is preferably 0 to 5%, particularly preferably 0 to 2%. When the content of each of the components is more than 5%, the softening point becomes too high, and hence the glass is difficult to soften even if irradiated with laser light.

BaO is a component that suppresses the devitrification at the time of melting or laser sealing. The content of BaO is preferably 0 to 15%, particularly preferably 0 to 10%. When the content of BaO is more than 15%, the softening point becomes too high, and hence the glass is difficult to soften even if irradiated with laser light.

$CeO_2$ and $Sb_2O_3$ are components that suppress the devitrification at the time of melting or laser sealing. The content of each of the components is preferably 0 to 5%, 0 to 2%, particularly preferably 0 to 1%. When the content of each of the components is more than 5%, the balance of the components in the composition of the glass is impaired, and the glass is liable to devitrify to the worse. It should be noted that, from the viewpoint of enhancing the thermal stability, $Sb_2O_3$ is preferably added in a trace amount, and specifically, $Sb_2O_3$ is preferably added at 0.05% or more.

$WO_3$ is a component that suppresses the devitrification at the time of melting or laser sealing. The content of $WO_3$ is preferably 0 to 10%, particularly preferably 0 to 2%. When the content of $WO_3$ is more than 10%, the balance of the components in the composition of the glass is impaired, and the glass is liable to devitrify to the worse.

$In_2O_3+Ga_2O_3$ (the total content of $In_2O_3$ and $Ga_2O_3$) is a component that suppresses the devitrification at the time of melting or laser sealing. The content of $In_2O_3+Ga_2O_3$ is preferably 0 to 5%, particularly preferably 0 to 3%. When the content of $In_2O_3+Ga_2O_3$ is more than 5%, the batch cost soars. It should be noted that the content of $In_2O_3$ is more preferably 0 to 1% and the content of $Ga_2O_3$ is more preferably 0 to 0.5%.

Oxides of Li, Na, K, and Cs are components that lower the softening point, but have an action of accelerating the devitrification at the time of melting. Hence, the total content of the oxides is preferably restricted to less than 1%.

$P_2O_5$ is a component that suppresses the devitrification at the time of melting. However, when the content of $P_2O_5$ is more than 1%, the glass is liable to undergo phase separation at the time of melting.

$La_2O_3$, $Y_2O_3$, and $Gd_2O_3$ are components that suppress the phase separation at the time of melting. However, when the total content thereof is more than 3%, the softening point becomes too high, and hence the glass is difficult to soften even if irradiated with laser light.

NiO, $V_2O_5$, CoO, $MoO_3$, $TiO_2$, and $MnO_2$ are components that have light absorption properties and components that, when glass is irradiated with laser light having a predetermined center emission wavelength, absorb the laser light and are likely to soften the glass. The content of each of the components is preferably 0 to 7%, particularly preferably 0 to 3%. When the content of each of the components is more than 7%, the glass is liable to denitrify at the time of laser sealing.

PbO is a component that lowers the softening point but is a component that may adversely affect the environment. Thus, the content of PbO is preferably less than 0.1%.

Other components than those described above may be added up to, for example, 5% as long as the glass characteristics are not impaired.

The glass powder (first glass powder or second glass powder) is preferably substantially free of PbO in its glass composition from an environmental viewpoint.

The sealing material paste (first sealing material paste or second sealing material paste) preferably further comprises a refractory filler. With this, the mechanical strength of the sealing material layer easily improves and the thermal expansion coefficient of the sealing material layer easily lowers.

The average particle diameter $D_{50}$ of the refractory filler is preferably 0.5 to 2.0 µm, particularly preferably 0.5 to 1.8 µm. When the average particle diameter $D_{50}$ of the refractory filler is too small, the refractory filler easily melts into glass at the time of firing, with the result that the sealing material may be inhibited from softening and flowing. Besides, particles of the refractory filler are liable to aggregate at the time of pulverization and classification, the resultant aggregates remain in the sealing material paste after kneading, and the aggregates may cause clogging of screen meshes at the time of screen printing. On the other hand, when the average particle diameter $D_{50}$ of the refractory filler is too large, irregularities of the laminated film (in particular, the second sealing material film) are too large at the time of screen printing, with the result that the surface smoothness of the sealing material layer is liable to deteriorate.

As the refractory filler, there may be used zircon, zirconia, tin oxide, quartz, β-spodumene, cordierite, mullite, quartz glass, β-eucryptite, β-quartz, zirconium phosphate, zirconium phosphate tungstate, zirconium tungstate, a compound having a basic structure of $[AB_2 (MO_4)_3]$ such as $NbZr(PO_4)_3$, where A represents Li, Na, K, Mg, Ca, Sr, Ba, Zn, Cu, Ni, Mn, or the like, B represents Zr, Ti, Sn, Nb, Al, Sc, Y, or the like, and M represents P, Si, W, Mo, or the like, and a solid solution thereof.

The sealing material paste (first sealing material paste or second sealing material paste) preferably further comprises a pigment. With this, the sealing material layer is likely to absorb laser light.

The pigment is preferably an inorganic pigment, more preferably one kind or two or more kinds selected from carbon, $Co_3O_4$, CuO, $Cr_2O_3$, $Fe_2O_3$, $MnO_2$, SnO, $Ti_nO_{2n-1}$ (where n represents an integer), and a spinel-type composite oxide, particularly preferably carbon. Those pigments are excellent in coloring property and are good in laser-light absorbing property. The carbon is preferably amorphous carbon or graphite. The carbon has such property that primary particles are likely to be processed so as to have an average particle diameter $D_{50}$ of 1 to 100 nm. It should be noted that, when $Bi_2O_3$-containing glass powder is used as the glass powder, the pigment is preferably an oxide-based pigment comprising one kind or two or more kinds selected from Cu, Cr, Fe, and Mn from the viewpoint of compatibility.

The average particle diameter $D_{50}$ of the primary particles of the pigment is preferably 1 to 100 nm, 3 to 70 nm, 5 to 60 nm, particularly preferably 10 to 50 nm. When average particle diameter $D_{50}$ of each of the primary particles of the pigment is too small, the primary particles of the pigment are liable to aggregate with each other, and hence the primary particles of the pigment are hardly dispersed uniformly, with the result that the sealing material layer may not soften and flow locally at the time of laser sealing. Further, even when average particle diameter $D_{50}$ of each of the primary particles of the pigment is too large, the primary particles of the pigment are hardly dispersed uniformly, with the result that the sealing material may not soften and flow locally at the time of laser sealing.

The content of the pigment in the sealing material is preferably 0.05 to 1 mass %, particularly preferably 0.1 to 0.5 mass-%. When the content of the pigment is too small, laser light is hardly converted to thermal energy. On the other hand, when the content of the pigment is too large, the sealing material layer is difficult to soften and flow at the time of laser sealing and it is difficult to enhance the sealing strength.

The pigment is preferably substantially free of Cr-based oxides from an environmental viewpoint.

The softening point of the sealing material is preferably 460° C. or less, 450° C. or less, 420° C. or less, particularly preferably 400° C. or less. When the softening point is too high, the laser sealing property is liable to deteriorate. The lower limit of the softening point is not particularly limited, but in consideration of the thermal stability of glass powder, in particular, the softening point is preferably 350° C. or more.

The sealing material and a vehicle are preferably kneaded and processed into a sealing material paste. With this, application workability and the like can be enhanced.

The resin binder is preferably an aliphatic polyolefin-based carbonate, particularly preferably polyethylene carbonate or polypropylene carbonate. Those resin binders are characterized by being less likely to alter the nature of glass powder, in particular, SnO-containing glass powder at the time of debinder treatment or laser sealing.

The solvent is preferably one kind or two or more kinds selected from N,N'-dimethylformamide, ethylene glycol, dimethylsulfoxide, dimethyl carbonate, propylene carbonate, butyrolactone, caprolactone, N-methyl-2-pyrrolidone, phenyl diglycol (PhDG), dibutyl phthalate (DBP), benzyl glycol (BzG), benzyl diglycol (BzDG), and phenyl glycol (PhG). Those solvents are characterized by being less likely to alter the nature of glass powder, in particular, SnO-containing glass powder at the time of debinder treatment or laser sealing. Of those solvents, one kind or two or more kinds selected from propylene carbonate, phenyl diglycol (PhDG), dibutyl phthalate (DBP), benzyl glycol (BzG), benzyl diglycol (BzDG), and phenyl glycol (PhG) are particularly preferred. Each of those solvents has a boiling point of 240° C. or more. Thus, when any of those solvents is used, the volatilization of the solvent can be easily suppressed in application work such as screen printing. As a result, the sealing material paste can be stably used for a long period of time. Further, phenyl diglycol (PhDG), dibutyl phthalate (DBP), benzyl glycol (BzG), benzyl diglycol (BzDG), and phenyl glycol (PhG) have high affinity to a pigment. Thus, even if any of those solvents is added in a small amount, it is possible to suppress such a situation that the pigment is separated in the sealing material paste.

As mentioned above, propylene carbonate, phenyl diglycol (PhDG), dibutyl phthalate (DBP), benzyl glycol (BzG), benzyl diglycol (BzDG), and phenyl glycol (PhG) have an effect of suppressing the volatilization of a solvent, thereby enhancing the long-term stability of the sealing material paste.

The sealing material film (first sealing material film or second material film) is subjected to preferably debinder treatment in an inert atmosphere, particularly preferably debinder treatment in an $N_2$ atmosphere. With this, such a situation that the nature of glass powder, in particular, SnO-containing glass powder is altered at the time of debinder treatment can be easily prevented.

The sealing material layer is preferably formed along the outer peripheral edges of an object to be sealed, and when a glass substrate is used as the object to be sealed, the sealing material layer is preferably formed along the outer peripheral edges of the glass substrate so as to have a frame shape. With this, a region in which elements can be housed becomes larger.

The surface roughness Ra of the sealing material layer is preferably 0.6 μm or less, 0.5 μm or less, particularly preferably 0.4 μm or less. With this, the adhesiveness between the sealing material layer and an object to be sealed improves, and hence the laser sealing property improves and a strong sealing strength is likely to be ensured after laser sealing.

The surface roughness RMS of the sealing material layer is preferably 1.0 μm or less, 0.8 μm or less, particularly preferably 0.7 μm or less. With this, the adhesiveness between the sealing material layer and an object to be sealed improves, and hence the laser sealing property improves and a strong sealing strength is likely to be ensured after laser sealing.

Next, a method of producing an electronic device using the above-mentioned glass substrate with a sealing material layer is described. It should be noted that this method shares some parts in common with the method of producing an electronic device described in the embodiment of the first related invention, and hence is described with reference to FIGS. 2A to 2D without any modification.

That is, as illustrated in FIG. 2A, a first sealing material paste is applied onto a glass substrate 11 on which no element is formed to form a first sealing material film 12. In this case, the first sealing material paste is applied along the outer peripheral edges of the glass substrate 11 so as to have a frame shape. Next, as illustrated in FIG. 2B, a second sealing material paste is applied onto the first sealing material film 12 to form a second sealing material film 13. In this case, the second sealing material paste is applied along the first sealing material film 12 so as to have a frame shape. Further, the application width of the first sealing material paste is almost the same as that of the second sealing material paste, and the softening point of the second glass powder in the second sealing material film 13 is lower than the softening point of the first glass powder in the first sealing material film 12. Next, as illustrated in FIG. 2C, the resultant laminated film is fired to form a sealing material layer 14 on the glass substrate 11. The sealing material layer 14 is firmly bonded to the glass substrate 11. Further, the surface of the sealing material layer 14 is smooth. Finally, as illustrated in FIG. 2D, a glass substrate 15 on which elements are formed but a sealing material layer is not formed is arranged on a glass substrate 1 with a sealing material layer so as to be brought into contact with each other, followed by laser sealing, thereby manufacturing an electronic device. In this case, the electronic device is irradiated with laser light from the side of the glass substrate 11 along the sealing material layer 14, thereby hermetically sealing the glass substrate 1 and the glass substrate 15. With this, the thermal degradation of the elements in the electronic device is prevented and the long-term stability of the electronic device improves.

The laser sealing is preferably performed under an inert atmosphere and is particularly preferably performed under an $N_2$ atmosphere. With this, such a situation that the nature of glass powder, in particular, SnO-containing glass powder is altered at the time of laser sealing can be easily prevented.

Embodiment of Third Related Invention

A method of producing a glass substrate with a sealing material layer according to an embodiment of the third related invention comprises the steps of: (1) preparing a glass substrate; (2) applying a first sealing material paste onto the glass substrate, followed by forming a first sealing material film; (3) applying a second sealing material paste onto the first sealing material film, followed by forming a second sealing material film; and (4) firing the resultant laminated film to forma sealing material layer on the glass substrate.

The first sealing material paste comprises at least a first sealing material and generally further comprises a vehicle. The first sealing material comprises at least a refractory filler and generally further comprises glass powder and a pigment. The second sealing material paste comprises at least a second sealing material and generally further comprises a vehicle. The second sealing material comprises at least a refractory filler and generally further comprises glass powder and a pigment. It should be noted that any one of various glass powders can be used as the glass powder, but as described below, SnO-containing glass powder or $Bi_2O_3$-containing glass powder is preferred. The vehicle generally refers to one prepared by dissolving a resin binder in a solvent, but a surfactant or the like may be added therein if necessary.

The suitable formulations of these components are as mentioned below.

The content (which is calculated by excluding the content of the pigment) of the refractory filler in the second sealing material is preferably 5 to 40 vol %, particularly preferably 10 to 35 vol %. When the content of the refractory filler is too small, the difference in thermal expansion coefficient between the second sealing material and an object to be sealed (such as a glass substrate without a sealing material layer) or the first sealing material is larger, with the result that cracks and the like occur, making it difficult to keep air tightness. Further, the effects of the refractory filler, that is, an effect of lowering the thermal expansion coefficient, an effect of improving the mechanical strength, and the like are hardly obtained. On the other hand, when the content of the refractory filler is too large, the second sealing material is inhibited from softening and flowing and the surface smoothness of the sealing material layer is liable to deteriorate, with result that the laser sealing property is liable to deteriorate.

The content (which is calculated by excluding the content of the pigment) of the refractory filler in the first sealing material is preferably 20 to 60 vol %, particularly preferably 30 to 50 vol %. When the content of the refractory filler is too small, the difference in thermal expansion coefficient between the first sealing material and an object to be sealed (such as a glass substrate without a sealing material layer) is larger, with the result that cracks and the like occur, making it difficult to keep air tightness. Further, the effects of the refractory filler, that is, an effect of lowering the thermal expansion coefficient, an effect of improving the mechanical strength, and the like are hardly obtained. On the other hand, when the content of the refractory filler is too large, the first sealing material may be inhibited from softening and flowing. Further, the difference in thermal expansion coefficient between the first sealing material and the second sealing material becomes large, and hence cracks and the like occur, making it difficult to keep air tightness.

The average particle diameter $D_{50}$ of the refractory filler is preferably 0.5 to 2.0 µm, particularly preferably 0.5 to 1.8 µm. When the average particle diameter $D_{50}$ of the refractory filler is too small, the refractory filler easily melts into glass at the time of firing, with the result that the sealing material may be inhibited from softening and flowing. Besides, particles of the refractory filler are liable to aggregate at the time of pulverization and classification, the resultant aggregates remain in the sealing material paste after kneading, and the aggregates may cause clogging of screen meshes at the time of screen printing. On the other hand, when the average particle diameter $D_{50}$ of the refractory filler is too large, irregularities of the laminated film (in particular, the second sealing material film) are too large at the time of screen printing, with the result that the surface smoothness of the sealing material layer is liable to deteriorate.

As the refractory filler, there may be used zircon, zirconia, tin oxide, quartz, β-spodumene, cordierite, mullite, quartz glass, β-eucryptite, β-quartz, zirconium phosphate, zirconium phosphate tungstate, zirconium tungstate, a compound having a basic structure of $[AB_2(MO_4)_3]$ such as $NbZr(PO_4)_3$, where A represents Li, Na, K, Mg, Ca, Sr, Ba, Zn, Cu, Ni, Mn, or the like, B represents Zr, Ti, Sn, Nb, Al, Sc, Y, or the like, and M represents P, Si, W, Mo, or the like, or a solid solution thereof.

The value of (the thermal expansion coefficient of the second sealing material−the thermal expansion coefficient of the first sealing material) is preferably $1 \times 10^{-7}$ to $45 \times 10^{-7}$/° C., particularly preferably $8 \times 10^{-7}$ to $28 \times 10^{-7}$/° C. With this, while the softening and flowing of the second sealing material are promoted, such a situation that an improper stress remains in the sealing material layer is likely to be prevented.

In each of the sealing materials (first sealing material and second sealing material), the average particle diameter $D_{50}$ of the glass powder is preferably 1.0 to 3.0 µm, particularly preferably 1.5 to 2.5 µm. When the average particle diameter $D_{50}$ of the glass powder is too small, glass is liable to denitrify at the time of firing and the sealing material may be inhibited from softening and flowing. Besides, particles of the glass powder are liable to aggregate at the time of pulverization and classification, the aggregates remain in the sealing material paste after kneading, and the aggregates may cause clogging of screen meshes at the time of performing screen printing. On the other hand, when the average particle diameter $D_{50}$ of the glass powder is too large, irregularities of the sealing material film (wet film) are too large at the time of performing screen printing, with the result that the surface smoothness of the sealing material layer is liable to deteriorate and the sealing material is difficult to soften and flow at the time of firing, and hence the firing temperature needs to be increased. In this case, the thermal damage of an object to be sealed is liable to be significant, which may be one reason for cost increase. The term "average particle diameter $D_{50}$" refers to a value measured by laser diffractometry, and refers to a particle diameter at which the cumulative amount of particles starting from a particle having the smallest diameter reaches 50% in a cumulative particle size distribution curve on a volume basis prepared based on the measurement by the laser diffractometry.

In each of the sealing materials (first sealing material and second sealing material), the 90% particle diameter $D_{90}$ of the glass powder is preferably 7.0 µm or less, particularly preferably 5.0 µm or less. With this, the gap between both glass substrates can be easily made smaller. In this case, the time necessary for laser sealing is shortened, and even if the glass substrates and the sealing materials are different in their thermal expansion coefficients, cracks and the like hardly occur in the glass substrates and the sealed sites.

In each of the sealing materials (first sealing material and second sealing material), the maximum particle diameter $D_{99}$ of the glass powder is preferably 15 µm or less, particularly preferably 10 µm or less. With this, the gap between both glass substrates can be easily made smaller. In this case, the time necessary for laser sealing is shortened, and even if the glass substrates and the sealing materials are different in their thermal expansion coefficients, cracks and the like hardly occur in the glass substrates and the sealed sites.

The glass powder is preferably SnO-containing glass powder, and the SnO-containing glass powder preferably contains, as a glass composition expressed in mol % in terms of the following oxides, 35 to 70% of SnO and 10 to 30% of $P_2O_5$. The reasons why the range of the glass composition has been limited to the above are described below. It should be noted that in the description of the range of the glass composition, the expression "%" refers to "mol %" unless otherwise specified.

SnO is a component that reduces the melting point of glass. The content of SnO is preferably 35 to 70%, 40 to 70%, particularly preferably 50 to 68%. It should be noted that, when the content of SnO is 50% or more, the glass easily softens and flows at the time of laser sealing. It should be noted that, when the content of SnO is less than 35%, the viscosity of the glass becomes too high and it becomes difficult to perform laser sealing with a desired laser power. On the other hand, when the content of SnO is more than 70%, the vitrification of the glass becomes difficult.

$P_2O_5$ is a glass-forming oxide and is a component that enhances the thermal stability of glass. The content of $P_2O_5$ is preferably 10 to 30%, 15 to 27%, particularly preferably 15 to 25%. When the content of $P_2O_5$ is less than 10%, the thermal stability is liable to deteriorate. On the other hand, when the content of $P_2O_5$ is more than 30%, the climate resistance deteriorates, and hence it becomes difficult to ensure the long-term reliability of an OLED device or the like.

The following components can be added in addition to the above-mentioned components.

ZnO is an intermediate oxide and is a component that stabilizes glass. The content of ZnO is preferably 0 to 30%, 1 to 20%, particularly preferably 1 to 15%. When the content of ZnO is more than 30%, the thermal stability is liable to deteriorate.

$B_2O_3$ is a glass-forming oxide and is a component that stabilizes glass. Further, $B_2O_3$ is a component that enhances the climate resistance. The content of $B_2O_3$ is preferably 0 to 20%, 1 to 25%, particularly preferably 2 to 15%. When the content of $B_2O_3$ is more than 20%, the viscosity becomes too high and it becomes difficult to perform laser sealing with a desired laser element.

$Al_2O_3$ is an intermediate oxide and is a component that stabilizes glass. Besides, $Al_2O_3$ is a component that lowers the thermal expansion coefficient. The content of $Al_2O_3$ is preferably 0 to 10%, 0.1 to 10%, particularly preferably 0.5 to 5%. When the content of $Al_2O_3$ is more than 10%, the softening point of the glass powder improperly rises and it becomes difficult to perform laser sealing with a desired laser element.

$SiO_2$ is a glass-forming oxide and is a component that stabilizes glass. The content of $SiO_2$ is preferably 0 to 15%, particularly preferably 0 to 5%. When the content of $SiO_2$ is more than 15%, the softening point of the glass powder improperly rises and it becomes difficult to perform laser sealing with a desired laser element.

$In_2O_3$ is a component that enhances the thermal stability and the content of $In_2O_3$ is preferably 0 to 5%. When the content of $In_2O_3$ is more than 5%, batch cost soars.

$Ta_2O_5$ is a component that enhances the thermal stability and the content of $Ta_2O_5$ is preferably 0 to 5%. When the content of $Ta_2O_5$ is more than 5%, the softening point of the glass powder improperly rises and it becomes difficult to perform laser sealing with a desired laser element.

$La_2O_3$ is a component that enhances the thermal stability and is a component that enhances the climate resistance. The content of $La_2O_3$ is preferably 0 to 15%, 0 to 10%, particularly preferably 0 to 5%. When the content of $La_2O_3$ is more than 15%, batch cost soars.

$MoO_3$ is a component that enhances the thermal stability and the content of $MoO_3$ is preferably 0 to 5%. When the content of $MoO_3$ is more than 5%, the softening point of the glass powder improperly rises and it becomes difficult to perform laser sealing with a desired laser element.

$WO_3$ is a component that enhances the thermal stability and the content of $WO_3$ is preferably 0 to 5%. When the content of $WO_3$ is more than 5%, the softening point of glass powder improperly rises and it becomes difficult to perform laser sealing with a desired laser element.

$Li_2O$ is a component that lowers the melting point of glass and the content of $Li_2O$ is preferably 0 to 5%. When the content of $Li_2O$ is more than 5%, the thermal stability is liable to deteriorate.

$Na_2O$ is a component that lowers the melting point of glass and the content of $Na_2O$ is preferably 0 to 10%, particularly preferably 0 to 5%. When the content of $Na_2O$ is more than 10%, the thermal stability is liable to deteriorate.

$K_2O$ is a component that lowers the melting point of glass and the content of $K_2O$ is preferably 0 to 5%. When the content of $K_2O$ is more than 5%, the thermal stability is liable to deteriorate.

MgO is a component that enhances the thermal stability and the content of MgO is preferably 0 to 15%. When the content of MgO is more than 15%, the softening point of glass powder improperly rises and it becomes difficult to perform laser sealing with a desired laser element.

BaO is a component that enhances the thermal stability and the content of BaO is preferably 0 to 10%. When the content of BaO is more than 10%, the balance of the components in the composition of the glass is impaired, and the glass is liable to denitrify to the worse.

$F_2$ is a component that lowers the melting point of glass and the content of $F_2$ is preferably 0 to 5%. When the content of $F_2$ is more than 5%, the thermal stability is liable to deteriorate.

In consideration of the thermal stability and the low-melting point characteristic, the total content of $In_2O_3$, $Ta_2O_5$, $La_2O_3$, $MoO_3$, $WO_3$, $Li_2O$, $Na_2O$, $K_2O$, MgO, BaO, and $F_2$ is preferably 10% or less, particularly preferably 5% or less.

In addition to the above-mentioned components, other components (such as CaO and SrO) can be added, for example, up to 10%.

The SnO-containing glass powder is preferably substantially free of transition metal oxides in its glass composition. With this, the thermal stability can be easily enhanced.

A $Bi_2O_3$—$B_2O_3$-based glass powder is also preferably used as the glass powder (first glass powder or second glass powder). The $Bi_2O_3$—$B_2O_3$-based glass powder preferably comprises, as a glass composition expressed in mol % in terms of the following oxides, 20 to 60% of $Bi_2O_3$, 10 to 35% of $B_2O_3$, 5 to 40% of ZnO, and 5 to 30% of CuO+$Fe_2O_3$. The reasons why the range of the glass composition has been limited as described above are shown below. It should be noted that, in the following description of the range of the glass composition, the expression "%" refers to mol % unless otherwise specified.

$Bi_2O_3$ is a main component for lowering the softening point, and the content thereof is 20 to 60%, preferably 25 to 55%, more preferably 30 to 55%. When the content of $Bi_2O_3$ is less than 20%, the softening point becomes too high, and hence the glass is difficult to soften even if irradiated with laser light. On the other hand, when the content of $Bi_2O_3$ is more than 60%, the glass becomes thermally unstable, and hence the glass is liable to devitrify at the time of melting or laser sealing.

$B_2O_3$ is a component that forms a glass network of bismuth-based glass, and the content thereof is 10 to 35%, preferably 15 to 30%, more preferably 15 to 28%. When the content of $B_2O_3$ is less than 10%, the glass becomes thermally unstable, and hence the glass is liable to devitrify at the time of melting or laser sealing. On the other hand, when the content of $B_2O_3$ is more than 35%, the softening point becomes too high, and hence the glass is difficult to soften even if irradiated with laser light.

ZnO is a component that suppresses the devitrification at the time of melting or laser sealing and lowers the thermal expansion coefficient, and the content of ZnO is 5 to 40%, preferably 5 to 35%, more preferably 5 to 33%. When the content of ZnO is less than 5%, the above-mentioned effects are hardly obtained. On the other hand, when the content of ZnO is more than 40%, the balance of the components in the composition of the glass is impaired, and the glass is liable to devitrify to the worse.

$CuO+Fe_2O_3$ is a component that has light absorption properties and is a component that, when glass is irradiated with laser light having a predetermined center emission wavelength, absorbs the laser light and is likely to soften the glass. Further, $CuO+Fe_2O_3$ is a component that suppresses the devitrification at the time of melting or laser sealing. The content of $CuO+Fe_2O_3$ is 5 to 30%, preferably 7 to 25%, more preferably 10 to 20%. When the content of $CuO+Fe_2O_3$ is less than 5%, the light absorption properties deteriorate and the glass is difficult to soften even if irradiated with laser light. On the other hand, when the content of $CuO+Fe_2O_3$ is more than 30%, the balance of the components in the composition of the glass is impaired, and the glass is liable to devitrify to the worse.

CuO is a component that has light absorption properties, is a component that, when glass is irradiated with laser light having a predetermined center emission wavelength, absorbs the laser light and is likely to soften the glass, and is a component that suppresses the devitrification at the time of melting or laser sealing. The content of CuO is preferably 0 to 25%, 5 to 25%, 10 to 25%, particularly preferably 10 to 20%. When the content of CuO is more than 25%, the balance of the components in the composition of the glass is impaired, and the glass is liable to devitrify to the worse. It should be noted that, when the content of CuO is restricted to 5% or more, the light absorption properties improves and the glass is likely to soften at the time of laser sealing.

$Fe_2O_3$ is a component that has light absorption properties, is a component that, when glass is irradiated with laser light having a predetermined center emission wavelength, absorbs the laser light and is likely to soften the glass, and is a component that suppresses the devitrification at the time of melting or laser sealing. The content of $Fe_2O_3$ is preferably 0 to 10%, 0.1 to 10%, 0.2 to 10%, particularly preferably 0.5 to 10%. When the content of $Fe_2O_3$ is more than 10%, the balance of the components in the composition of the glass is impaired, and the glass is liable to devitrify to the worse. It should be noted that, when the content of $Fe_2O_3$ is restricted to 0.1% or more, the light absorption properties improves and the glass is likely to soften at the time of laser sealing.

An Fe ion in the glass is present in the state of $Fe^{2+}$ or $Fe^{3+}$. The Fe ion in the glass is not limited to any one of $Fe^{2+}$ and $Fe^{3+}$ and may be $Fe^{2+}$ or $Fe^{3+}$. Thus, even in the case of $Fe^{2+}$, the content of the iron oxide is expressed on the basis of a value obtained by conversion to $Fe_2O_3$. Particularly when infrared laser light is used as irradiation light, the ratio of $Fe^{2+}$ is preferably larger because $Fe^{2+}$ has an absorption peak in the infrared region. For example, the ratio of $Fe^{2+}/Fe^{3+}$ in the glass is preferably restricted to 0.03 or more (desirably 0.08 or more).

The following components may be added in addition to the above-mentioned components.

$SiO_2$ is a component that enhances the water resistance. The content of $SiO_2$ is preferably 0 to 10%, particularly preferably 0 to 3%. When the content of $SiO_2$ is more than 10%, the softening point becomes too high, and hence the glass is difficult to soften even if irradiated with laser light.

$Al_2O_3$ is a component that enhances the water resistance. The content of $Al_2O_3$ is preferably 0 to 5%, particularly preferably 0 to 2%. When the content of $Al_2O_3$ is more than 5%, the softening point becomes too high, and hence the glass is difficult to soften even if irradiated with laser light.

MgO+CaO+SrO+BaO (the total content of MgO, CaO, SrO, and BaO) is a component that suppresses the denitrification at the time of melting or laser sealing, and the content of MgO+CaO+SrO+BaO is preferably 0 to 20%, particularly preferably 0 to 15%. When the content of MgO+CaO+SrO+BaO is more than 20%, the softening point becomes too high, and hence the glass is difficult to soften even if irradiated with laser light.

MgO, CaO, and SrO are components that suppress the devitrification at the time of melting or laser sealing. The content of each of the components is preferably 0 to 5%, particularly preferably 0 to 2%. When the content of each of the components is more than 5%, the softening point becomes too high, and hence the glass is difficult to soften even if irradiated with laser light.

BaO is a component that suppresses the devitrification at the time of melting or laser sealing. The content of BaO is preferably 0 to 15%, particularly preferably 0 to 10%. When the content of BaO is more than 15%, the softening point becomes too high, and hence the glass is difficult to soften even if irradiated with laser light.

$CeO_2$ and $Sb_2O_3$ are components that suppress the devitrification at the time of melting or laser sealing. The content of each of the components is preferably 0 to 5%, 0 to 2%, particularly preferably 0 to 1%. When the content of each of the components is more than 5%, the balance of the components in the composition of the glass is impaired, and the glass is liable to denitrify to the worse. It should be noted that, from the viewpoint of enhancing the thermal stability, $Sb_2O_3$ is preferably added in a trace amount, and specifically, $Sb_2O_3$ is preferably added at 0.05% or more.

$WO_3$ is a component that suppresses the devitrification at the time of melting or laser sealing. The content of $WO_3$ is preferably 0 to 10%, particularly preferably 0 to 2%. When the content of $WO_3$ is more than 10%, the balance of the components in the composition of the glass is impaired, and the glass is liable to denitrify to the worse.

$In_2O_3+Ga_2O_3$ (the total content of $In_2O_3$ and $Ga_2O_3$) is a component that suppresses the devitrification at the time of melting or laser sealing. The content of $In_2O_3+Ga_2O_3$ is preferably 0 to 5%, particularly preferably 0 to 3%. When the content of $In_2O_3+Ga_2O_3$ is more than 5%, the batch cost soars. It should be noted that the content of $In_2O_3$ is more preferably 0 to 1% and the content of $Ga_2O_3$ is more preferably 0 to 0.5%.

Oxides of Li, Na, K, and Cs are components that lower the softening point, but have an action of accelerating the devitrification at the time of melting. Hence, the total content of the oxides is preferably restricted to less than 1%.

$P_2O_5$ is a component that suppresses the devitrification at the time of melting. However, when the content of $P_2O_5$ is more than 1%, the glass is liable to undergo phase separation at the time of melting.

$La_2O_3$, $Y_2O_3$, and $Gd_2O_3$ are components that suppress the phase separation at the time of melting. However, when the total content thereof is more than 3%, the softening point becomes too high, and hence the glass is difficult to soften even if irradiated with laser light.

NiO, $V_2O_5$, CoO, $MoO_3$, $TiO_2$, and $MnO_2$ are components that have light absorption properties and components that, when glass is irradiated with laser light having a predetermined center emission wavelength, absorb the laser light and are likely to soften the glass. The content of each of the components is preferably 0 to 7%, particularly preferably 0 to 3%. When the content of each of the components is more than 7%, the glass is liable to denitrify at the time of laser sealing.

PbO is a component that lowers the softening point but is a component that may adversely affect the environment. Thus, the content of PbO is preferably less than 0.1%.

Other components than those described above may be added up to, for example, 5% as long as the glass characteristics are not impaired.

The glass powder (first glass powder or second glass powder) is preferably substantially free of PbO in its glass composition from an environmental viewpoint.

The sealing material paste (first sealing material paste or second sealing material paste) preferably further comprises a pigment. With this, the sealing material layer is likely to absorb laser light.

The pigment is preferably an inorganic pigment, more preferably one kind or two or more kinds selected from carbon, $Co_3O_4$, CuO, $Cr_2O_3$, $Fe_2O_3$, $MnO_2$, SnO, $Ti_nO_{2n-1}$ (where n represents an integer), and a spinel-type composite oxide, particularly preferably carbon. Those pigments are excellent in coloring property and are good in laser-light absorbing property. The carbon is preferably amorphous carbon or graphite. The carbon has such property that primary particles are likely to be processed so as to have an average particle diameter $D_{50}$ of 1 to 100 nm. It should be noted that, when $Bi_2O_3$-containing glass powder is used as the glass powder, the pigment is preferably an oxide-based pigment comprising one kind or two or more kinds selected from Cu, Cr, Fe, and Mn from the viewpoint of compatibility.

The average particle diameter $D_{50}$ of the primary particles of the pigment is preferably 1 to 100 nm, 3 to 70 nm, 5 to 60 nm, particularly preferably 10 to 50 nm. When average particle diameter $D_{50}$ of each of the primary particles of the pigment is too small, the primary particles of the pigment are liable to aggregate with each other, and hence the primary particles of the pigment are hardly dispersed uniformly, with the result that the sealing material layer may not soften and flow locally at the time of laser sealing. Further, even when average particle diameter $D_{50}$ of each of the primary particles of the pigment is too large, the primary particles of the pigment are hardly dispersed uniformly, with the result that the sealing material may not soften and flow locally at the time of laser sealing.

The content of the pigment in each of the sealing materials (first sealing material and second sealing material) is preferably 0.05 to 1 mass %, particularly preferably 0.1 to 0.5 mass %. When the content of the pigment is too small, laser light is difficult to be converted to thermal energy. On the other hand, when the content of the pigment is too large, the sealing material layer is difficult to soften and flow at the time of laser sealing and it is difficult to enhance the sealing strength.

The pigment is preferably substantially free of Cr-based oxides from an environmental viewpoint.

The softening point of each of the sealing materials (first sealing material and second sealing material) is preferably 450° C. or less, 420° C. or less, particularly preferably 400° C. or less. When the softening point is too high, the laser sealing property is liable to deteriorate. The lower limit of the softening point is not particularly limited, but the softening point is preferably 350° C. or more in consideration of the thermal stability of the glass powder, in particular, SnO-containing glass powder.

The first sealing material is kneaded with a vehicle and processed into the first sealing material paste. Further, the second sealing material is kneaded with a vehicle and processed into the second sealing material paste. With this, application workability and the like can be enhanced.

The resin binder is preferably an aliphatic polyolefin-based carbonate, particularly preferably polyethylene carbonate or polypropylene carbonate. Those resin binders are characterized by being less likely to alter the nature of glass powder, in particular, SnO-containing glass powder at the time of debinder treatment or laser sealing.

The solvent is preferably one kind or two or more kinds selected from N,N'-dimethylformamide, ethylene glycol, dimethylsulfoxide, dimethyl carbonate, propylene carbonate, butyrolactone, caprolactone, N-methyl-2-pyrrolidone, phenyl diglycol (PhDG), dibutyl phthalate (DBP), benzyl glycol (BzG), benzyl diglycol (BzDG), and phenyl glycol (PhG). Those solvents are characterized by being less likely to alter the nature of glass powder, in particular, SnO-containing glass powder at the time of debinder treatment or laser sealing. Of those solvents, one kind or two or more kinds selected from propylene carbonate, phenyl diglycol (PhDG), dibutyl phthalate (DBP), benzyl glycol (BzG), benzyl diglycol (BzDG), and phenyl glycol (PhG) are particularly preferred. Each of those solvents has a boiling point of 240° C. or more. Thus, when any of those solvents is used, the volatilization of the solvent can be easily suppressed in application work such as screen printing. As a result, the sealing material paste can be stably used for a long period of time. Further, phenyl diglycol (PhDG), dibutyl phthalate (DBP), benzyl glycol (BzG), benzyl diglycol (BzDG), and phenyl glycol (PhG) have high affinity to a pigment. Thus, even if any of those solvents is added in a small amount, it is possible to suppress such a situation that the pigment is separated in the sealing material paste.

As mentioned above, propylene carbonate, phenyl diglycol (PhDG), dibutyl phthalate (DBP), benzyl glycol (BzG), benzyl diglycol (BzDG), and phenyl glycol (PhG) have an effect of suppressing the volatilization of a solvent, thereby enhancing the long-term stability of the sealing material paste.

The sealing material film (first sealing material film or second material film) is subjected to preferably debinder treatment in an inert atmosphere, particularly preferably debinder treatment in an $N_2$ atmosphere. With this, such a situation that the nature of glass powder, in particular, SnO-containing glass powder is altered at the time of debinder treatment can be easily prevented.

The sealing material layer is preferably formed along the outer peripheral edges of an object to be sealed, and when a glass substrate is used as the object to be sealed, the sealing material layer is preferably formed along the outer peripheral edges of the glass substrate so as to have a frame shape. With this, a region in which elements can be housed becomes larger.

The surface roughness Ra of the sealing material layer is preferably 0.6 µm or less, 0.5 µm or less, particularly preferably 0.4 µm or less. With this, the adhesiveness between the sealing material layer and an object to be sealed improves, and hence the laser sealing property improves and a strong sealing strength is likely to be ensured after laser sealing.

The surface roughness RMS of the sealing material layer is preferably 1.0 µm or less, 0.8 µm or less, particularly preferably 0.7 µm or less. With this, the adhesiveness between the sealing material layer and an object to be sealed improves, and hence the laser sealing property improves and a strong sealing strength is likely to be ensured after laser sealing.

Next, a method of producing an electronic device using the above-mentioned glass substrate with a sealing material layer is described. It should be noted that this method shares some parts in common with the method of producing an electronic device described in the embodiment of the first related invention, and hence is described with reference to FIGS. 2A to 2D without any modification.

That is, as illustrated in FIG. 2A, a first sealing material paste is applied onto a glass substrate 11 on which no element is formed to form a first sealing material film 12. In this case, the first sealing material paste is applied along the outer peripheral edges of the glass substrate 11 so as to have a frame shape. Next, as illustrated in FIG. 2B, a second sealing material paste is applied onto the first sealing material film 12 to form a second sealing material film 13. In this case, the second sealing material paste is applied along the first sealing material film 12 so as to have a frame shape. Further, the application width of the first sealing material paste is almost the same as that of the second sealing material paste, and the softening point of the second glass powder in the second sealing material film 13 is lower than the softening point of the first glass powder in the first sealing material film 12. Further, the content of the refractory filler in the second sealing material film 13 is smaller than the content of the refractory filler in the first sealing material film 12. Next, as illustrated in FIG. 2C, the resultant laminated film is fired, thereby forming a sealing material layer 14 on the glass substrate 11. The sealing material layer 14 is firmly bonded to the glass substrate 11. Further, the content of the refractory filler in the surface region of the sealing material layer 14 is smaller as compared to that in the internal region of the sealing material layer 14. Finally, as illustrated in FIG. 2D, a glass substrate 15 on which elements are formed but a sealing material layer is not formed is arranged on a glass substrate 1 with a sealing material layer so as to be brought into contact with each other, followed by laser sealing, thereby manufacturing an electronic device. In this case, the electronic device is irradiated with laser light from the side of the glass substrate 11 along the sealing material layer 14, thereby hermetically sealing the glass substrate 1 and the glass substrate 15. With this, the thermal degradation of the elements in the electronic device is prevented and the long-term stability of the electronic device improves.

The laser sealing is preferably performed under an inert atmosphere and is particularly preferably performed under an $N_2$ atmosphere. With this, such a situation that the nature of glass powder, in particular, SnO-containing glass powder is altered at the time of laser sealing can be easily prevented.

EXAMPLE 1

Examples of the first invention are described. It should be noted that the following examples are merely for illustrative purposes. The first invention is not limited to the following examples at all.

Table 1 shows each SnO-containing glass powder (Sample Nos. 1 to 7). Further, Table 2 shows each $Bi_2O_3$-containing glass powder (Sample Nos. 8 to 14).

TABLE 1

|  | No. 1 | No. 2 | No. 3 | No. 4 | No. 5 | No. 6 | No. 7 |
|---|---|---|---|---|---|---|---|
| (mol %) | | | | | | | |
| SnO | 59 | 64 | 64 | 55 | 50 | 56 | 55.1 |
| $P_2O_5$ | 20 | 25 | 24 | 21 | 23 | 32 | 27 |
| ZnO | 5 | 4 | 3 | 10 | 10 | 8 | 13 |
| $B_2O_3$ | 15 | 4 | 7 | 10 | 12 |  | 0.9 |

TABLE 1-continued

|  | No. 1 | No. 2 | No. 3 | No. 4 | No. 5 | No. 6 | No. 7 |
|---|---|---|---|---|---|---|---|
| $Al_2O_3$ | 1 | 1 | 2 | 3 | 4 | | |
| $Li_2O$ | | 1 | | | 1 | 2 | 2 |
| $K_2O$ | | 1 | | 1 | | 2 | 2 |
| Melting temperature (° C.) | 950 | 900 | 900 | 950 | 950 | 900 | 900 |
| Glass transition point (° C.) | 320 | 295 | 307 | 323 | 334 | 305 | 310 |
| Softening point (° C.) | 392 | 364 | 376 | 390 | 405 | 378 | 383 |
| Thermal expansion coefficient ($\times 10^{-7}$/° C.) | 106 | 125 | 118 | 102 | 96 | 120 | 113 |

TABLE 2

|  | No. 8 | No. 9 | No. 10 | No. 11 | No. 12 | No. 13 | No. 14 |
|---|---|---|---|---|---|---|---|
| (mol %) | | | | | | | |
| $Bi_2O_3$ | 37 | 37 | 37 | 42 | 42 | 42 | 42 |
| $B_2O_3$ | 26 | 26 | 26 | 24 | 24 | 24 | 24 |
| ZnO | 17.5 | 14 | 18 | 15 | 21 | 24.5 | 19.5 |
| BaO | 5 | 10 | 13.5 | 8 | | 5 | 10 |
| CuO | 14 | 12 | 5 | 10 | 12 | 4.5 | 3 |
| $Fe_2O_3$ | 0.5 | 1 | 0.5 | 1 | 0.5 | | 1 |
| $Al_2O_3$ | | | | | 0.5 | | 0.5 |
| Melting temperature (° C.) | 1,100 | 1,100 | 1,100 | 1,000 | 1,000 | 1,000 | 1,000 |
| Glass transition point (° C.) | 365 | 362 | 364 | 350 | 351 | 352 | 355 |
| Softening point (° C.) | 435 | 433 | 435 | 419 | 421 | 422 | 424 |
| Thermal expansion coefficient ($\times 10^{-7}$/° C.) | 103 | 105 | 102 | 107 | 101 | 98 | 103 |

Each SnO-containing glass powder was prepared as follows. First, raw materials were blended so that each glass composition shown in Table 1 was attained. After that, each blended material was fed into an alumina crucible and was melted for 1 to 2 hours at 900° C. under a nitrogen atmosphere. Next, the resultant molten glass was formed into a film shape with a water-cooling roller. Subsequently, each glass film was pulverized with a ball mill, followed by classification, yielding each SnO-containing glass powder. The particle sizes of the resultant SnO-containing glass powder were an average particle diameter $D_{50}$ of 1.7 μm and a maximum particle diameter $D_{99}$ of 5.0 μm.

Each $Bi_2O_3$-containing glass powder was prepared as follows. First, raw materials were blended so that each glass composition shown in Table 2 was attained. After that, each blended material was fed into a platinum crucible and was melted for 1 to 2 hours at 1,000 to 1,100° C. under an air atmosphere. Next, the resultant molten glass was formed into a film shape with a water-cooling roller. Subsequently, each glass film was pulverized with a ball mill, followed by classification, yielding each $Bi_2O_3$-containing glass powder. The particle sizes of the resultant $Bi_2O_3$-containing glass powder were an average particle diameter $D_{50}$ of 1.2 μm and a maximum particle diameter $D_{99}$ of 4.0 μm.

Sample Nos. 1 to 7 were each evaluated for a glass transition point, a softening point, and a thermal expansion coefficient. Table 1 shows the results.

The glass transition point refers to a value measured with a push-rod-type TMA apparatus.

The softening point refers to a value measured with a macro-type DTA apparatus. When SnO-containing glass powder was comprised, measurement was performed under a nitrogen atmosphere, and when $Bi_2O_3$-containing glass powder was comprised, measurement was performed under an air atmosphere. The measurement started from room temperature at a temperature increase rate of 10° C./min.

The thermal expansion coefficient refers to a value measured with a push-rod-type TMA apparatus. It should be noted that, when SnO-containing glass powder was used, the range of measurement temperature was set to 30 to 250° C., and when $Bi_2O_3$-containing glass powder was used, the range of measurement temperature was set to 30 to 300° C.

As evident from Table 1, Sample Nos. 1 to 7 each had a glass transition point of 295 to 334° C., a softening point of 364 to 405° C., and a thermal expansion coefficient of $96 \times 10^{-7}$ to $125 \times 10^{-7}$/° C.

As evident from Table 1, Sample Nos. 8 to 14 each had a glass transition point of 350 to 365° C., a softening point of 419 to 435° C., and a thermal expansion coefficient of 98 to $107 \times 10^{-7}$/° C.

Next, each glass powder shown in Tables 1 and 2, a refractory filler, and as required, a pigment were mixed so that each mixing ratio shown in Tables 3 and 4 was attained, yielding each sealing material (Samples A to N).

TABLE 3

| | | Example | | | | | Comparative Example | |
|---|---|---|---|---|---|---|---|---|
| | | A | B | C | D | E | F | G |
| Glass powder (vol %) | No. 1 | 78 | | | | | | |
| | No. 2 | | 69 | | | | | |
| | No. 3 | | | 80 | | | | |
| | No. 4 | | | | 75 | | | |
| | No. 5 | | | | | 90 | | |
| | No. 6 | | | | | | 60 | |
| | No. 7 | | | | | | | 95 |
| Refractory filler (vol %) | Zirconium phosphate tungstate | | | | 20 | 15 | 10 | |
| | Zirconium phosphate | 22 | 31 | | 10 | | 40 | 5 |
| Inorganic powder (mass %) | | 99.5 | 99.62 | 99.6 | 99.8 | 99.3 | 99.6 | 99.85 |
| Pigment carbon (mass %) | | 0.5 | 0.38 | 0.4 | 0.2 | 0.7 | 0.4 | 0.15 |
| Glass transition point (° C.) | | 320 | 297 | 309 | 325 | 334 | 318 | 311 |
| Softening point (° C.) | | 395 | 370 | 379 | 393 | 406 | 408 | 380 |
| Thermal expansion coefficient ($\times 10^{-7}$/° C.) [30 to 300° C.] | | 73 | 61 | 78 | 61 | 79 | 53 | 106 |
| Firing temperature (° C.) Retention time of 10 minutes | | 445 | 420 | 430 | 445 | 455 | 460 | 425 |
| Average film thickness (μm) | | 4.7 | 4.6 | 4.8 | 4.8 | 4.7 | 4.6 | 4.6 |
| Surface roughness (μm) | Ra | 0.05 | 0.09 | 0.04 | 0.11 | 0.04 | 0.55 | — |
| | RMS | 0.11 | 0.18 | 0.09 | 0.28 | 0.09 | 1.24 | — |
| Laser sealing property Irradiation condition | 10 W 20 mm/s | ○ | ○ | ○ | ○ | ○ | x | — |
| | 15 W 20 mm/s | ○ | ○ | ○ | ○ | ○ | x | — |
| | 20 W 20 mm/s | ○ | ○ | ○ | ○ | ○ | ○ | — |

TABLE 4

| | | Example | | | | | Comparative Example | |
|---|---|---|---|---|---|---|---|---|
| | | H | I | J | K | L | M | N |
| Glass powder (vol %) | No. 8 | 75 | | | | | | |
| | No. 9 | | 65 | | | | | |
| | No. 10 | | | 70 | | | | |
| | No. 11 | | | | 75 | | | |
| | No. 12 | | | | | 75 | | |
| | No. 13 | | | | | | 65 | |
| | No. 14 | | | | | | | 95 |
| Refractory filler (vol %) | Cordierite | 25 | 35 | 30 | 25 | 25 | 45 | 5 |
| Glass transition point (° C.) | | 370 | 375 | 370 | 355 | 355 | 361 | 359 |
| Softening point (° C.) | | 450 | 455 | 450 | 435 | 435 | 454 | 437 |
| Thermal expansion coefficient ($\times 10^{-7}$/° C.) [30 to 300° C.] | | 79 | 68 | 72 | 80 | 76 | 53 | 100 |

TABLE 4-continued

|  |  | Example | | | | | Comparative Example | |
|---|---|---|---|---|---|---|---|---|
|  |  | H | I | J | K | L | M | N |
| Firing temperature (° C.) Retention time of 10 minutes | | 490 | 495 | 490 | 475 | 475 | 490 | 470 |
| Average film thickness (μm) | | 4.9 | 4.8 | 4.9 | 5.0 | 4.7 | 5.1 | 4.7 |
| Surface roughness (μm) | Ra | 0.04 | 0.07 | 0.06 | 0.04 | 0.04 | 0.61 | — |
|  | RMS | 0.10 | 0.15 | 0.13 | 0.09 | 0.10 | 1.67 | — |
| Laser sealing property Irradiation condition | 10 W 20 mm/s | ○ | ○ | ○ | ○ | ○ | x | — |
|  | 15 W 20 mm/s | ○ | ○ | ○ | ○ | ○ | x | — |
|  | 20 W 20 mm/s | ○ | ○ | ○ | ○ | ○ | x | — |

When SnO-containing glass powder was used, zirconium phosphate or zirconium phosphate tungstate was used as the refractory filler, and when $Bi_2O_3$-containing glass powder was used, cordierite was used as the refractory filler. The particle sizes of each of zirconium phosphate and zirconium phosphate tungstate were an average particle diameter $D_{50}$ of 1.1 μm and a maximum particle diameter $D_{99}$ of 2.4 μm. The particle sizes of cordierite were an average particle diameter $D_{50}$ of 0.9 μm and a maximum particle diameter $D_{99}$ of 2.1 μm.

When SnO-containing glass powder was used, ketjen black (graphite) was used as the pigment. The average particle diameter $D_{50}$ of its primary particles was 20 nm.

Samples A to N were each evaluated for a glass transition point, a softening point, a thermal expansion coefficient, the thickness of the sealing material layer, the surface roughness of the sealing material layer, and laser sealing property. Tables 3 and 4 show the results.

The glass transition point refers to a value measured with a push-rod-type TMA apparatus.

The softening point refers to a value measured with a macro-type DTA apparatus. When SnO-containing glass powder was comprised, measurement was performed under a nitrogen atmosphere, and when $Bi_2O_3$-containing glass powder was comprised, measurement was performed under an air atmosphere. The measurement started from room temperature at a temperature increase rate of 10° C./min.

The thermal expansion coefficient refers to a value measured with a push-rod-type TMA apparatus. It should be noted that, when SnO-containing glass powder was used, the range of measurement temperature was set to 30 to 250° C., and when $Bi_2O_3$-containing glass powder was used, the range of measurement temperature was set to 30 to 300° C.

A sealing material paste was produced as follows. First, a sealing material and a vehicle were kneaded so that the resultant substance had a viscosity of about 70 Pa·s (25° C., shear rate: 4). After that, the substance was additionally kneaded in a three-roll mill so that a homogeneous paste was formed. Polyethylene carbonate (MW: 129,000) was used as a resin component in the vehicle and propylene carbonate was used as a solvent component in the vehicle. It should be noted that a vehicle prepared by dissolving polyethylene carbonate in propylene carbonate at 25 mass % was used. Next, the above-mentioned sealing material paste was used to perform printing with a screen printing machine on the peripheral portion of a glass substrate (OA-10G manufactured by Nippon Electric Glass Co., Ltd.) with a size of 40 mm in length by 50 mm in width by 0.5 mm in thickness so that the printed portion had a thickness of about 5 μm and a width of about 0.6 mm, followed by drying at 85° C. for 15 minutes under an air atmosphere. After that, the resultant was fired at a temperature "softening point of each sample+50° C." for 10 minutes under a nitrogen atmosphere to burn a resin component in the sealing material paste (debinder treatment) and to perform the fixation of the sealing material, thereby yielding a glass substrate with a sealing material layer having the average thickness and the surface roughnesses (Ra and RMS) shown in the table.

The average thickness of the sealing material layer is a value measured with a noncontact-type laser film thickness meter.

The surface roughnesses (Ra and RMS) of the sealing material layer are values each measured with a surface roughness meter.

Subsequently, on the sealing material layer, a glass substrate (OA-10G manufactured by Nippon Electric Glass Co., Ltd.) with a size of 50 mm in length by 50 mm in width by 0.5 mm in thickness was placed under a nitrogen atmosphere. After that, laser irradiation at a wavelength of 808 nm was performed under the conditions shown in Table 2 along the sealing material layer from the side of the glass substrate on which the sealing material layer was formed, thereby softening and flowing the sealing material layer and sealing the glass substrates with each other to attain air tightness.

The laser sealing property was evaluated by observing the presence or absence of detachment at sealed sites after a pressure cooker test (highly accelerated temperature and humidity stress test: HAST test). It should be noted that the conditions of the HAST test are 121° C., a humidity of 100%, 2 atm, and 24 hours.

As evident from Tables 3 and 4, the sealing material layer of each of Samples A to E and H to L had a surface roughness Ra of 0.15 μm or less and a surface roughness RMS of 0.30 μm or less, thus being excellent in surface smoothness. As a result, when each of Samples A to E and H to L was used, glass substrates were able to be bonded to each other under all laser irradiation conditions.

On the other hand, the sealing material layer of Sample F had a larger surface roughness as each of Ra and RMS, and detachment was found at sealed sites after the HAST test performed under a low power condition of 15 W or less. This fact is probably attributed to the fact that the large content of the refractory filler reduced the surface smoothness of the sealing material layer, with the result that the softening fluidity of the sealing material was inhibited. Further, the content of the refractory filler in Sample G is smaller, and hence it is probably difficult to match its thermal expansion coefficient to that of an object to be sealed. It should be noted that Sample G is probably capable of bonding glass substrates to each other by using a high-power laser, but cracks are probably liable to occur in the sealing interface immediately after the bonding.

The sealing material layer of Sample M had a larger surface roughness as each of Ra and RMS, and detachment was found at sealed sites after the HAST test performed under a low power condition of 15 W or less. This fact is probably attributed to the fact that the large content of the refractory filler reduced the surface smoothness of the sealing material layer, with the result that the softening fluidity of the sealing material was inhibited. It should be noted that, because the total content of CuO and $Fe_2O_3$ in the glass powder in Sample M is small, the sample may not absorb sufficiently the energy of laser light with which the sample is irradiated. Further, the content of the refractory filler in Sample N is smaller, and hence it is probably difficult to match its thermal expansion coefficient to that of an object to be sealed. It should be noted that Sample N is probably capable of bonding glass substrates to each other by using a high-power laser, but cracks are probably liable to occur in the sealing interface immediately after the bonding.

EXAMPLE 2

Hereinafter, examples of the second invention are described. It should be noted that the following examples are merely for illustrative purposes. The second invention is not limited to the following examples at all.

Table 1 shows examples (Sample Nos. 15 to 17) and comparative examples (Sample Nos. 18 and 19) of the second invention. Further, Table 6 shows examples (Sample Nos. 20 to 22) and comparative examples (Sample Nos. 23 and 24) of the second invention.

TABLE 5

| | | Example | | | Comparative Example | |
|---|---|---|---|---|---|---|
| | | No. 15 | No. 16 | No. 17 | No. 18 | No. 19 |
| Sealing material | Glass powder | Sn-P-based | Sn-P-based | Sn-P-based | Sn-P-based | Sn-P-based |
| | Refractory filler | Zirconium phosphate | Zirconium phosphate | Zirconium phosphate | Zirconium phosphate | Zirconium phosphate |
| | Pigment | Graphite | Graphite | Graphite | Graphite | Graphite |
| Firing condition | Temperature (° C.) | 480 | 480 | 500 | 480 | 500 |
| | Retention time (minutes) | 10 | 30 | 10 | 10 | 10 |
| Laser sealing condition | Power (W) | 10 | 15 | 12 | 15 | 14 |
| | Scanning speed (mm/s) | 20 | 30 | 20 | 20 | 20 |
| | Temperature (° C.) | 440 | 450 | 490 | 550 | 520 |
| Evaluation of air tightness | | ○ | ○ | ○ | x | x |
| White spot in Ca film | | | | | | |

TABLE 6

| | | Example | | | Comparative Example | |
|---|---|---|---|---|---|---|
| | | No. 20 | No. 21 | No. 22 | No. 23 | No. 24 |
| Sealing material | Glass powder | Bi-B-based | Bi-B-based | Bi-B-based | Bi-B-based | Bi-B-based |
| | Refractory filler | Cordierite | Cordierite | Cordierite | Cordierite | Cordierite |
| | Pigment | — | — | — | — | — |
| Firing condition | Temperature (° C.) | 490 | 500 | 490 | 480 | 490 |
| | Retention time (minutes) | 10 | 30 | 10 | 10 | 10 |
| Laser sealing condition | Power (W) | 15 | 18 | 18 | 25 | 30 |
| | Scanning speed (mm/s) | 20 | 20 | 25 | 20 | 25 |
| | Temperature (° C.) | 400 | 430 | 420 | 500 | 530 |
| Evaluation of air tightness | | ○ | ○ | ○ | x | x |
| White spot in Ca film | | | | | | |

$SnO$—$P_2O_5$-based glass powder was prepared as follows. First, raw materials were blended so that a predetermined glass composition (59% of SnO, 20% of $P_2O_5$, 5% of ZnO, 15% of $B_2O_3$, and 1% of $Al_2O_3$, expressed in mol %) was attained. After that, the blended material was fed into an alumina crucible and was melted for 1 to 2 hours at 900° C. under a nitrogen atmosphere. Next, the resultant molten glass was formed into a film shape with a water-cooling roller. Subsequently, the resultant glass film was pulverized with a ball mill, followed by air classification, yielding glass powder. The glass powder had a glass transition point of 301° C., a softening point of 385° C., a density of 3.88 g/cm$^3$, an average particle diameter $D_{50}$ of 1.5 μm, a 90% particle diameter $D_{90}$ of 3.5 μm, and a 99% particle diameter $D_{99}$ of 5.7 μm.

$Bi_2O_3$—$B_2O_3$-based glass powder was prepared as follows. First, raw materials were blended so that a predetermined glass composition (37% of $Bi_2O_3$, 26% of $B_2O_3$, 17.5% of ZnO, 14% of CuO, 5% of BaO, and 0.5% of $Fe_2O_3$, expressed in mol %) was attained. After that, the blended material was fed into a platinum crucible and was melted for 1 to 2 hours at 1,000° C. under an air atmosphere. Next, the resultant molten glass was formed into a film shape with a water-cooling roller. Subsequently, the resultant glass film was pulverized with a ball mill, followed by air classification, yielding glass powder. The glass powder had a glass transition point of 360° C., a softening point of 435° C., a density of 6.96 g/cm³, an average particle diameter $D_{50}$ of 1.1 μm, a 90% particle diameter $D_{90}$ of 2.1 μm, and a 99% particle diameter $D_{99}$ of 2.9 μm.

The glass transition point refers to a value measured with a push-rod-type TMA apparatus. It should be noted that a sample obtained by densely sintering the glass powder and then processing the resultant into a predetermined shape was used as a measurement sample.

The softening point refers to a value measured with a macro-type DTA apparatus. When SnO—$P_2O_5$-based glass powder was used, measurement was performed under a nitrogen atmosphere, and when $Bi_2O_3$—$B_2O_3$-based glass powder was used, measurement was performed under an air atmosphere. Further, the measurement started from room temperature at a temperature increase rate of 10° C./min.

Zirconium phosphate was used as the refractory filler for each of Sample Nos. 15 to 19. The zirconium phosphate had a density of 3.80 g/cm³, an average particle diameter $D_{50}$ of 1.6 μm, a 90% particle diameter $D_{90}$ of 3.3 μm, and a 99% particle diameter $D_{99}$ of 5.1 μm.

Cordierite was used as the refractory filler for each of Sample Nos. 20 to 24. The cordierite had a density of 2.63 g/cm³, an average particle diameter $D_{50}$ of 0.9 μm, a 90% particle diameter $D_{90}$ of 1.8 μm, and a 99% particle diameter $D_{99}$ of 2.3 μm.

Ketjen black (graphite) was used as a pigment. The average particle diameter $D_{50}$ of the primary particles of the pigment was 20 nm.

The average particle diameter $D_{50}$, the 90% particle diameter $D_{90}$, and the 99% particle diameter $D_{99}$ refer to values measured with a laser diffraction particle-size distribution analyzer.

In order to prepare Sample Nos. 15 to 19, the above-mentioned SnO—$P_2O_5$-based glass powder and the refractory filler were mixed at 60 vol % and 40 vol %, respectively, manufacturing inorganic powder. Next, the inorganic powder and the pigment were mixed at 99.75 mass % and 0.25 mass %, respectively, manufacturing a sealing material. This sealing material had a glass transition point of 363° C., a softening point of 430° C., and a density of 3.85 g/cm³.

In order to prepare Sample Nos. 20 to 24, the above-mentioned $Bi_2O_3$—$B_2O_3$-based glass powder and the refractory filler were mixed at 75 vol % and 25 vol %, respectively, manufacturing a sealing material (inorganic powder). This sealing material had a glass transition point of 370° C., a softening point of 450° C., and a density of 5.88 g/cm³.

The glass transition point refers to a value measured with a push-rod-type TMA apparatus. It should be noted that a sample obtained by densely sintering the sealing material and then processing the resultant into a predetermined shape was used as a measurement sample.

The softening point refers to a value measured with a macro-type DTA apparatus. When SnO—$P_2O_5$-based glass powder was used, measurement was performed under a nitrogen atmosphere, and when $Bi_2O_3$—$B_2O_3$-based glass powder was used, measurement was performed under an air atmosphere. Further, the measurement started from room temperature at a temperature increase rate of 10° C./min.

A sealing material paste was produced as follows. First, the above-mentioned sealing material and a vehicle were kneaded so that the resultant substance had a viscosity of about 70 Pa·s (25° C., shear rate: 4). After that, the substance was additionally kneaded in a three-roll mill so that a homogeneous paste was formed. Polyethylene carbonate (MW: 129,000) was used as a resin component in the vehicle and propylene carbonate was used as a solvent component in the vehicle. It should be noted that a vehicle prepared by dissolving polyethylene carbonate in propylene carbonate at 25 mass % was used. Next, the above-mentioned sealing material paste was used to perform printing with a screen printing machine on the peripheral portion (33 mm square) of a glass substrate (OA-10G manufactured by Nippon Electric Glass Co., Ltd.) with a size of 40 mm in length by 50 mm in width by 0.5 mm in thickness so that the printed portion had a thickness of about 10 μm and a width of about 0.6 mm, followed by drying at 85° C. for 15 minutes under an air atmosphere. After that, in order to prepare each of Sample Nos. 15 to 19, the printed coating layer was fired under a nitrogen atmosphere under the conditions shown in the table (it should be noted that the temperature was increased from room temperature at a rate of 10° C./min and was decreased to room temperature at a rate of 10° C./min), thereby burning and removing the resin component in the sealing material paste and forming a sealing material layer on the glass substrate. Further, in order to prepare each of Sample Nos. 20-24, the printed coating layer was fired under an air atmosphere under the conditions shown in the table (it should be noted that the temperature was increased from room temperature at a rate of 10° C./min and was decreased to room temperature at a rate of 10° C./min), thereby burning and removing the resin component in the sealing material paste and forming a sealing material layer on the glass substrate.

Subsequently, on the sealing material layer, a glass substrate (OA-10G manufactured by Nippon Electric Glass Co., Ltd.) with a size of 50 mm in length by 50 mm in width by 0.5 mm in thickness on which a 30-mm square Ca film (with a film thickness of about 100 nm) had been preliminarily formed by vacuum deposition in the central part thereof was arranged under a nitrogen atmosphere so that both glass substrates overlap. After that, laser light irradiation at a wavelength of 808 nm was performed along the sealing material layer from the side of the glass substrate on which the sealing material layer was formed, under the conditions shown in the tables, thereby causing the sealing material layer to soften and flow and hermetically sealing the glass substrates with each other.

When the laser light irradiation was performed, the temperature of the sealing material layer was measured with a radiation thermometer, thereby measuring the laser sealing temperature thereof.

Air tightness was evaluated as follows. A laser-sealed sample was placed, for 1,000 hours, in a drying machine in which temperature and humidity were set to 85° C. and 85%, respectively, and the alteration of the Ca film in the sample was observed. When no white spot was found in the Ca film, the sample was evaluated as "◯". When a white spot was found in the Ca film, the sample was evaluated as "x". It should be noted that the Ca film is colorless and transparent, but when the Ca film comes in contact with water, Ca changes to $Ca(OH)_2$ with a white color. Thus, the observation of the color change of the Ca film enables the evaluation of the air tightness in the sample.

As evident from Tables 5 and 6, when the air tightness was evaluated for each of Sample Nos. 15 to 17 and 20 to 22, no white spot was found in its Ca film. On the other hand, when the air tightness was evaluated for each of Sample Nos. 18, 19, 23, and 24, several white spots with a diameter of about 0.5 mm were found in its Ca film. This fact is probably attributed to the fact that, because the laser sealing temperature was higher than the firing temperature, an $H_2O$ gas occurred from the inside of the sealing material layer at the time of laser sealing, and the gas reacted with the Ca film, producing $Ca(OH)_2$.

EXAMPLE 3

Examples of the first related invention are described in detail. It should be noted that the following examples are merely for illustrative purposes. The first related invention is not limited to the following examples at all.

Table 7 shows the particle size distribution and softening point of each of the SnO-containing glass powders A to E. Table 8 shows the particle size distribution and softening point of each of $Bi_2O_3$-containing glass powders F to J.

TABLE 7

|  |  | Glass powder | | | | |
| --- | --- | --- | --- | --- | --- | --- |
|  |  | A | B | C | D | E |
| Particle size | $D_{50}$ | 1.7 | 2.1 | 2.7 | 1.3 | 0.6 |
| distribution (μm) | $D_{90}$ | 3.7 | 4.1 | 5.9 | 3.1 | 1.9 |
|  | $D_{99}$ | 5.5 | 6.2 | 9.1 | 4.2 | 2.8 |
| Softening point (° C.) |  | 385 | 388 | 390 | 382 | 379 |

TABLE 8

|  |  | Glass powder | | | | |
| --- | --- | --- | --- | --- | --- | --- |
|  |  | F | G | H | I | J |
| Particle size | $D_{50}$ | 1.6 | 1.8 | 2.2 | 1.0 | 0.7 |
| distribution (μm) | $D_{90}$ | 3.0 | 3.2 | 4.9 | 2.2 | 1.8 |
|  | $D_{99}$ | 3.9 | 4.2 | 6.1 | 2.9 | 2.6 |
| Softening point (° C.) |  | 435 | 436 | 438 | 433 | 430 |

SnO-containing glass powders A to E were prepared as follows. First, raw materials were blended so that a predetermined glass composition (in terms of the following oxides expressed in mol %: 59% of SnO, 20% of $P_2O_5$, 5% of ZnO, 15% of $B_2O_3$, and 1% of $Al_2O_3$) was attained. After that, the blended material was fed into an alumina crucible and was melted for 1 to 2 hours at 900° C. under a nitrogen atmosphere. Next, the resultant molten glass was formed into a film shape with a water-cooling roller. Subsequently, the glass film was pulverized with a ball mill, followed by classification, yielding SnO-containing glass powders A to E. It should be noted that the particle size of each of the SnO-containing glass powders A to E was adjusted by adjusting the condition of the pulverization and the condition of the classification.

$Bi_2O_3$-containing glass powders F to J were prepared as follows. First, raw materials were blended so that a predetermined glass composition (in terms of the following oxides expressed in mol %: 37% of $Bi_2O_3$, 26% of $B_2O_3$, 17.5% of ZnO, 14% of CuO, 5% of BaO, and 0.5% of $Fe_2O_3$) was attained. After that, the blended material was fed into a platinum crucible and was melted for 1 to 2 hours at 1,000° C. under an air atmosphere. Next, the resultant molten glass was formed into a film shape with a water-cooling roller. Subsequently, the glass film was pulverized with a ball mill, followed by classification, yielding $Bi_2O_3$-containing glass powders F to J. It should be noted that the particle size of each of the $Bi_2O_3$-containing glass powders F to J was adjusted by adjusting the condition of the pulverization and the condition of the classification.

The particle size distribution of each of the glass powders A to J refers to a value measured with a laser diffraction particle-size distribution analyzer.

The softening point refers to a value measured with a macro-type DTA apparatus. For SnO-containing glass powder, measurement was performed under a nitrogen atmosphere, and for $Bi_2O_3$-containing glass powder, measurement was performed under an air atmosphere. It should be noted that the measurement started from room temperature at a temperature increase rate of 10° C./min.

Table 9 shows examples (Sample Nos. 25 to 29) and comparative examples (Sample Nos. 30 and 31) of the first related invention. Table 10 shows examples (Sample Nos. 32 to 36) and comparative examples (Sample Nos. 37 and 38) of the first related invention.

TABLE 9

|  |  | Example | | | | | Comparative Example | |
| --- | --- | --- | --- | --- | --- | --- | --- | --- |
|  |  | No. 25 | No. 26 | No. 27 | No. 28 | No. 29 | No. 30 | No. 31 |
| First sealing material paste Glass powder |  | A | B | C | A | C | A | B |
| Second sealing material paste Glass powder |  | D | D | D | E | E | A | A |
| Sealing material layer (first layer) Thermal expansion coefficient [30 to 300° C.] (×$10^{-7}$/° C.) |  | 49 | 49 | 49 | 49 | 49 | 49 | 49 |
| Sealing material layer (second layer) Thermal expansion coefficient [30 to 300° C.] (×$10^{-7}$/° C.) |  | 48 | 49 | 48 | 48 | 49 | 49 | 49 |
| Sealing material layer Surface roughness (μm) | Ra | 0.3 | 0.3 | 0.3 | 0.1 | 0.1 | 0.8 | 0.7 |
|  | RMS | 0.6 | 0.5 | 0.6 | 0.4 | 0.4 | 1.3 | 1.2 |

TABLE 9-continued

|  |  | Example | | | | | Comparative Example | |
|---|---|---|---|---|---|---|---|---|
|  |  | No. 25 | No. 26 | No. 27 | No. 28 | No. 29 | No. 30 | No. 31 |
| Laser irradiation condition | Power (W) | 10 | 11 | 11 | 9 | 9 | 15 | 15 |
|  | Temperature of sealing material layer (° C.) | 530 | 540 | 530 | 510 | 510 | 630 | 620 |
| Laser sealing property (HAST test) | Detachment | Absent | Absent | Absent | Absent | Absent | Present | Present |

TABLE 10

|  |  | Example | | | | | Comparative Example | |
|---|---|---|---|---|---|---|---|---|
|  |  | No. 32 | No. 33 | No. 34 | No. 35 | No. 36 | No. 37 | No. 38 |
| First sealing material paste Glass powder |  | F | G | H | F | G | F | G |
| Second sealing material paste Glass powder |  | I | I | I | J | J | G | G |
| Sealing material layer (first layer) Thermal expansion coefficient [30 to 300° C.] (×10⁻⁷/° C.) |  | 69 | 68 | 68 | 69 | 68 | 69 | 68 |
| Sealing material layer (second layer) Thermal expansion coefficient [30 to 300° C.] (×10⁻⁷/° C.) |  | 70 | 70 | 70 | 69 | 69 | 68 | 68 |
| Sealing material layer Surface roughness (μm) | Ra | 0.1 | 0.1 | 0.1 | 0.05 | 0.05 | 0.7 | 0.8 |
|  | RMS | 0.3 | 0.3 | 0.3 | 0.15 | 0.15 | 1.3 | 1.5 |
| Laser irradiation condition | Power (W) | 10 | 11 | 11 | 9 | 9 | 15 | 15 |
|  | Temperature of sealing material layer (° C.) | 430 | 420 | 420 | 400 | 400 | 470 | 480 |
| Laser sealing property (HAST test) | Detachment | Absent | Absent | Absent | Absent | Absent | Present | Present |

First, a refractory and a pigment were added to each of the SnO-containing glass powders (A to E), followed by mixing them, thereby manufacturing each sealing material according to Table 9. The mixing ratios thereof are SnO-containing glass powder:refractory filler (vol %)=60:40 and glass powder+refractory filler:pigment (mass %)=99.75:0.25.

Further, a refractory was added to each of the $Bi_2O_3$-containing glass powders (F to J), followed by mixing them, thereby manufacturing each sealing material according to Table 10. The mixing ratio thereof is $Bi_2O_3$-containing glass powder:refractory filler (vol %)=67:33.

Zirconium phosphate powder was used as the refractory filler added to each of the SnO-containing glass powders. The zirconium phosphate had a density of 3.80 g/cm³, and the particle sizes thereof were an average particle diameter $D_{50}$ of 1.6 μm, a 90% particle diameter $D_{90}$ of 3.3 μm, and a maximum particle diameter $D_{99}$ of 5.1 μm. Ketjen black (graphite) was used as the pigment added to each of the SnO-containing glass powders. The average particle diameter $D_{50}$ of the primary particles of the pigment was 20 nm.

Cordierite powder was used as the refractory filler added to each of the $Bi_2O_3$-containing glass powders. The cordierite had a density of 2.63 g/cm³, and the particle sizes thereof were an average particle diameter $D_{50}$ of 1.2 μm, a 90% particle diameter $D_{90}$ of 2.8 μm, and a maximum particle diameter $D_{99}$ of 3.5 μm.

It should be noted that the particle sizes of each of the refractory fillers and pigment refer to values measured with a laser diffraction particle-size distribution analyzer.

The thermal expansion coefficient of each sealing material was measured.

The thermal expansion coefficient refers to a value measured in a temperature range of 30 to 300° C. by using a push-rod-type TMA apparatus. It should be noted that each sample obtained by densely sintering each sealing material was used as a measurement sample.

A sealing material paste was produced as follows. First, a sealing material and a vehicle were kneaded so that the resultant substance had a viscosity of about 70 Pa·s (25° C., shear rate: 4). After that, the substance was additionally kneaded in a three-roll mill so that a homogeneous paste was formed. A vehicle comprising an organic binder and a solvent was used as the vehicle. Polyethylene carbonate (hereinafter referred to as PEC) having a molecular weight of 129,000 was used as the organic binder, and propylene carbonate (hereinafter referred to as PC) and phenyl diglycol (hereinafter referred to as PhDG) were used as solvent components. It should be noted that the mixing ratio of PC/PhDG was adjusted to 90/10 in terms of mass ratio. Further, the mixing ratio of PEC/(PC+PhDG) was adjusted to 25/75 in terms of mass ratio.

It should be noted that the conditions except the particle sizes of glass powder are the same in each sealing material paste.

Subsequently, each of the first sealing material pastes listed in the tables was applied with a screen printing machine onto the peripheral portion of a glass substrate (OA-10G manufactured by Nippon Electric Glass Co., Ltd.) with a size of 40 mm in length by 50 mm in width by 0.5 mm in thickness, and was then dried at 85° C. for 10 minutes under an air atmosphere, thereby manufacturing each first sealing material film (dry film). Next, each of the second sealing material pastes was applied onto each of the first sealing material films listed in the tables, and was then dried at 85° C. for 10 minutes under an air atmosphere, thereby manufacturing each second sealing material film (dry film). When SnO-containing glass powder was used, the resultant laminated film was fired at 480° C. for 10 minutes under a nitrogen atmosphere, thereby burning the organic binder in the vehicle and forming a sealing material layer on the glass substrate. When $Bi_2O_3$-containing glass powder was used, the resultant laminated film was fired at 480° C. for 10 minutes under an air atmosphere, thereby burning the organic binder in the vehicle and forming a sealing material layer on the glass substrate. Tables 9 and 10 show the surface roughnesses of each sealing material layer. It should be noted that each printing condition was adjusted so that each first sealing material layer had an average thickness of 8.0 μm and each second sealing material layer had an average thickness of 12.0 μm.

The surface roughnesses Ra and RMS of the sealing material layer are values measured by a method in conformity with JIS B0601:2001.

Subsequently, on the sealing material layer, a glass substrate (OA-10G manufactured by Nippon Electric Glass Co., Ltd.) with a size of 50 mm in length by 50 mm in width by 0.5 mm in thickness was placed under a nitrogen atmosphere. After that, laser irradiation at a wavelength of 808 nm was performed under the conditions shown in Table 8 along the sealing material layer from the side of the glass substrate on which the sealing material layer was formed, thereby softening and flowing the sealing material layer and sealing the glass substrates with each other to attain air tightness. It should be noted that the irradiation rate of the laser light was set to 20 m/s, and the temperature of the sealing material layer at the time of the laser irradiation was measured with a radiation thermometer.

The laser sealing property was evaluated by observing the presence or absence of detachment at sealed sites after a pressure cooker test (highly accelerated temperature and humidity stress test: HAST test). It should be noted that the conditions of the HAST test are 121° C., a humidity of 100%, 2 atm, and 24 hours.

As evident from Tables 9 and 10, Sample Nos. 25 to 29 and 32 to 36 maintained air tightness after the HAST test because detachment did not occur at each sealed site. Further, in each of Sample Nos. 25 to 29 and 32 to 36, the surface roughness Ra of the sealing material layer was 0.05 to 0.3 μm, the surface roughness RMS thereof was 0.15 to 0.6 μm, and hence the surface smoothness of the sealing material layer was good. As a result, the power of a laser necessary for laser sealing lowered, and hence the temperature of the sealing material layer at the time of laser irradiation was 550° C. or less. It should be noted that, when the temperature of the sealing material layer at the time of laser irradiation is too high, metal electrodes undergo thermal degradation and the electric resistance is liable to increase.

On the other hand, in each of Sample Nos. 30, 31, 37, and 38, detachment was found in each sealed site after the HAST test. This fact is attributed to the fact that, because the surface smoothness of the sealing material layer was insufficient, even though the power of a laser was increased, sufficient sealing strength was not able to be provided to the sealed site.

EXAMPLE 4

Examples of the second related invention are described. It should be noted that the following examples are merely for illustrative purposes. The second related invention is not limited to the following examples at all.

Tables 11 and 12 show the glass composition and characteristics of each glass powder (Samples A to F).

TABLE 11

|  |  | A | B | C |
|---|---|---|---|---|
| Glass composition (mol %) | SnO | 59 | 63 | 63 |
|  | $P_2O_5$ | 20 | 23 | 24 |
|  | ZnO | 5 | 7 | 7 |
|  | $B_2O_3$ | 15 | 6 | 4 |
|  | $Al_2O_3$ | 1 | 1 | 2 |
| Density (g/cm³) |  | 3.88 | 3.96 | 4.00 |
| Particle size distribution (μm) | $D_{50}$ | 1.7 | 1.8 | 1.7 |
|  | $D_{90}$ | 3.7 | 3.6 | 3.5 |
|  | $D_{99}$ | 5.5 | 5.6 | 5.3 |
| Softening point (° C.) |  | 385 | 372 | 365 |
| Thermal expansion coefficient ($\times 10^{-7}$/° C.) [30 to 250° C.] |  | 109 | 111 | 115 |

TABLE 12

|  |  | D | E | F |
|---|---|---|---|---|
| Glass composition (mol %) | $Bi_2O_3$ | 37 | 38.5 | 41 |
|  | $B_2O_3$ | 26 | 23 | 21 |
|  | ZnO | 17.5 | 19 | 22.5 |
|  | BaO | 5 | 4.5 | — |
|  | CuO | 14 | 14.5 | 15 |
|  | $Fe_2O_3$ | 0.5 | 0.5 | 0.5 |
| Density (g/cm³) |  | 6.99 | 7.10 | 7.24 |
| Particle size distribution (μm) | $D_{50}$ | 1.3 | 1.4 | 1.2 |
|  | $D_{90}$ | 3.3 | 3.5 | 3.1 |
|  | $D_{99}$ | 4.5 | 4.6 | 4.2 |
| Softening point (° C.) |  | 430 | 415 | 402 |
| Thermal expansion coefficient ($\times 10^{-7}$/° C.) [30 to 300° C.] |  | 105 | 110 | 107 |

Each SnO-containing glass powder was prepared as follows. First, raw materials were blended so that each glass composition in the table was attained. After that, each blended material was fed into an alumina crucible and was melted for 1 to 2 hours at 900° C. under a nitrogen atmosphere. Next, the resultant molten glass was formed into a film shape with a water-cooling roller. Subsequently, each glass film was pulverized with a ball mill, followed by classification, yielding each SnO-containing glass powder.

Each $Bi_2O_3$-containing glass powder was prepared as follows. First, raw materials were blended so that each glass composition in the table was attained. After that, each blended material was fed into an alumina crucible and was melted for 1 to 2 hours at 1,000° C. under a nitrogen atmosphere. Next, the resultant molten glass was formed into a film shape with a water-cooling roller. Subsequently, each glass film was pulverized with a ball mill, followed by classification, yielding each $Bi_2O_3$-containing glass powder.

The density refers to a value obtained by measuring, by the Archimedes method, the density of glass formed into a bulk shape.

The particle size distribution refers to a value measured with a laser diffraction particle-size distribution analyzer.

The softening point refers to a value measured with a macro-type DTA apparatus. When SnO-containing glass powder was used, measurement was performed under a nitrogen atmosphere, and when $Bi_2O_3$-containing glass powder was used, measurement was performed under an air atmosphere. It should be noted that the measurement started from room temperature at a temperature increase rate of 10° C./min.

The thermal expansion coefficient refers to a value measured with a push-rod-type TMA apparatus. It should be noted that glass formed into a bulk shape and processed into a predetermined shape was used as a measurement sample. Further, when SnO-containing glass powder was used, the range of measurement temperature was set to 30 to 250° C., and when $Bi_2O_3$-containing glass powder was used, the range of measurement temperature was set to 30 to 300° C.

Tables 13 and 14 show examples (Sample Nos. 39, 40, 42, and 43) and comparative examples (Sample Nos. 41 and 44) of the second related invention.

TABLE 13

| | | Example | | Comparative Example |
|---|---|---|---|---|
| | | No. 39 | No. 40 | No. 41 |
| First sealing material paste Glass powder | | A | A | A |
| Second sealing material paste Glass powder | | B | C | A |
| Sealing material layer (first layer) | Thermal expansion coefficient ($\times 10^{-7}$/° C.) [30 to 300° C.] | 49 | 49 | 49 |
| Sealing material layer (second layer) | Thermal expansion coefficient ($\times 10^{-7}$/° C.) [30 to 300° C.] | 51 | 53 | 49 |
| Sealing material layer Surface roughness (μm) | Ra | 0.4 | 0.3 | 0.7 |
| | RMS | 0.8 | 0.7 | 1.2 |
| Laser irradiation condition | Power (W) | 10 | 11 | 15 |
| | Temperature of sealing material layer (° C.) | 530 | 550 | 620 |
| Laser sealing property (HAST test) | Presence or absence of detachment | Absent | Absent | Present |

TABLE 14

| | | Example | | Comparative Example |
|---|---|---|---|---|
| | | No. 42 | No. 43 | No. 44 |
| First sealing material paste Glass powder | | D | D | D |
| Second sealing material paste Glass powder | | E | F | D |
| Sealing material layer (first layer) | Thermal expansion coefficient ($\times 10^{-7}$/° C.) [30 to 300° C.] | 74 | 74 | 74 |
| Sealing material layer (second layer) | Thermal expansion coefficient ($\times 10^{-7}$/° C.) [30 to 300° C.] | 77 | 76 | 74 |
| Sealing material layer Surface roughness (μm) | Ra | 0.15 | 0.1 | 0.7 |
| | RMS | 0.3 | 0.2 | 1.3 |
| Laser irradiation condition | Power (W) | 9 | 10 | 18 |
| | Temperature of sealing material layer (° C.) | 410 | 420 | 470 |
| Laser sealing property (HAST test) | Presence or absence of detachment | Absent | Absent | Present |

First, a refractory and a pigment were added to each SnO-containing glass powder, followed by mixing them, thereby manufacturing each sealing material according to Table 13. The mixing ratios thereof are SnO-containing glass powder:refractory filler (vol %)=60:40 and SnO-containing glass powder+refractory filler:pigment (mass %)=99.75:0.25.

Zirconium phosphate powder was used as the refractory filler according to Table 13. The zirconium phosphate had a density of 3.80 g/cm$^3$, and the particle sizes thereof were an average particle diameter $D_{50}$ of 1.6 μm, a 90% particle diameter $D_{90}$ of 3.3 μm, and a maximum particle diameter $D_{99}$ of 5.1 μm. Ketjen black (graphite) was used as the pigment. The average particle diameter $D_{50}$ of the primary particles of the pigment was 20 nm. It should be noted that the particle sizes of the refractory filler and pigment refer to values measured with a laser diffraction particle-size distribution analyzer.

A refractory filler was added to each $Bi_2O_3$-containing glass powder, followed by mixing them, thereby manufacturing each sealing material according to Table 14. The mixing ratio thereof is glass powder:refractory filler (vol %)=70:30.

Cordierite powder was used as the refractory filler according to Table 14. The cordierite had a density of 2.63 g/cm$^3$, and the particle sizes thereof were an average particle diameter $D_{50}$ of 1.0 μm, a 90% particle diameter $D_{90}$ of 2.1 μm, and a maximum particle diameter $D_{99}$ of 2.9 μm. It should be noted that the particle sizes of the refractory filler refer to values measured with a laser diffraction particle-size distribution analyzer.

The thermal expansion coefficient of each sealing material was measured.

The thermal expansion coefficient refers to a value measured in a temperature range of 30 to 300° C. by using a push-rod-type TMA apparatus. It should be noted that each sample obtained by densely sintering each sealing material was used as a measurement sample.

Each sealing material paste was produced as follows. First, a sealing material and a vehicle were kneaded so that the resultant substance had a viscosity of about 70 Pa·s (25° C., shear rate: 4). After that, the substance was additionally kneaded in a three-roll mill so that a homogeneous paste was formed. A vehicle comprising an organic binder and a solvent was used as the vehicle. Polyethylene carbonate (hereinafter referred to as PEC) having a molecular weight of 129,000 was used as the organic binder, and propylene carbonate (hereinafter referred to as PC) and phenyl diglycol (hereinafter referred to as PhDG) were used as solvent components. It should be noted that the mixing ratio of PC/PhDG was adjusted to 90/10 in terms of mass ratio. Further, the mixing ratio of PEC/(PC+PhDG) was adjusted to 25/75 in terms of mass ratio.

It should be noted that the conditions except the glass powder are the same in each sealing material paste.

Subsequently, each of the first sealing material pastes listed in the tables was applied with a screen printing machine onto the peripheral portion of a glass substrate (OA-10G manufactured by Nippon Electric Glass Co., Ltd.) with a size of 40 mm in length by 50 mm in width by 0.5 mm in thickness, and was then dried at 85° C. for 10 minutes under an air atmosphere, thereby manufacturing each first sealing material film (dry film). Next, each of the second sealing material pastes was applied onto each of the first sealing material films listed in the tables, and was then dried at 85° C. for 10 minutes under an air atmosphere, thereby manufacturing each second sealing material film (dry film). When SnO-containing glass powder was used, the resultant laminated film was fired at 480° C. for 10 minutes under a nitrogen atmosphere, thereby burning the organic binder in the vehicle and forming a sealing material layer on the glass substrate. When $Bi_2O_3$-containing glass powder was used, the resultant laminated film was fired at 480° C. for 10 minutes under an air atmosphere, thereby burning the organic binder in the vehicle and forming a sealing material layer on the glass substrate. Tables 13 and 14 show the surface roughnesses of each sealing material layer. It should be noted that each printing condition was adjusted so that each first sealing material layer had an average thickness of 8.0 μm and each second sealing material layer had an average thickness of 12.0 μm.

The surface roughnesses Ra and RMS of the sealing material layer are values measured by a method in conformity with JIS B0601:2001.

Subsequently, on the sealing material layer, a glass substrate (OA-10G manufactured by Nippon Electric Glass Co., Ltd.) with a size of 50 mm in length by 50 mm in width by 0.5 mm in thickness was placed under a nitrogen atmosphere. After that, laser irradiation at a wavelength of 808 nm was performed under the conditions shown in Table 13 or 14 along the sealing material layer from the side of the glass substrate on which the sealing material layer was formed, thereby softening and flowing the sealing material layer and sealing the glass substrates with each other to attain air tightness. It should be noted that the irradiation rate of the laser light was set to 20 m/s, and the temperature of the sealing material layer at the time of the laser irradiation was measured with a radiation thermometer.

The laser sealing property was evaluated by observing the presence or absence of detachment at sealed sites after a pressure cooker test (highly accelerated temperature and humidity stress test: HAST test). It should be noted that the conditions of the HAST test are 121° C., a humidity of 100%, 2 atm, and 24 hours.

As evident from Tables 13 and 14, Sample Nos. 39, 40, 42, and 43 maintained air tightness after the HAST test because detachment did not occur at each sealed site. Further, in Sample Nos. 39, 40, 42, and 43, the surface roughnesses Ra of the sealing material layers were 0.4 μm, 0.3 μm, 0.15 μm, and 0.1 μm, respectively, the surface roughnesses RMS thereof were 0.8 μm, 0.7 μm, 0.3 μm, and 0.2 μm, respectively, and hence the surface smoothness of each of the sealing material layers was good. As a result, the power of a laser necessary for laser sealing lowered, and hence the temperature of the sealing material layer at the time of laser irradiation was 550° C. or less. It should be noted that, when the temperature of the sealing material layer at the time of laser irradiation is too high, metal electrodes undergo thermal degradation and the electric resistance is liable to increase.

On the other hand, in each of Sample Nos. 41 and 44, detachment was found in each sealed site after the HAST test. This fact is attributed to the fact that, because the surface smoothness of the sealing material layer was insufficient, even though the power of a laser was increased, sufficient sealing strength was not able to be provided to the sealed site.

EXAMPLE 5

Examples of the third related invention are described. It should be noted that the following examples are merely for illustrative purposes. The third related invention is not limited to the following examples at all.

Table 15 shows examples (Sample Nos. 45 to 49) of the third related invention and comparative examples (Sample Nos. 50 and 51). Table 16 shows examples (Sample Nos. 52 to 56) of the present invention and comparative examples (Sample Nos. 57 and 58).

TABLE 15

|  |  | Example | | | | | Comparative Example | |
|---|---|---|---|---|---|---|---|---|
|  |  | No. 45 | No. 46 | No. 47 | No. 48 | No. 49 | No. 50 | No. 51 |
| First sealing material (first sealing material paste) Glass powder:refractory filler (volume ratio) | | 60:40 | 55:45 | 65:35 | 80:20 | 45:55 | 85:15 | 65:35 |
| Second sealing material (second sealing material paste) Glass powder:refractory filler (volume ratio) | | 78:22 | 69:31 | 80:20 | 90:10 | 80:20 | 65:35 | 65:35 |
| Sealing material layer (first layer) | Thermal expansion coefficient ($\times 10^{-7}$/° C.) [30 to 300° C.] | 49 | 44 | 54 | 80 | 37 | 84 | 54 |
| Sealing material layer (second layer) | Thermal expansion coefficient ($\times 10^{-7}$/° C.) [30 to 300° C.] | 75 | 59 | 77 | 92 | 77 | 54 | 54 |

TABLE 15-continued

|  |  | Example | | | | | Comparative Example | |
|---|---|---|---|---|---|---|---|---|
|  |  | No. 45 | No. 46 | No. 47 | No. 48 | No. 49 | No. 50 | No. 51 |
| Sealing material layer Surface roughness (μm) | Ra | 0.10 | 0.22 | 0.07 | 0.03 | 0.06 | 0.12 | 1.1 |
|  | RMS | 0.30 | 0.49 | 0.22 | 0.11 | 0.21 | 0.33 | 1.9 |
| Laser irradiation condition | Power (W) | 11 | 15 | 10 | 8 | 9 | 12 | 20 |
|  | Temperature of sealing material layer (° C.) | 460 | 520 | 480 | 400 | 450 | 500 | 630 |
| Laser sealing property (HAST test) | Presence or absence of detachment | Absent | Absent | Absent | Absent | Absent | Present | Present |

TABLE 16

|  |  | Example | | | | | Comparative Example | |
|---|---|---|---|---|---|---|---|---|
|  |  | No. 52 | No. 53 | No. 54 | No. 55 | No. 56 | No. 57 | No. 58 |
| First sealing material (first sealing material paste) Glass powder:refractory filler (volume ratio) |  | 60:40 | 55:45 | 65:35 | 80:20 | 45:55 | 85:15 | 55:45 |
| Second sealing material (second sealing material paste) Glass powder:refractory filler (volume ratio) |  | 78:22 | 69:31 | 80:20 | 90:10 | 80:20 | 69:31 | 55:45 |
| Sealing material layer (first layer) | Thermal expansion coefficient ($\times 10^{-7}$/° C.) [30 to 300° C.] | 63 | 58 | 68 | 84 | 45 | 89 | 58 |
| Sealing material layer (second layer) | Thermal expansion coefficient ($\times 10^{-7}$/° C.) [30 to 300° C.] | 82 | 72 | 84 | 95 | 84 | 72 | 58 |
| Sealing material layer Surface roughness (μm) | Ra | 0.06 | 0.10 | 0.04 | 0.01 | 0.04 | 0.16 | 1.0 |
|  | RMS | 0.16 | 0.24 | 0.09 | 0.03 | 0.10 | 0.32 | 1.7 |
| Laser irradiation condition | Power (W) | 11 | 15 | 10 | 8 | 9 | 12 | 20 |
|  | Temperature of sealing material layer (° C.) | 420 | 440 | 410 | 400 | 410 | 430 | 520 |
| Laser sealing property (HAST test) | Presence or absence of detachment | Absent | Absent | Absent | Absent | Absent | Present | Present |

SnO-containing glass powder was prepared as follows. First, raw materials were blended so that a predetermined glass composition (59% of SnO, 20% of $P_2O_5$, 5% of ZnO, 15% of $B_2O_3$, and 1% of $Al_2O_3$, expressed in mol %) was attained. After that, the blended material was fed into an alumina crucible and was melted for 1 to 2 hours at 900° C. under a nitrogen atmosphere. Next, the resultant molten glass was formed into a film shape with a water-cooling roller. Subsequently, the glass film was pulverized with a ball mill, followed by classification, yielding glass powder. The SnO-containing glass powder had a density of 3.88 g/cm$^3$, and the particle sizes of the SnO-containing glass powder were an average particle diameter $D_{50}$ of 1.5 μm, a 90% particle diameter $D_{90}$ of 3.5 μm, and a maximum particle diameter $D_{99}$ of 5.7 μm.

$Bi_2O_3$-containing glass powder was prepared as follows. First, raw materials were blended so that a predetermined glass composition (37% of $Bi_2O_3$, 26% of $B_2O_3$, 17.5% of ZnO, 14% of CuO, 5% of BaO, and 0.5% of $Fe_2O_3$, expressed in mol %) was attained. After that, the blended material was fed into a platinum crucible and was melted for 1 to 2 hours at 1,000° C. under an air atmosphere. Next, the resultant molten glass was formed into a film shape with a water-cooling roller. Subsequently, the glass film was pulverized with a ball mill, followed by classification, yielding $Bi_2O_3$-containing glass powder. The glass powder had a density of 6.99 g/cm$^3$, and the particle sizes of the $Bi_2O_3$-containing glass powder were an average particle diameter $D_{50}$ of 1.3 μm, a 90% particle diameter $D_{90}$ of 3.1 μm, and a maximum particle diameter $D_{99}$ of 4.7 μm.

Zirconium phosphate was used as the refractory filler according to Table 15. The zirconium phosphate had a density of 3.80 g/cm$^3$, and the particle sizes thereof were an average particle diameter $D_{50}$ of 1.6 μm, a 90% particle diameter $D_{90}$ of 3.3 μm, and a maximum particle diameter $D_{99}$ of 5.1 μm.

Cordierite was used as the refractory filler according to Table 16. The cordierite had a density of 2.63 g/cm$^3$, and the particle sizes thereof were an average particle diameter $D_{50}$ of 1.0 μm, a 90% particle diameter $D_{90}$ of 2.2 μm, and a maximum particle diameter $D_{99}$ of 2.9 μm.

Ketjen black (graphite) was used as a pigment. The average particle diameter $D_{50}$ of the primary particles of the pigment was 20 nm.

The particle sizes of the SnO-containing glass powder, the $Bi_2O_3$-containing glass powder, the refractory filler, and the pigment are values each measured with a laser diffraction particle-size distribution analyzer.

SnO-containing glass powder+refractory filler (the total content of the SnO-containing glass powder and the refractory filler) and the pigment were mixed at 99.75 mass % and 0.25 mass %, respectively, thereby manufacturing each sealing material according to Table 15. It should be noted that each mixing ratio of the SnO-containing glass powder and the refractory filler is as shown in Table 15.

The $Bi_2O_3$-containing glass powder and the refractory filler were mixed, thereby manufacturing each sealing material according to Table 16. It should be noted that each mixing ratio of the $Bi_2O_3$-containing glass powder and the refractory filler is as shown in Table 16.

The thermal expansion coefficient of the resultant sealing material was measured. The thermal expansion coefficient refers to a value measured in a temperature range of 30 to 300° C. by using a push-rod-type TMA apparatus. It should be noted that each sample obtained by densely sintering each sealing material was used as a measurement sample.

A sealing material paste was produced as follows. First, a sealing material and a vehicle were kneaded so that the resultant substance had a viscosity of about 70 Pa·s (25° C., shear rate: 4). After that, the substance was additionally kneaded in a three-roll mill so that a homogeneous paste was formed. A vehicle comprising an organic binder and a solvent was used as the vehicle. Polyethylene carbonate (hereinafter referred to as PEC) having a molecular weight of 129,000 was used as the organic binder, and propylene carbonate (hereinafter referred to as PC) and phenyl diglycol (hereinafter referred to as PhDG) were used as solvent components. It should be noted that the mixing ratio of PC/PhDG was adjusted to 90/10 in terms of mass ratio. Further, the mixing ratio of PEC/(PC+PhDG) was adjusted to 25/75 in terms of mass ratio.

It should be noted that the conditions except the mixing ratio between the glass powder and the refractory filler are the same in each sealing material paste.

Subsequently, each of the first sealing material pastes listed in the tables was applied with a screen printing machine onto the peripheral portion of a glass substrate (OA-10G manufactured by Nippon Electric Glass Co., Ltd.) with a size of 40 mm in length by 50 mm in width by 0.5 mm in thickness, and was then dried at 85° C. for 10 minutes under an air atmosphere, thereby manufacturing each first sealing material film (dry film). Next, each of the second sealing material pastes was applied onto each of the first sealing material films listed in the tables, and was then dried at 85° C. for 10 minutes under an air atmosphere, thereby manufacturing each second sealing material film (dry film). When SnO-containing glass powder was used, the resultant laminated film was fired at 480° C. for 10 minutes under a nitrogen atmosphere, thereby burning the organic binder in the vehicle and forming a sealing material layer on the glass substrate. When $Bi_2O_3$-containing glass powder was used, the resultant laminated film was fired at 480° C. for 10 minutes under an air atmosphere, thereby burning the organic binder in the vehicle and forming a sealing material layer on the glass substrate. Tables 15 and 16 show the surface roughnesses of each sealing material layer. It should be noted that each printing condition or the like was adjusted so that each first sealing material layer had an average thickness of 8.0 μm and each second sealing material layer had an average thickness of 12.0 μm.

The surface roughnesses Ra and RMS of the sealing material layer are values measured by a method in conformity with JIS B0601:2001.

Subsequently, on the sealing material layer, a glass substrate (OA-10G manufactured by Nippon Electric Glass Co., Ltd.) with a size of 50 mm in length by 50 mm in width by 0.5 mm in thickness was placed under a nitrogen atmosphere. After that, laser irradiation at a wavelength of 808 nm was performed under the conditions shown in the tables along the sealing material layer from the side of the glass substrate on which the sealing material layer was formed, thereby softening and flowing the sealing material layer and sealing the glass substrates with each other to attain air tightness. It should be noted that the irradiation rate of the laser light was set to 20 m/s, and the temperature of the sealing material layer at the time of the laser irradiation was measured with a radiation thermometer.

The laser sealing property was evaluated by observing the presence or absence of detachment at sealed sites after a pressure cooker test (highly accelerated temperature and humidity stress test: HAST test). It should be noted that the conditions of the HAST test are 121° C., a humidity of 100%, 2 atm, and 24 hours.

As evident from Tables 15 and 16, Sample Nos. 45 to 49 and 52 to 56 maintained air tightness after the HAST test because detachment did not occur at each sealed site. Further, in each of Sample Nos. 45 to 49 and 52 to 56, the surface roughness Ra of the sealing material layer was 0.01 to 0.22 μm, the surface roughness RMS thereof was 0.03 to 0.49 μm, and hence the surface smoothness of the sealing material layer was good. As a result, the power of a laser necessary for laser sealing lowered, and hence the temperature of the sealing material layer at the time of laser irradiation was 550° C. or less. It should be noted that, when the temperature of the sealing material layer at the time of laser irradiation is too high, metal electrodes undergo thermal degradation and the electric resistance is liable to increase.

On the other hand, in each of Sample Nos. 50, 51, 57, and 58, detachment was found in each sealed site after the HAST test. This fact is attributed to the fact that, because the surface smoothness of the sealing material layer was insufficient, even though the power of a laser was increased, sufficient sealing strength was not able to be provided to the sealed site.

INDUSTRIAL APPLICABILITY

The glass substrate with a sealing material layer of the present invention is suitable not only for laser sealing of an OLED device but also for laser sealing of a solar cell such as a dye-sensitized solar cell, laser sealing of a lithium ion secondary battery, laser sealing of an MEMS package, or the like.

Further, the method of producing an electronic device of the present invention is suitable as a method of producing not only an OLED device but also a solar cell such as a dye-sensitized solar cell, a lithium ion secondary battery, an MEMS package, or the like.

REFERENCE SIGNS LIST 1 glass substrate with sealing material layer
11 glass substrate
12 first sealing material film 13 second sealing material film
14 sealing material layer
15 glass substrate

The invention claimed is:

1. A method of producing an electronic device by laser sealing, the method comprising the steps of:
    preparing a first glass substrate and a second glass substrate;
    mixing a first sealing material comprising a first refractory filler and a first glass powder with a first vehicle comprising a first organic binder to manufacture a first sealing material paste;
    mixing a second sealing material comprising a second refractory filler and a second glass powder with a second vehicle comprising a second organic binder to manufacture a second sealing material paste;
    applying the first sealing material paste onto the first glass substrate, followed by forming a first sealing material film;
    applying the second sealing material paste onto the first sealing material film, followed by forming a second sealing material film;
    firing the first sealing material film and the second sealing material film to form a sealing material layer onto the first glass substrate;
    laminating the first glass substrate and the second glass substrate via the sealing material layer to yield a laminate; and
    irradiating the laminate with laser light so that a laser sealing temperature is equal to or lower than a firing temperature to hermetically seal the first glass substrate and the second glass substrate,
    wherein the content of the second refractory filler in the second sealing material is smaller than the content of the first refractory filler in the first sealing material, and
    wherein the average particle diameter $D_{50}$ of the second glass powder is smaller than the average particle diameter $D_{50}$ of the first glass powder.

2. The method of producing an electronic device according to claim 1, wherein the laser sealing temperature is 500° C. or less.

3. The method of producing an electronic device according to claim 1, wherein either the first sealing material comprises 97.5 to 100 mass % of inorganic powder comprising the first glass powder and 0 to 2.5 mass % of a pigment or the second sealing material comprises 97.5 to 100 mass % of inorganic powder comprising the second glass powder and 0 to 2.5 mass % of a pigment, or both the first sealing material comprises 97.5 to 100 mass % of inorganic powder comprising the first glass powder and 0 to 2.5 mass % of a pigment and the second sealing material comprises 97.5 to 100 mass % of inorganic powder comprising the second glass powder and 0 to 2.5 mass % of a pigment.

4. The method of producing an electronic device according to claim 3, wherein the first glass powder comprises, as a glass composition expressed in mol % in terms of the following oxides, 35 to 70% of SnO and 10 to 30% of $P_2O_5$, and wherein the second glass powder comprises, as a glass composition expressed in mol % in terms of the following oxides, 35 to 70% of SnO and 10 to 30% of $P_2O_5$.

5. The method of producing an electronic device according to claim 3, wherein the first glass powder comprises, as a glass composition expressed in mol % in terms of the following oxides, 20 to 60% of $Bi_2O_3$, 10 to 35% of $B_2O_3$, 5 to 40% of ZnO, and 5 to 30% of $CuO+Fe_2O_3$, and wherein the second glass powder comprises, as a glass composition expressed in mol % in terms of the following oxides, 20 to 60% of $Bi_2O_3$, 10 to 35% of $B_7O_3$, 5 to 40% of ZnO, and 5 to 30% of $CuO+Fe_2O_3$.

6. The method of producing an electronic device according to claim 1, wherein either the first sealing material comprises 0.1 to 60 vol % of the first refractory filler or the second sealing material comprises 0.1 to 60 vol % of the second refractory filler, or both the first sealing material comprises 0.1 to 60 vol % of the first refractory filler and the second sealing material comprises 0.1 to 60 vol % of the second refractory filler.

7. The method of producing an electronic device according to claim 1, wherein the electronic device comprises an OLED device.

8. The method of producing an electronic device according to claim 1, wherein the firing of the coating layer is carried out under an inert atmosphere.

9. The method of producing an electronic device according to claim 1,
    wherein the softening point of the second glass powder is lower than the softening point of the first glass powder.

* * * * *